(12) United States Patent
Lin et al.

(10) Patent No.: US 12,727,449 B2
(45) Date of Patent: Sep. 1, 2026

(54) STRUCTURE AND FORMATION METHOD OF SEMICONDUCTOR DEVICE WITH BACKSIDE CONDUCTIVE CONTACT

(71) Applicant: TAIWAN SEMICONDUCTOR MANUFACTURING COMPANY, LTD., Hsinchu (TW)

(72) Inventors: Chien-Hsun Lin, Kaohsiung City (TW); Wen-Chiang Hong, Taipei City (TW); Jiun-Jie Chao, Miaoli County (TW); Jyh-Huei Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 378 days.

(21) Appl. No.: 18/504,329

(22) Filed: Nov. 8, 2023

(65) Prior Publication Data

US 2025/0149324 A1 May 8, 2025

(51) Int. Cl.

*H01L 29/423* (2006.01)
*H01L 21/8234* (2006.01)
*H01L 27/088* (2006.01)
*H01L 29/06* (2006.01)
*H01L 29/66* (2006.01)
*H01L 29/775* (2006.01)
*H01L 29/786* (2006.01)
*H10P 95/00* (2026.01)

(52) U.S. Cl.

CPC .................................... *H10P 95/00* (2026.01)

(58) Field of Classification Search

CPC ........................................................ H10P 95/00
See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.
9,412,828 B2 8/2016 Ching et al.
9,472,618 B2 10/2016 Oxland
9,502,265 B1 11/2016 Jiang et al.
9,520,482 B1 12/2016 Chang et al.
9,536,738 B2 1/2017 Huang et al.

(Continued)

*Primary Examiner* — Peniel M Gumedzoe
(74) *Attorney, Agent, or Firm* — HAYNES AND BOONE, LLP

(57) ABSTRACT

A method for forming a semiconductor device structure includes forming a fin structure over a substrate. The fin structure has a base layer, and the fin structure has multiple sacrificial layers and multiple semiconductor layers laid out in an alternating manner over the base layer. The method also includes partially removing the fin structure to form an opening exposing side surfaces of the semiconductor layers, the sacrificial layers, and the base layer. The method further includes partially or completely removing the base layer to form a recess, forming a protective structure in the recess, and forming an epitaxial structure filling the opening. In addition, the method includes partially removing the substrate from a backside surface of the substrate to form a contact opening exposing the protective structure and extending towards the epitaxial structure. The method includes forming a backside conductive contact in the contact opening.

20 Claims, 47 Drawing Sheets

(56) References Cited

U.S. PATENT DOCUMENTS

| | | | | |
|---|---|---|---|---|
| 9,576,814 | B2 | 2/2017 | Wu et al. | |
| 9,608,116 | B2 | 3/2017 | Ching et al. | |
| 2021/0399099 | A1 | 12/2021 | Chu | |
| 2022/0037491 | A1 | 2/2022 | You | |
| 2022/0102274 | A1 | 3/2022 | Chien | |
| 2022/0216340 | A1 | 7/2022 | Lin | |
| 2022/0310804 | A1 | 9/2022 | Su | |
| 2022/0384589 | A1 | 12/2022 | Su | |
| 2022/0416035 | A1* | 12/2022 | Chu | H10D 30/6729 |
| 2023/0026310 | A1 | 1/2023 | Chang | |
| 2024/0021708 | A1* | 1/2024 | Lan | H10D 30/024 |

* cited by examiner

STRUCTURE AND FORMATION METHOD OF SEMICONDUCTOR DEVICE WITH BACKSIDE CONDUCTIVE CONTACT

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
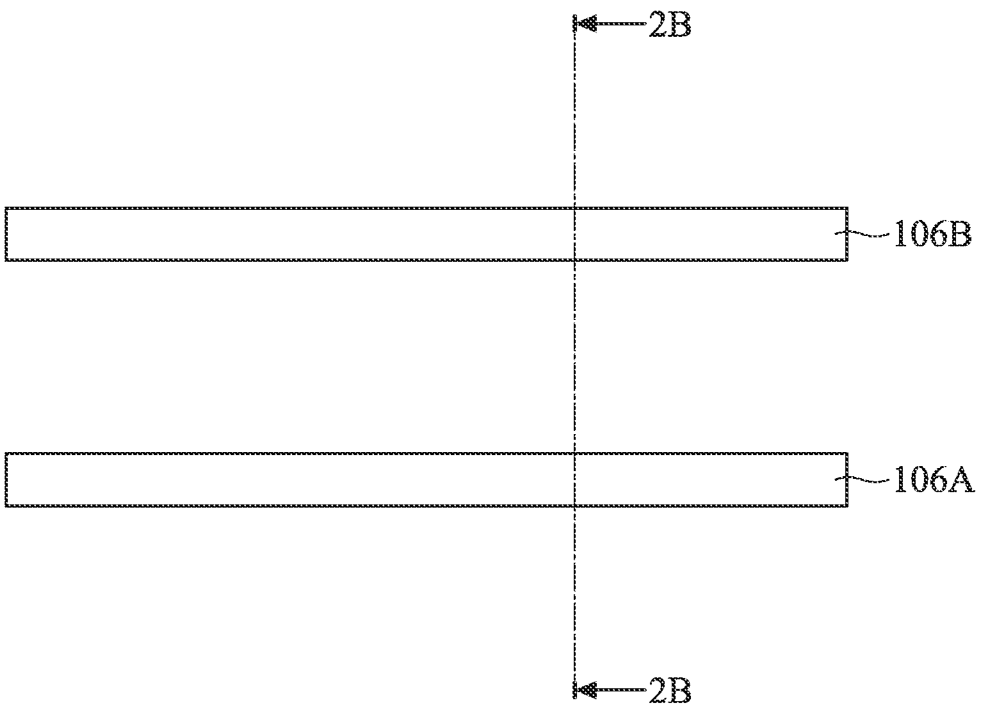
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using another applicable process.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
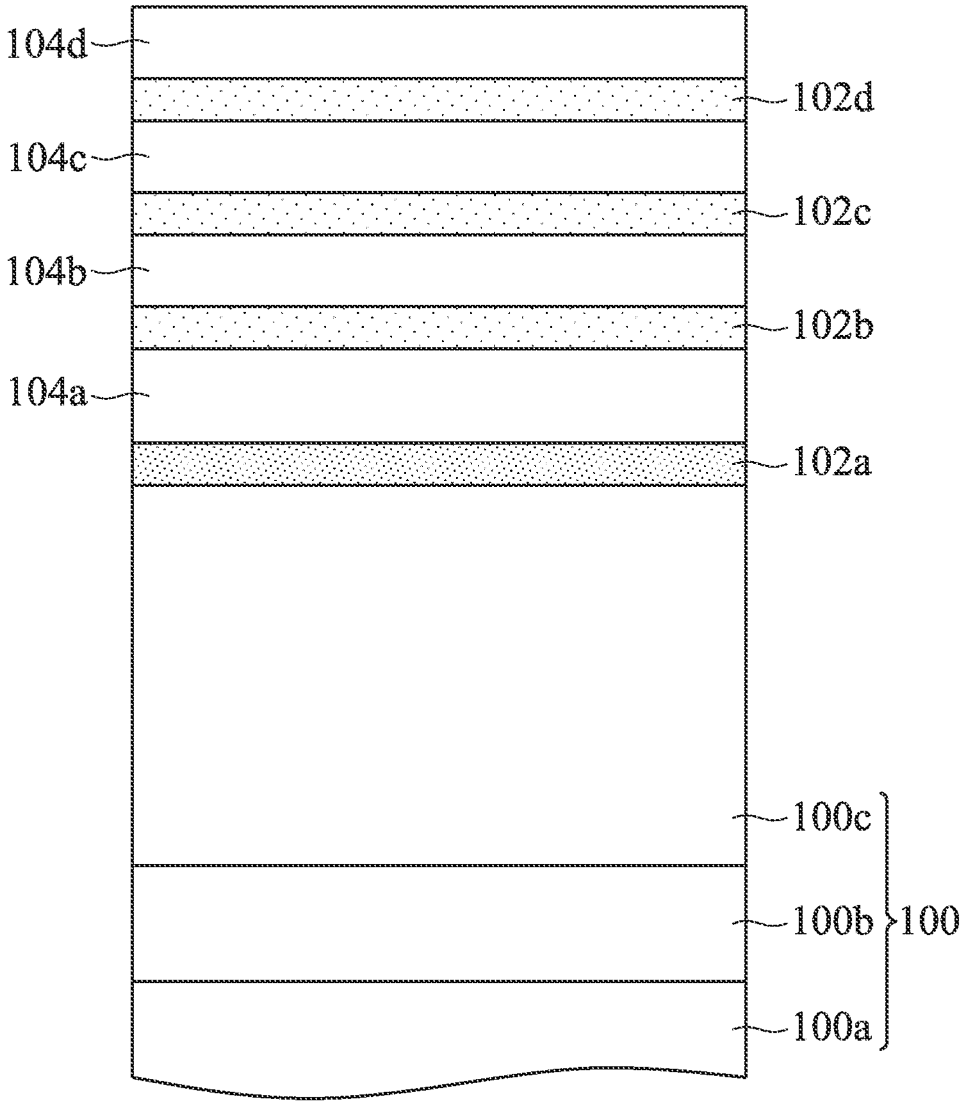
FIGS. 2A-2G are cross-sectional views of various stages of a process for forming a portion of a semiconductor device structure, in accordance with some embodiments.

FIGS. 2A-2G are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, another suitable material, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, the semiconductor substrate 100 has multiple semiconductor layers 100*a*, 100*b*, and 100*c*, as shown in FIG. 2A. In some embodiments, the semiconductor layers 100*a* and 100*c* are made of a first semiconductor material, and the semiconductor layer 100*b* is made of a second semiconductor material that is other than the first semiconductor material. In some embodiments, the semiconductor layers 100*a* and 100*c* are made of silicon, and the semiconductor layer 100*b* is made of silicon germanium.

As shown in FIG. 2A, a semiconductor stack having multiple semiconductor layers is formed over the semiconductor substrate 100, in accordance with some embodiments. In some embodiments, the semiconductor stack includes multiple semiconductor layers 102*a*, 102*b*, 102*c*, and 102*d*. The semiconductor stack also includes multiple semiconductor layers 104*a*, 104*b*, 104*c*, and 104*d*. In some embodiments, the semiconductor layers 102*a*-102*d* and the semiconductor layers 104*a*-104*d* are laid out in an alternating manner, as shown in FIG. 2A. The semiconductor layers 102*a*-102*d* and 104*a*-104*d* together form a superlattice structure.

In some embodiments, the semiconductor layer 102*a* functions as a base layer that will be partially removed to form recesses used for containing protective structures. In some embodiments, the semiconductor layers 102*b*-102*d* function as sacrificial layers that will be removed in a subsequent process to release the semiconductor layers 104*b*-104*d*. The semiconductor layers 104*b*-104*d* that are released may function as channel structures of one or more transistors. In some embodiments, the semiconductor layer 104*a* is thicker than each of the semiconductor layers 104*b*-104*d*.

In some embodiments, the semiconductor layers 104*b*-104*d* that will be used to form channel structures are made of a material that is different than that of the semiconductor layers 102*a*-102*d*. In some embodiments, the semiconductor layers 104*a*-104*d* are made of or include silicon, germanium, another suitable material, or a combination thereof. In some embodiments, the semiconductor layers 102*a*-102*d* are made of or include silicon germanium. In some other embodiments, the semiconductor layers 104*a*-104*d* are made of silicon germanium, and the semiconductor layers 102*a*-102*d* are made of silicon germanium with different atomic concentration of germanium than that of the semiconductor layers 104*a*-104*d*. As a result, different etching selectivity and/or different oxidation rates during subsequent processing may be achieved between the semiconductor layers 102*a*-102*d* and the semiconductor layers 104*a*-104*d*.

The present disclosure contemplates that the semiconductor layers 102*a*-102*d* and the semiconductor layers 104*a*-104*d* include any combination of semiconductor materials that can provide desired etching selectivity, desired oxidation rate differences, and/or desired performance characteristics.

In some embodiments, the composition of the semiconductor layer 102*a* is different than that of the semiconductor layers 102*b*-102*d*. In some embodiments, the semiconductor layer 102*a* and the semiconductor layers 102*b*-102*d* are made of silicon germanium with different compositions. In some embodiments, the semiconductor layer 102*a* has a higher atomic concentration of germanium than that of the semiconductor layers 102*b*-102*d*.

In some embodiments, the semiconductor layers 102*a*-102*d* and 104*a*-104*d* are formed using multiple epitaxial growth operations. Each of the semiconductor layers 102*a*-102*d* and 104*a*-104*d* may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof.

In some embodiments, the semiconductor layers 102*a*-102*d* and 104*a*-104*d* are grown in-situ in the same process chamber. In some embodiments, the growth of the semiconductor layers 102*a*-102*d* and 104*a*-104*d* are alternately and sequentially performed in the same process chamber to complete the formation of the semiconductor stack. In some embodiments, the vacuum of the process chamber is not broken before the epitaxial growth of the semiconductor layers 102*a*-102*d* and 104*a*-104*d* is accomplished.

Afterwards, hard mask elements are formed over the semiconductor stack to assist in a subsequent patterning of the semiconductor stack. One or more photolithography processes and one or more etching processes are used to pattern the semiconductor stack into multiple fin structures including fin structures 106A and 106B, as shown in FIG. 2B in accordance with some embodiments.

The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
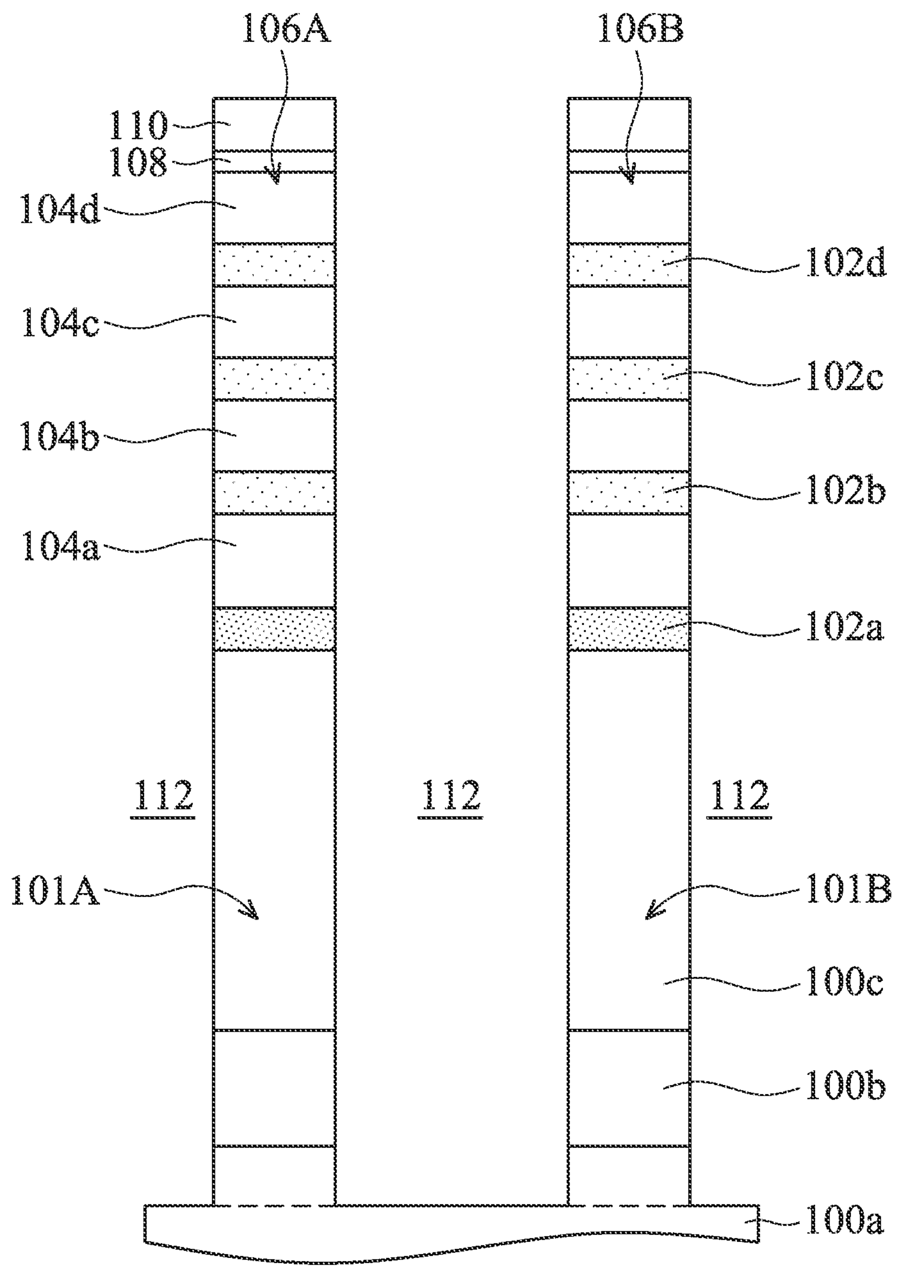

The semiconductor stack is partially removed to form multiple trenches 112, as shown in FIG. 2B. Each of the fin structures 106A and 106B may include portions of the semiconductor layers 102*a*-102*d* and 104*a*-104*d* and semiconductor fins 101A and 101B. The semiconductor substrate 100 may also be partially removed during the etching process that forms the fin structures 106A and 106B. Protruding portions of the semiconductor substrate 100 that remain form the semiconductor fins 101A and 101B. Each of the semiconductor fins 101A and 101B may include portions of the semiconductor layers 100*a*-100*c*, as shown in FIG. 2B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104*d*. The first mask layer 108 may be made of silicon oxide, germanium oxide, silicon germanium oxide, another suitable material, or a combination thereof. The second mask layer 110 may be made of silicon nitride, silicon oxynitride, silicon carbide, another suitable material, or a combination thereof.

Figure 1B:
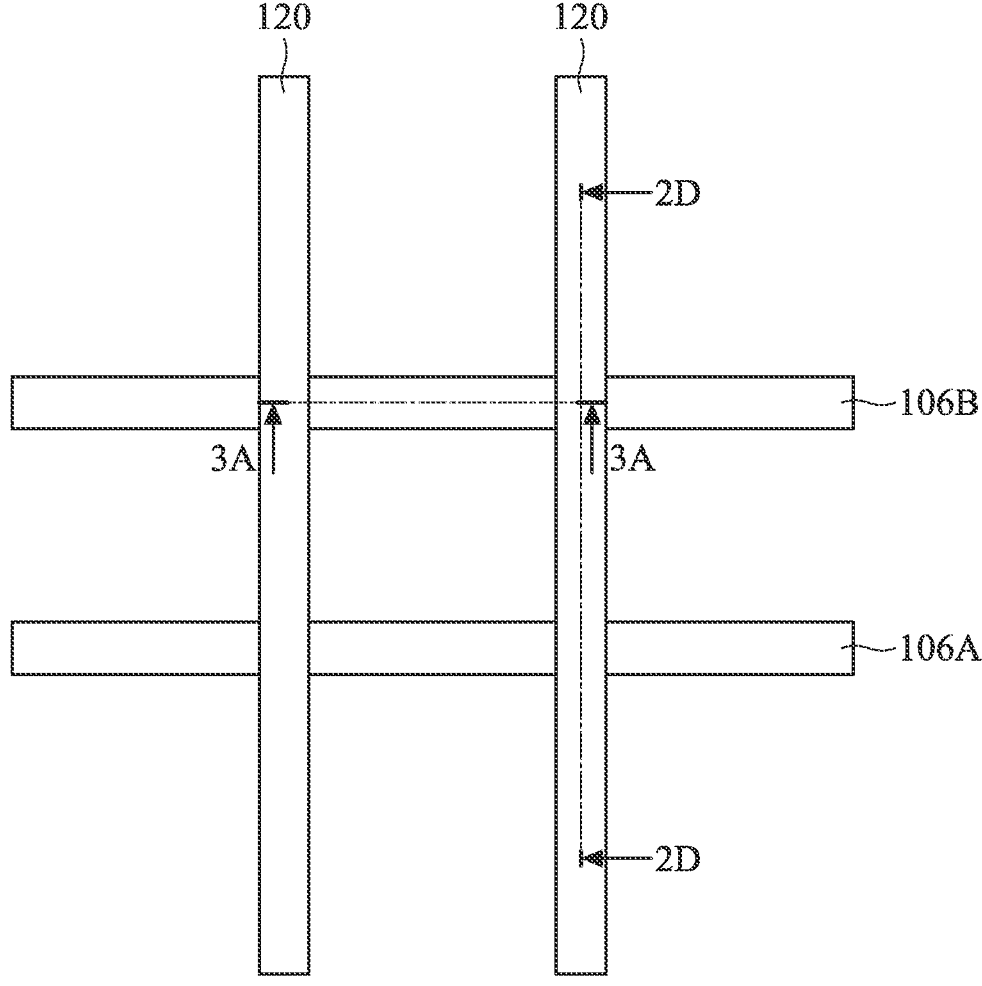

FIGS. 1A-1B are top views of various stages of a process for forming a portion of a semiconductor device structure, in accordance with some embodiments. In some embodiments, the fin structures 106A and 106B are oriented lengthwise. In some embodiments, the longitudinal extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
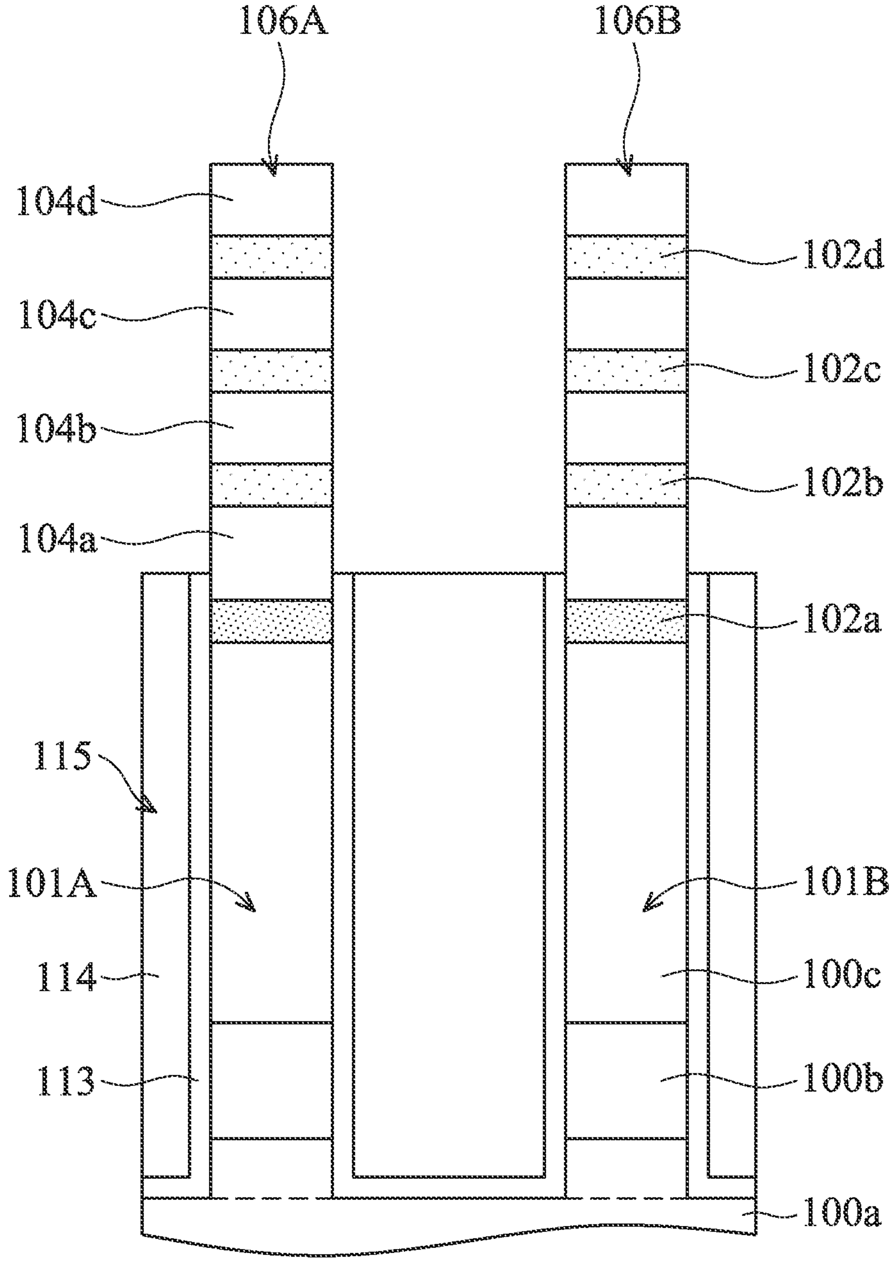

As shown in FIG. 2C, an isolation structure 115 is formed to laterally surround lower portions of the fin structures 106A and 106B, in accordance with some embodiments. In some embodiments, the isolation structure 115 includes a dielectric filling 114 and a liner layer 113 that is adjacent to the semiconductor fins 101A and 101B. In some embodiments, the semiconductor fins 101A and 101B protrude from the top surface of the isolation structure 115.

In some embodiments, one or more dielectric layers are deposited over the fin structures 106A and 106B and the semiconductor layer 100*a* to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The liner layer 113 may be made of or include silicon nitride, silicon oxynitride, silicon carbide, silicon oxycarbide, another suitable material, or a combination thereof. The liner layer 113 and the dielectric layers may be sequentially deposited using a flowable chemical vapor deposition (FCVD) process, an atomic layer deposition (ALD) process, a chemical vapor deposition (CVD) process, another applicable process, or a combination thereof.

Afterwards, a planarization process is used to partially remove the dielectric layers and the liner layer 113. The hard mask elements (including the first mask layer 108 and the second mask layer 110) may also function as stop layers of the planarization process. The planarization process may include a chemical mechanical polishing (CMP) process, a grinding process, a dry polishing process, an etching process, another applicable process, or a combination thereof.

Afterwards, one or more etching back processes are used to partially remove the dielectric layers and the liner layer 113. As a result, the remaining portion of the dielectric layers forms the dielectric filling 114 of the isolation structure 115. Upper portions of the fin structures 106A and 106B protrude from the topmost surface of the isolation structure 115, as shown in FIG. 2C.

In some embodiments, the etching back process for forming the isolation structure 115 is carefully controlled to ensure that the topmost surface of the isolation structure 115 is positioned at a suitable height level. In some embodiments, the topmost surface of the isolation structure 115 is positioned at a higher height level than the topmost surface of the semiconductor layer 102*a* that functions as a base layer. The topmost surface of the semiconductor layer 102*a* is closer to the semiconductor layer 100*a* than the topmost surface of the isolation structure 115, as shown in FIG. 2C. The semiconductor layer 102*a* is covered and protected by the isolation structure 115 and the semiconductor layer 104*a*.

Afterwards, the remaining portions of the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
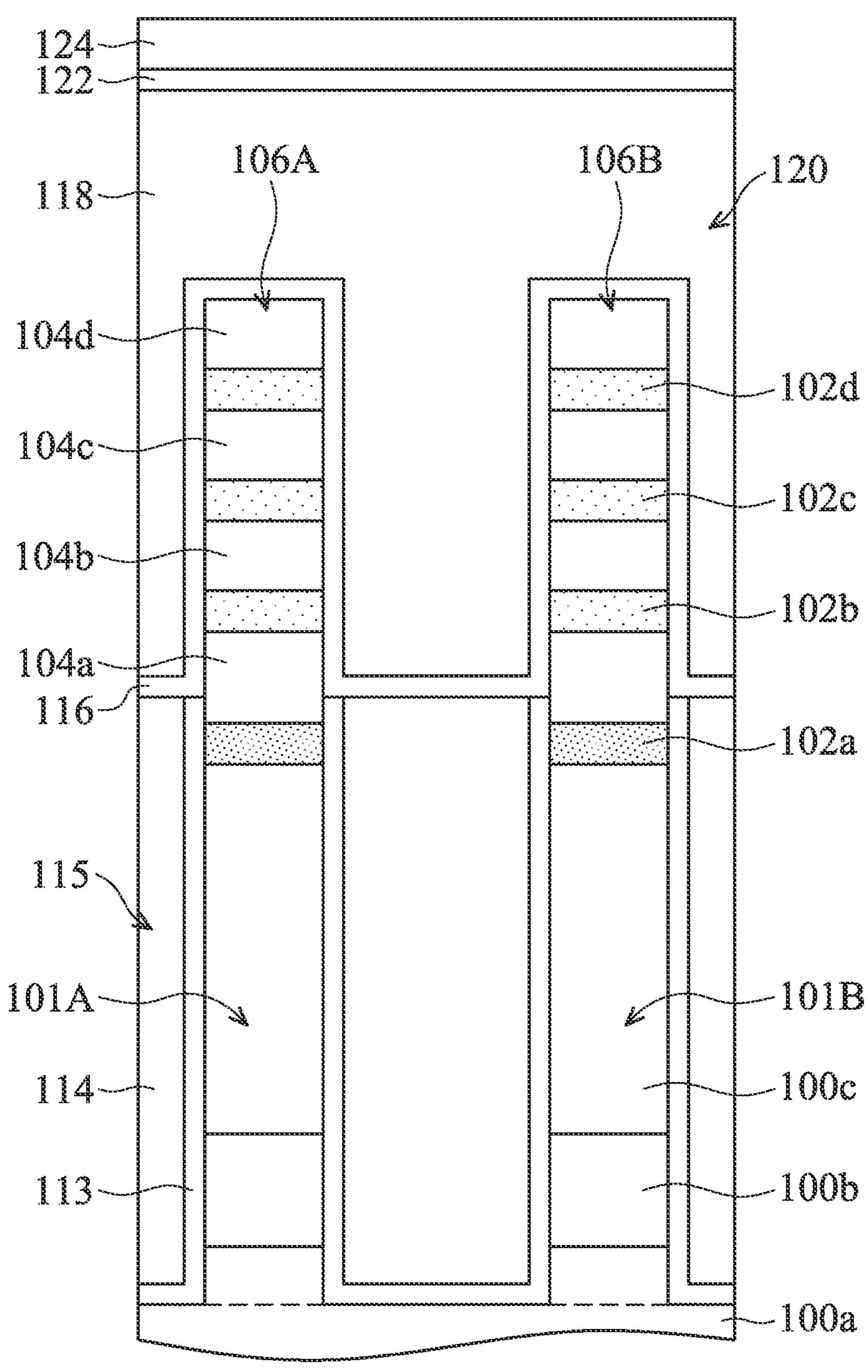
Figure 3A:
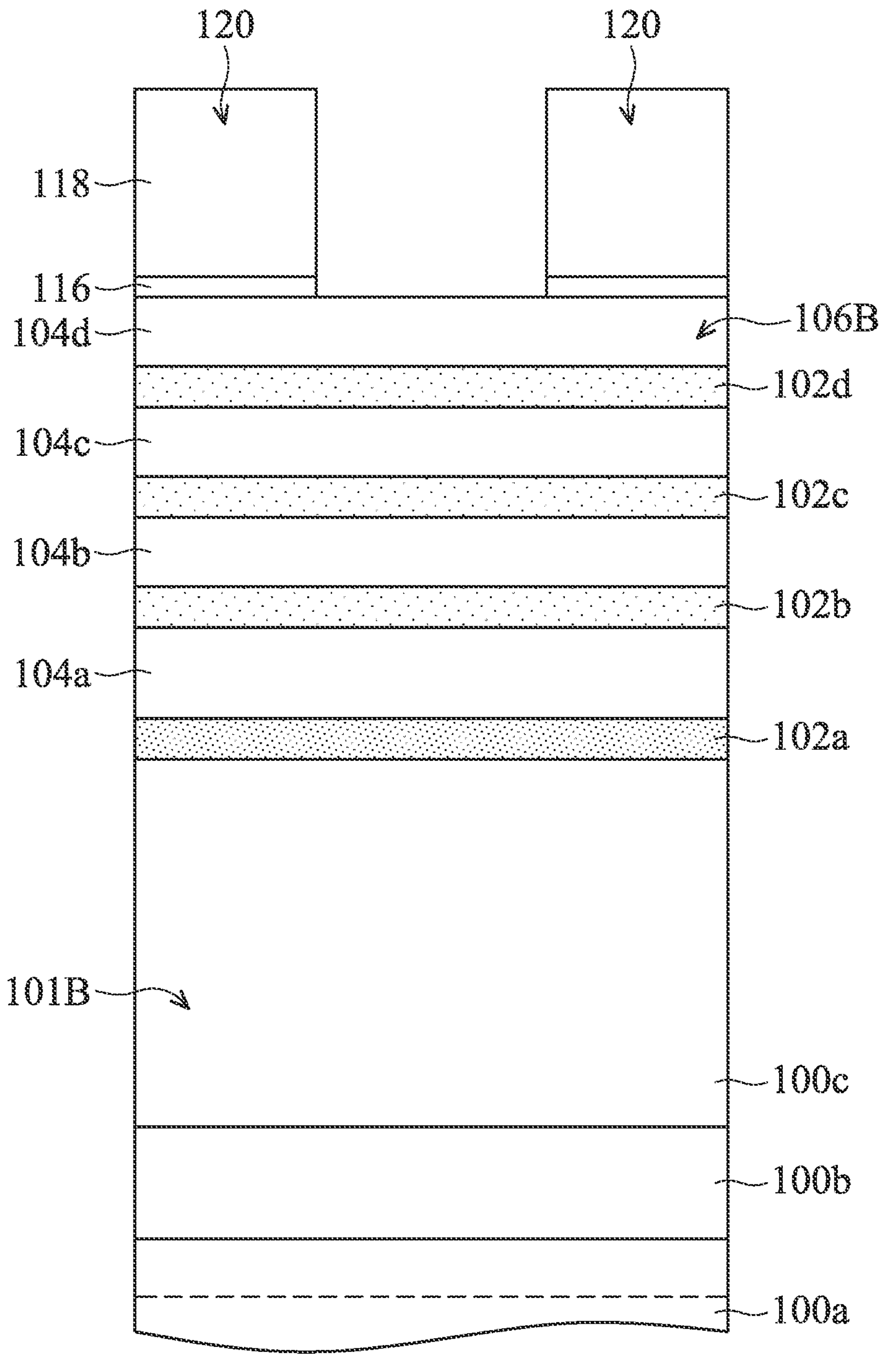
FIGS. 3A-3T are cross-sectional views of various stages of a process for forming a portion of a semiconductor device structure, in accordance with some embodiments.

Afterwards, dummy gate stacks 120 are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3T are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120 are formed to partially cover and to extend across the fin structures 106A and 106B, in accordance with some embodiments. In some embodiments, the dummy gate stacks 120 are wrapped around portions of the fin structures 106A and 106B. As shown in FIG. 1B, other portions of the fin structures 106A and 106B are exposed without being covered by the dummy gate stacks 120. In FIG. 3A, upper portions of the dummy gate stacks 120 are not shown.

As shown in FIGS. 2D and 3A, each of the dummy gate stacks 120 includes a dummy gate dielectric layer 116 and a dummy gate electrode 118. The dummy gate dielectric layers 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A and 106B. The dummy gate dielectric material layer may be deposited using an ALD process, a CVD process, another applicable process, or a combination thereof. The dummy gate electrode layer may be deposited using a CVD process. Afterwards, the dummy gate dielectric material layer and the dummy gate electrode layer are patterned to form the dummy gate stacks 120.

In some embodiments, hard mask elements including mask layers 122 and 124 are used to assist in the patterning process for forming the dummy gate stacks 120. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120.

Figure 3B:
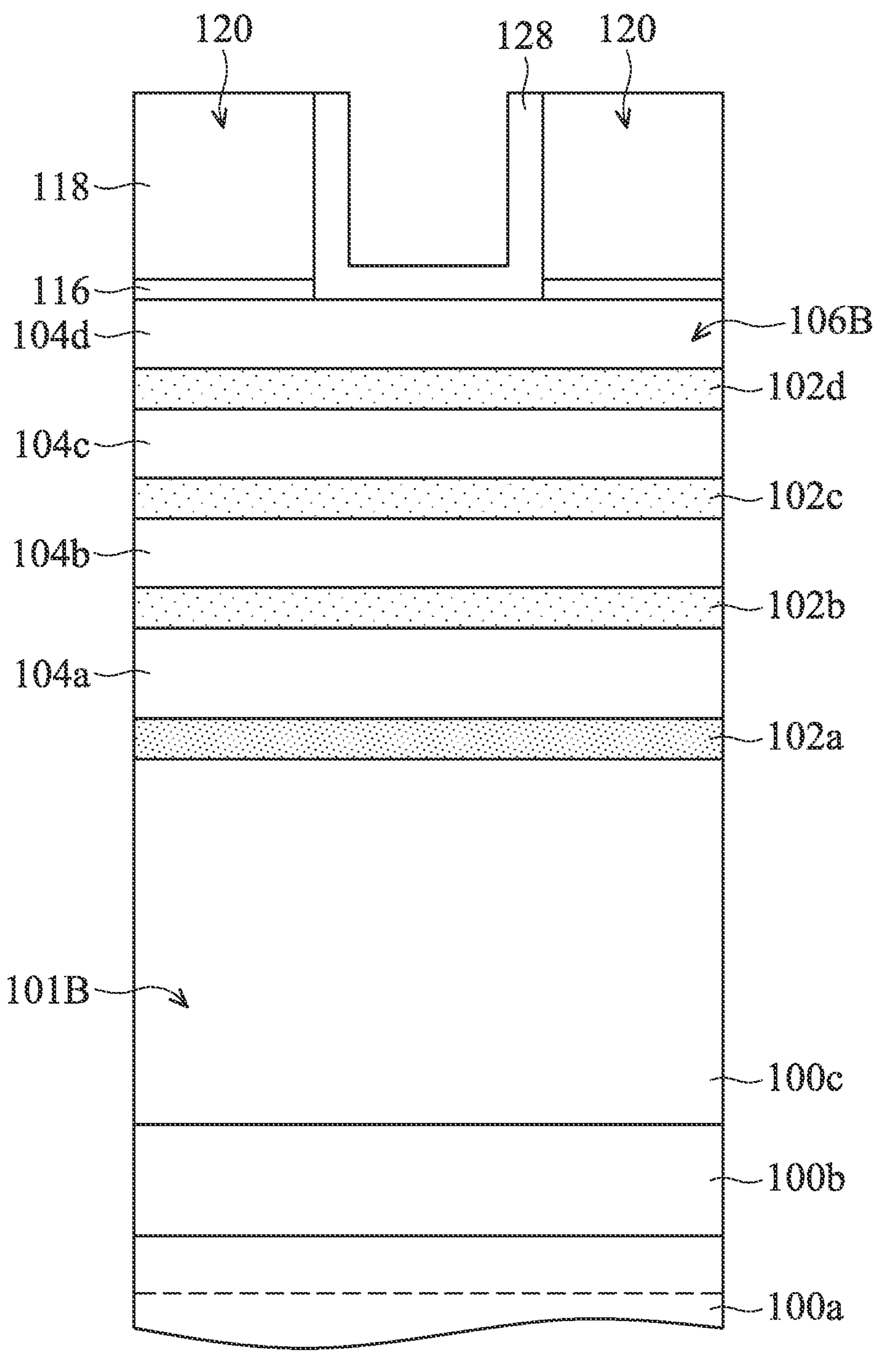

As shown in FIG. 3B, a spacer layer 128 is afterwards deposited over the dummy gate stacks 120 and the fin structure 106B, in accordance with some embodiments. The spacer layer 128 extends along the tops and sidewalls of the dummy gate stacks 120, as shown in FIG. 3B. The spacer layer 128 also extends along the top of the fin structure 106B, as shown in FIG. 3B.

The spacer layer 128 may be made of or include silicon nitride, silicon oxynitride, silicon oxide, silicon carbide, silicon oxycarbide, carbon-containing silicon oxynitride, carbon-containing silicon nitride, another suitable material, or a combination thereof. The spacer layer 128 may be sequentially deposited using a CVD process, an ALD process, a physical vapor deposition (PVD) process, another applicable process, or a combination thereof.

In some embodiments, the spacer layer 128 is a single layer. In some other embodiments, the spacer layer 128 includes multiple sub-layers. Some of the sub-layers may be made of the same material. Some of the sub-layers may be made of different materials. Some of the sub-layers may be made of similar materials with different compositions. For example, one of the sub-layers may have a greater atomic concentration of carbon than other sub-layers.

Figure 3C:
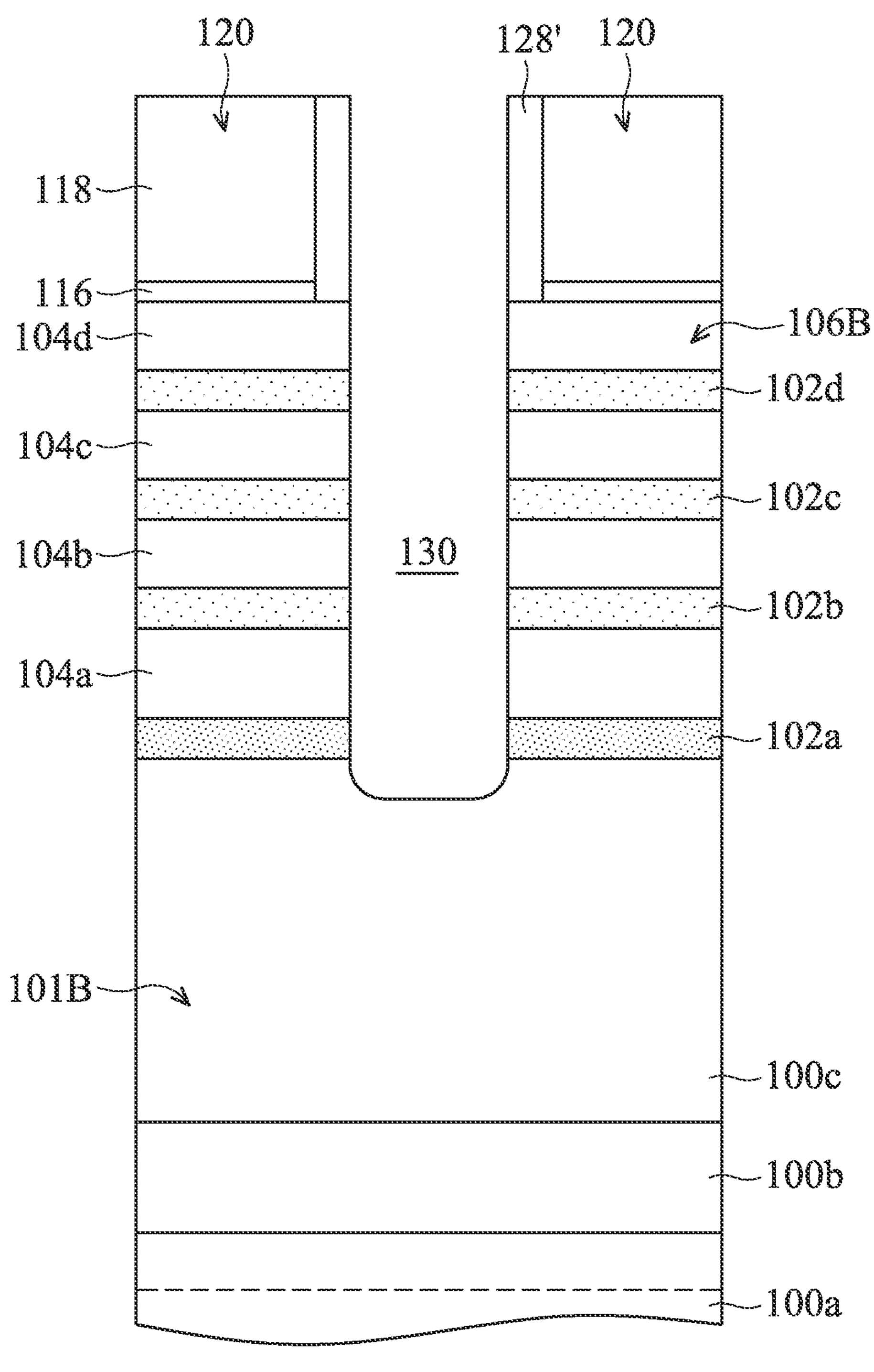

As shown in FIG. 3C, the spacer layer 128 is partially removed, in accordance with some embodiments. One or more anisotropic etching processes may be used to partially remove the spacer layer 128. As a result, remaining portions of the spacer layer 128 form gate spacers 128'. The gate spacers 128' extend along the sidewalls of the dummy gate stacks 120, as shown in FIG. 3C.

Afterwards, the fin structure 106B is partially removed to form multiple openings 130 used for containing subsequently formed epitaxial structures. As shown in FIG. 3C, the fin structure 106B is partially removed to form the openings 130, in accordance with some embodiments. In FIG. 3C, one of the openings 130 is shown. As shown in FIG. 3C, the opening 130 exposes the side surfaces of the semiconductor layers 104*a*-104*d* on which epitaxial structures (such as source/drain structures) will be formed later. Source/drain structures may refer to a source structure or a drain structure, individually or collectively dependent upon the context. The opening 130 also exposes the side surfaces of the semiconductor layers 102*a*-102*d*, as shown in FIG. 3C.

One or more etching processes may be used to form the opening 130. In some embodiments, a dry etching process is used to form the opening 130. Alternatively, a wet etching process may be used to form the opening 130. In some embodiments, the opening 130 penetrates into the fin structure 106B. In some embodiments, the opening 130 further extend into the semiconductor fin 101B, as shown in FIG. 3C. In some embodiments, the gate spacers 128' and the opening 130 are simultaneously formed using the same etching process.

In some embodiments, the opening 130 has sidewalls that are substantially vertical. In these cases, due to the profile of the opening 130, an upper semiconductor layer (such as the semiconductor layer 104*d*) is substantially as wide as a lower semiconductor layer (such as the semiconductor layer 104*b*).

However, embodiments of the disclosure may have many variations. In some other embodiments, the opening 130 has slanted sidewalls. The upper portion of the opening 130 is larger (or wider) than the lower portion of the opening 130. In these cases, due to the profile of the opening 130, an upper semiconductor layer (such as the semiconductor layer 104*d*) is narrower than a lower semiconductor layer (such as the semiconductor layer 104*b*).

Figure 3D:
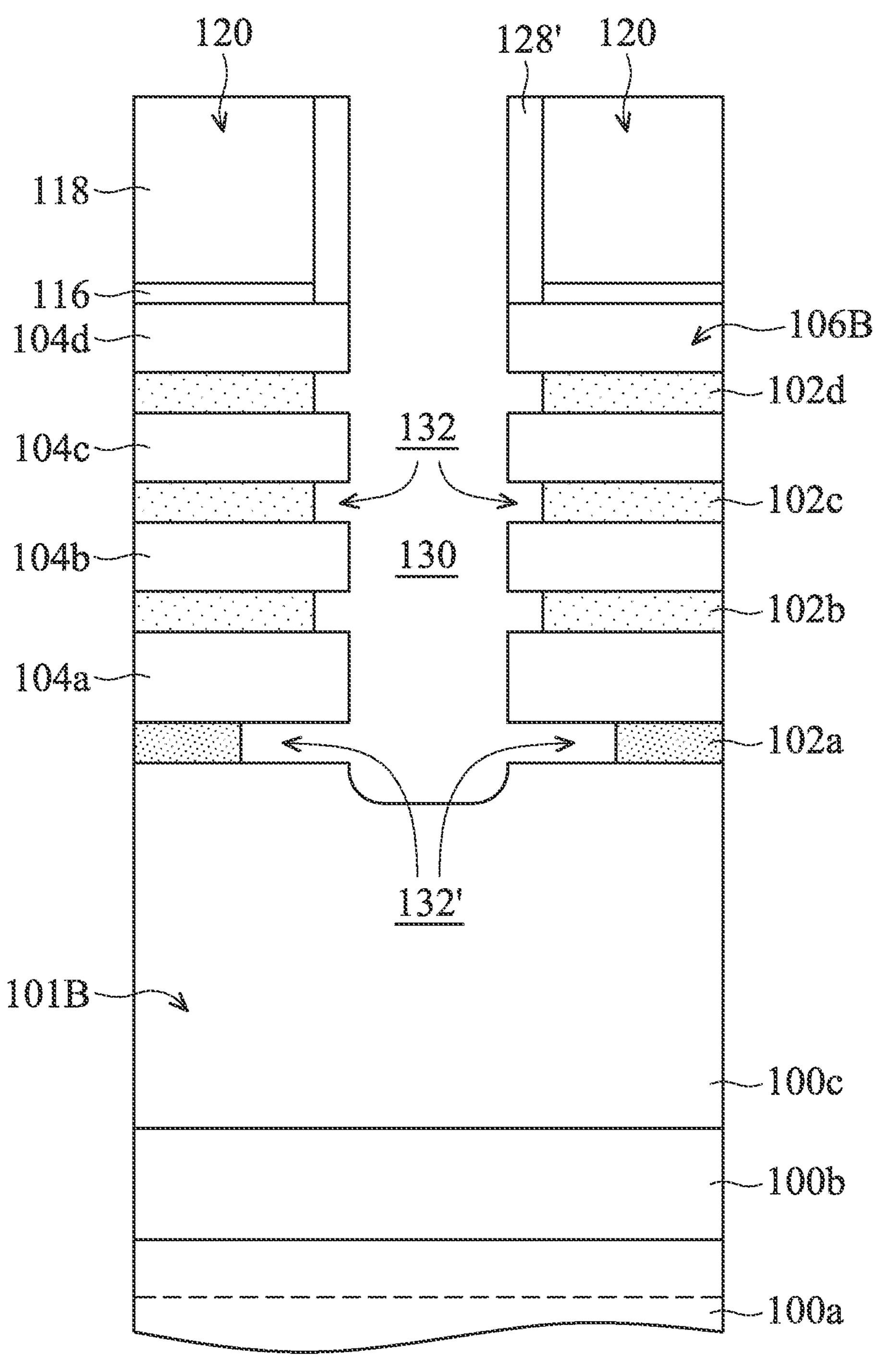

As shown in FIG. 3D, the semiconductor layers 102*a*-102*d* are laterally etched, in accordance with some embodiments. As a result, the edges of the semiconductor layers 102*a*-102*d* retreat from the edges of the semiconductor layers 104*a*-104*d*. As shown in FIG. 3D, recesses 132 and 132' are simultaneously formed due to the lateral etching of the semiconductor layers 102*a*-102*d*, in accordance with some embodiments. The recesses 132 may be used to contain inner spacers that will be formed later. The recesses 132' may be used to contain protective structures that will be formed later.

The semiconductor layers 102*a*-102*d* may be laterally etched using a wet etching process, a dry etching process, or a combination thereof. In some other embodiments, the semiconductor layers 102*a*-102*d* are partially oxidized before being laterally etched.

In some embodiments, each of the recesses 132' is deeper than each of the recesses 132. As mentioned above, in some embodiments, the semiconductor layer 102*a* has a higher atomic concentration of germanium than that of the semiconductor layers 102*b*-102*d*. Therefore, during the lateral etching of the semiconductor layers 102*a*-102*d*, the semiconductor layer 102*a* is lateral etched at a higher etching rate than the semiconductor layers 102*b*-102*d*. As a result, the recesses 132' that are deeper than the recesses 132 are formed.

In some embodiments, during the lateral etching of the semiconductor layers 102*a*-102*d*, the semiconductor layers 104*a*-104*d* may also be slightly etched. As a result, edge portions of the semiconductor layers 104*a*-104*d* are partially etched and thus shrink.

Figure 3E:
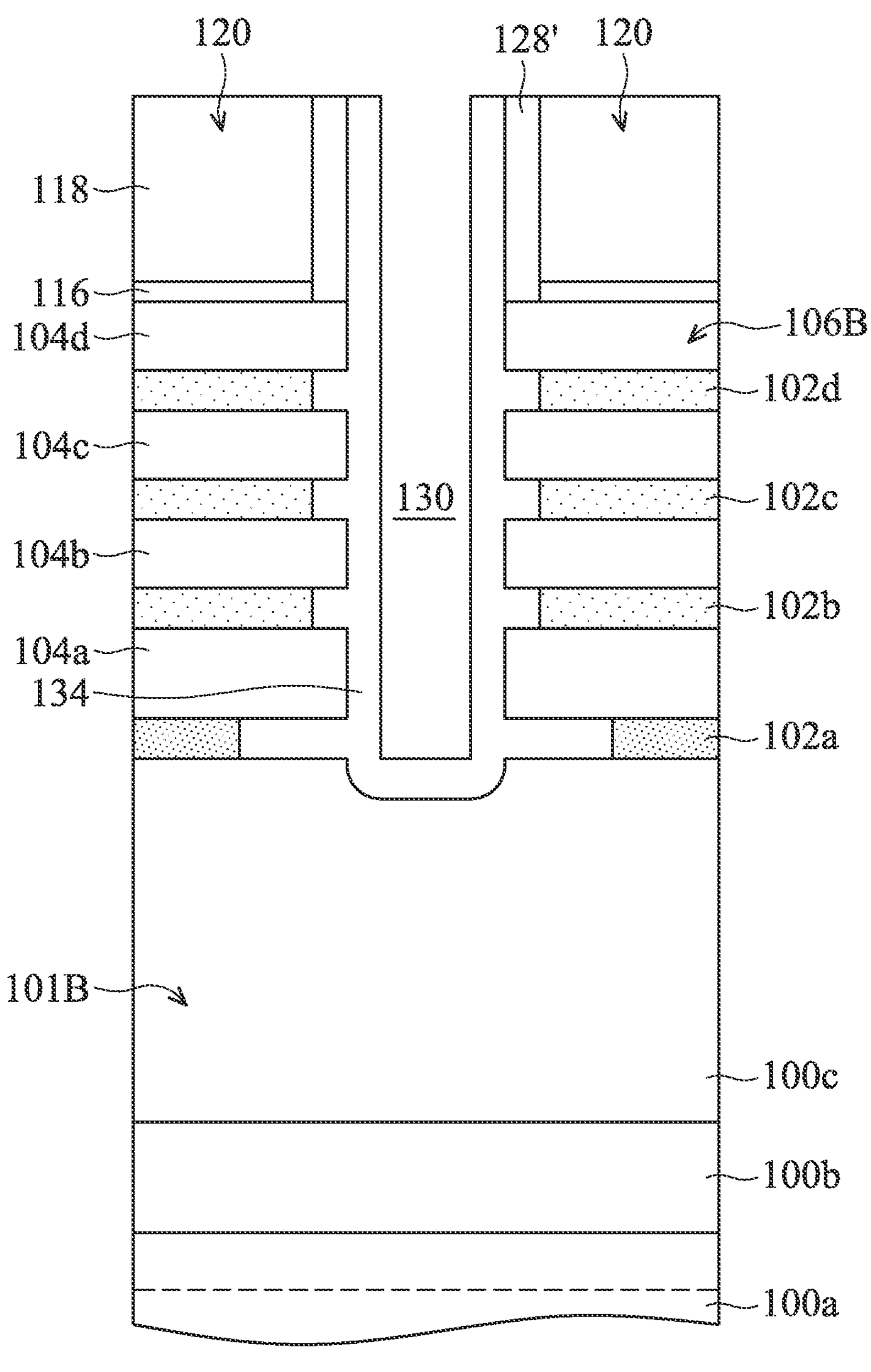

As shown in FIG. 3E, an insulating layer 134 is deposited over the structure shown in FIG. 3D, in accordance with some embodiments. The insulating layer 134 covers the dummy gate stacks 120 and overfills the recesses 132 and 132'. The insulating layer 134 may be made of or include carbon-containing silicon nitride (SiCN), carbon-containing silicon oxynitride (SiOCN), carbon-containing silicon oxide (SiOC), silicon oxide, silicon nitride, another suitable material, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, another applicable process, or a combination thereof.

Figure 3F:
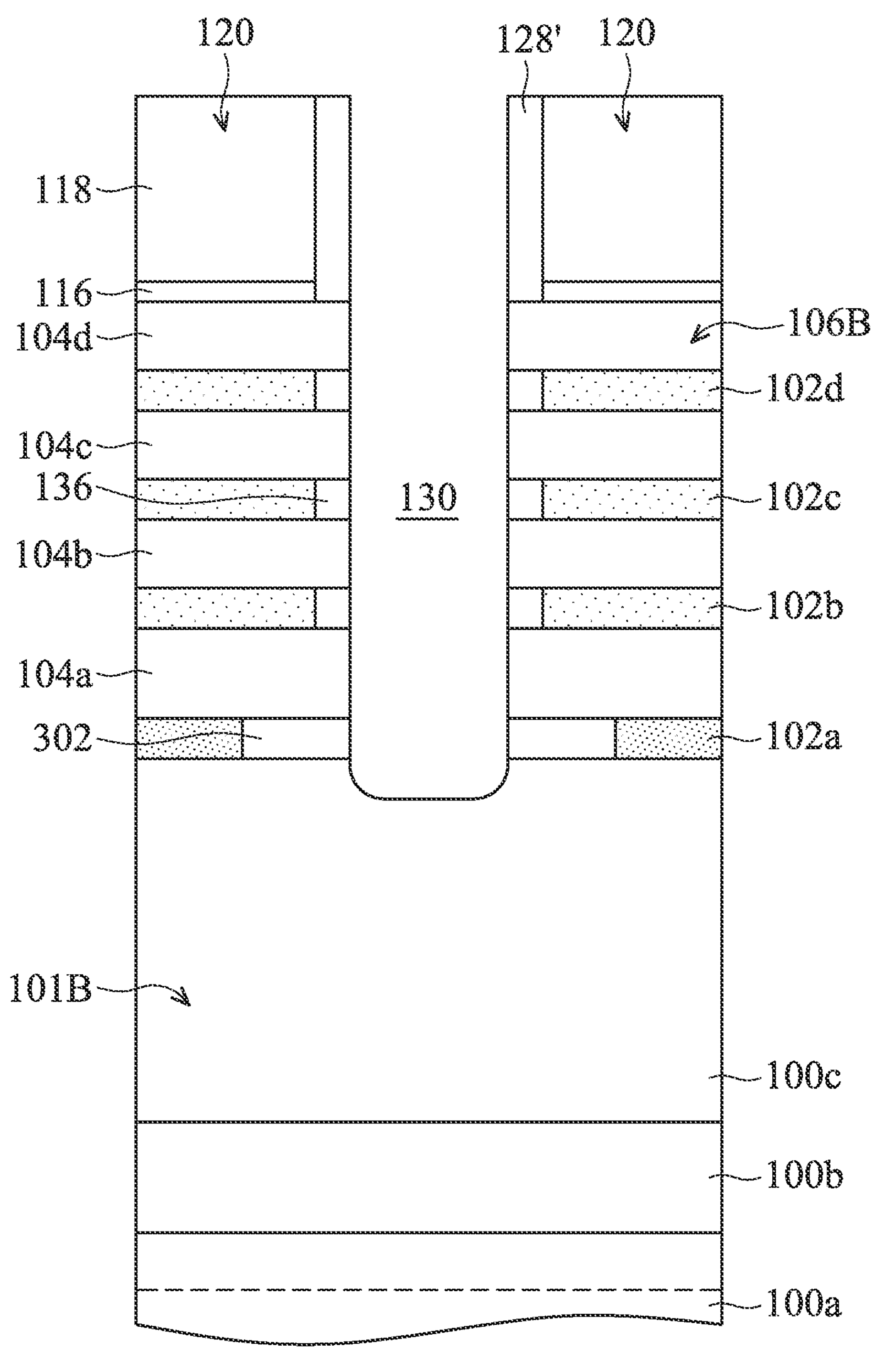

As shown in FIG. 3F, an etching process is used to partially remove the insulating layer 134, in accordance with some embodiments. The portions of the insulating layer 134 outside of the recesses 132 may be removed. The remaining portions of the insulating layer 134 in the recesses 132 form inner spacers 136. The remaining portions of the insulating layer 134 in the recesses 132' form protective structures 302. The etching process may include a dry etching process, a wet etching process, or a combination thereof.

In some embodiments, each of the protective structures 302 is wider than each of the inner spacers 136, as shown in FIG. 3F. In some embodiments, since the protective structures 302 and the inner spacers 136 are portions of the same material layer (i.e., the insulating layer 134), the protective structures 302 and the inner spacers 136 have the same composition.

In some embodiments, each of the protective structures 302 is in direct contact with or adjacent to the semiconductor layer 102*a* that functions as a base layer. However, embodiments of the disclosure are not limited thereto. Many variations and/or modifications can be made to embodiments of the disclosure. In some other embodiments, since the recesses 132' are deeper, the insulating layer 134 might not be able to completely fill the recesses 132'. In these cases, there may be a void formed between the insulating layer 134 and the semiconductor layer 102*a*. As a result, one or more voids may be formed between the protective structure 302 and the semiconductor layer 102*a*. In these cases, the protective structure 302 may not be in direct contact with the semiconductor layer 102*a*.

As shown in FIG. 3F, the inner spacers 136 cover the edges of the semiconductor layers 102*b*-102*d*. The inner spacers 136 may be used to prevent subsequently formed epitaxial structures (which function as source/drain structures, for example) from being damaged during a subsequent process for removing the semiconductor layers 102*b*-102*d*. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, a portion of the semiconductor fin 101B originally covered by the insulating layer 134 is exposed by the opening 130, as shown in FIG. 3F. The edges of the semiconductor layers 104*a*-104*d* are also exposed by the opening 130, as shown in FIG. 3F.

Figure 3G:
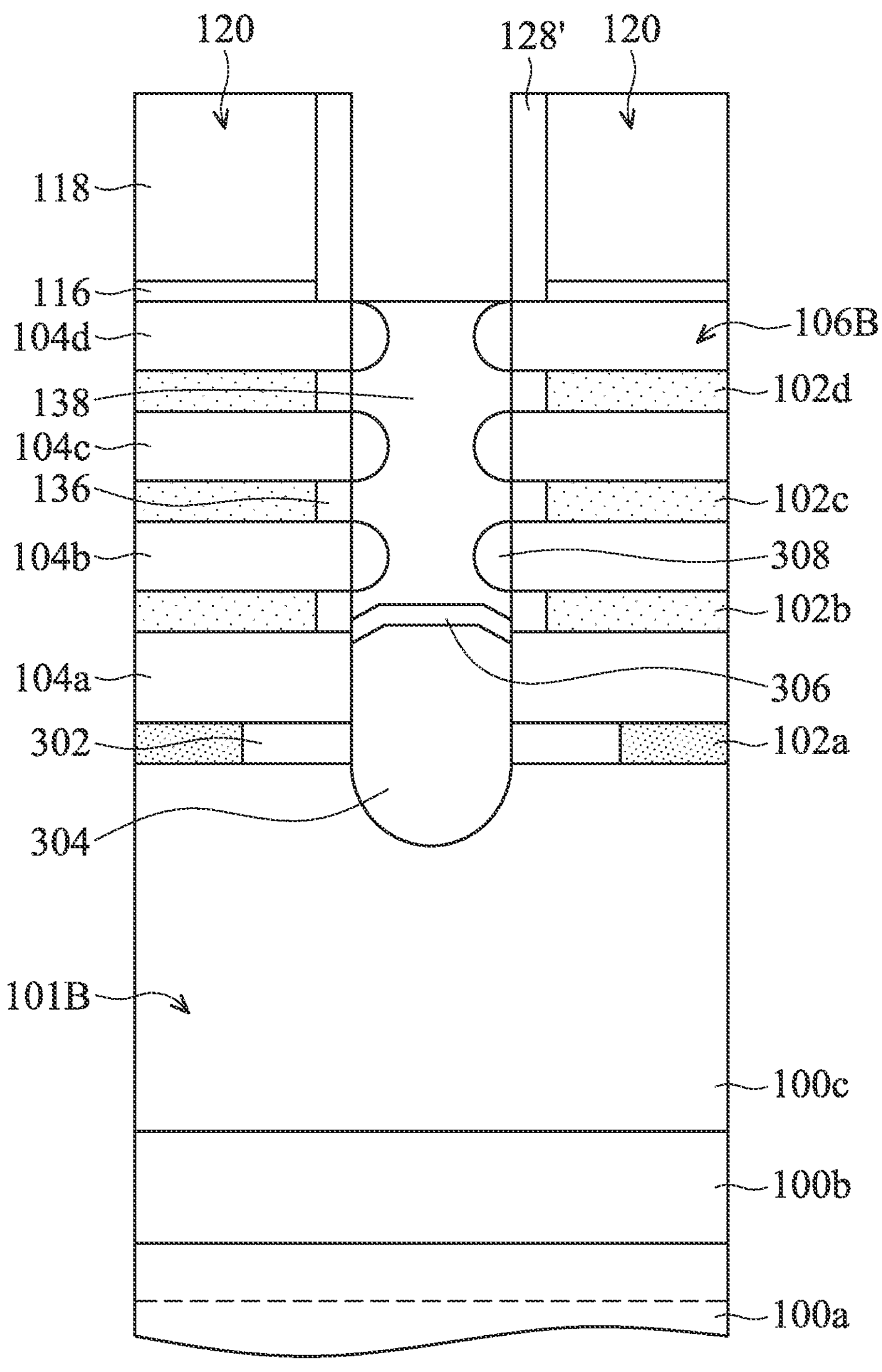

As shown in FIG. 3G, an epitaxial structure that includes an un-doped epitaxial portion 304 and a doped epitaxial portion 138 are formed to fill the opening 130, in accordance with some embodiments. In some embodiments, the un-doped epitaxial portion 304 is adjacent to the semiconductor layer 104*a*. The un-doped epitaxial portion 304 is formed over the bottom of the opening 130. In some embodiments, the un-doped epitaxial portion 304 is substantially free of n-type dopants or p-type dopants. The un-doped epitaxial portion 304 may provide a relative planar surface, so as to facilitate the subsequent formation of the epitaxial structure.

The un-doped epitaxial portion 304 may be made of or include silicon, silicon germanium, another suitable material, or a combination thereof. The un-doped epitaxial portion 304 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof. In some embodiments, the formation of the un-doped epitaxial portion 304 involve one or more etching processes that are used to fine-tune the profiles of the un-doped epitaxial portion 304.

Afterwards, a bottom isolation element 306 is selectively formed on the un-doped epitaxial portion 304, as shown in FIG. 3G in accordance with some embodiments. The bottom isolation element 306 may function as a stop layer during a subsequent process for forming a backside conductive contact.

In some embodiments, the bottom isolation element 306 is made of or includes a dielectric material. The dielectric material may include silicon oxide, silicon nitride, carbon-containing silicon nitride, carbon-containing silicon oxynitride, carbon-containing silicon oxide, aluminum oxide, hafnium oxide, another suitable material, or a combination thereof. The formation of the bottom isolation element 306 may involve one or more deposition processes and one or more patterning processes.

However, embodiments of the disclosure are not limited thereto. Many variations and/or modifications can be made to embodiments of the disclosure. In some other embodiments, the bottom isolation element 306 is not formed.

As shown in FIG. 3G, a doped epitaxial portion 138 is formed on the bottom isolation element 306 and the side surfaces of the semiconductor layers 104*b*-104*d*, in accordance with some embodiments. In some embodiments, the doped epitaxial portion 138 are substantially as high as the tops of the semiconductor layer 104*d*. In some other embodiments, the top surfaces of the doped epitaxial portion 138 are higher than the top surface of the dummy gate dielectric layer 116.

In some embodiments, the doped epitaxial portion 138 connect to the semiconductor layers 104*b*-104*d*. In some embodiments, the doped epitaxial portion 138 has lightly doped portions 308 adjacent to the semiconductor layers 104*b*-104*d*. The dopant concentration of the lightly doped portions 308 is lower than other portions of the doped epitaxial portion 138.

In some embodiments, the doped epitaxial portion 138 are p-type doped regions. The doped epitaxial portion 138 may include epitaxially grown silicon germanium (SiGe), epitaxially grown silicon, or another suitable epitaxially grown semiconductor material. P-type dopants may include boron, another suitable element, or a combination thereof.

However, embodiments of the disclosure are not limited thereto. In some other embodiments, the doped epitaxial portion 138 are n-type doped regions. The doped epitaxial portion 138 may include epitaxially grown silicon, epitaxially grown silicon carbide (SiC), epitaxially grown germanium, or another suitable epitaxially grown semiconductor material. N-type dopants may include phosphor, arsenic, another suitable element, or a combination thereof.

In some embodiments, the doped epitaxial portion 138 are doped in-situ during their epitaxial growth. The initial reaction gas mixture for forming the doped epitaxial portion 138 contains dopants. In some other embodiments, the doped epitaxial portion 138 are not doped during the growth of the doped epitaxial portion 138. Instead, after the formation of the doped epitaxial portion 138, the doped epitaxial portion 138 are doped in a subsequent process. In some embodiments, the doping is achieved by using an ion implantation process, a plasma immersion ion implantation process, a gas and/or solid source diffusion process, another applicable process, or a combination thereof. In some embodiments, the doped epitaxial portion 138 are further exposed to one or more annealing processes to activate the dopants. For example, a rapid thermal annealing process is used.

Figure 3H:
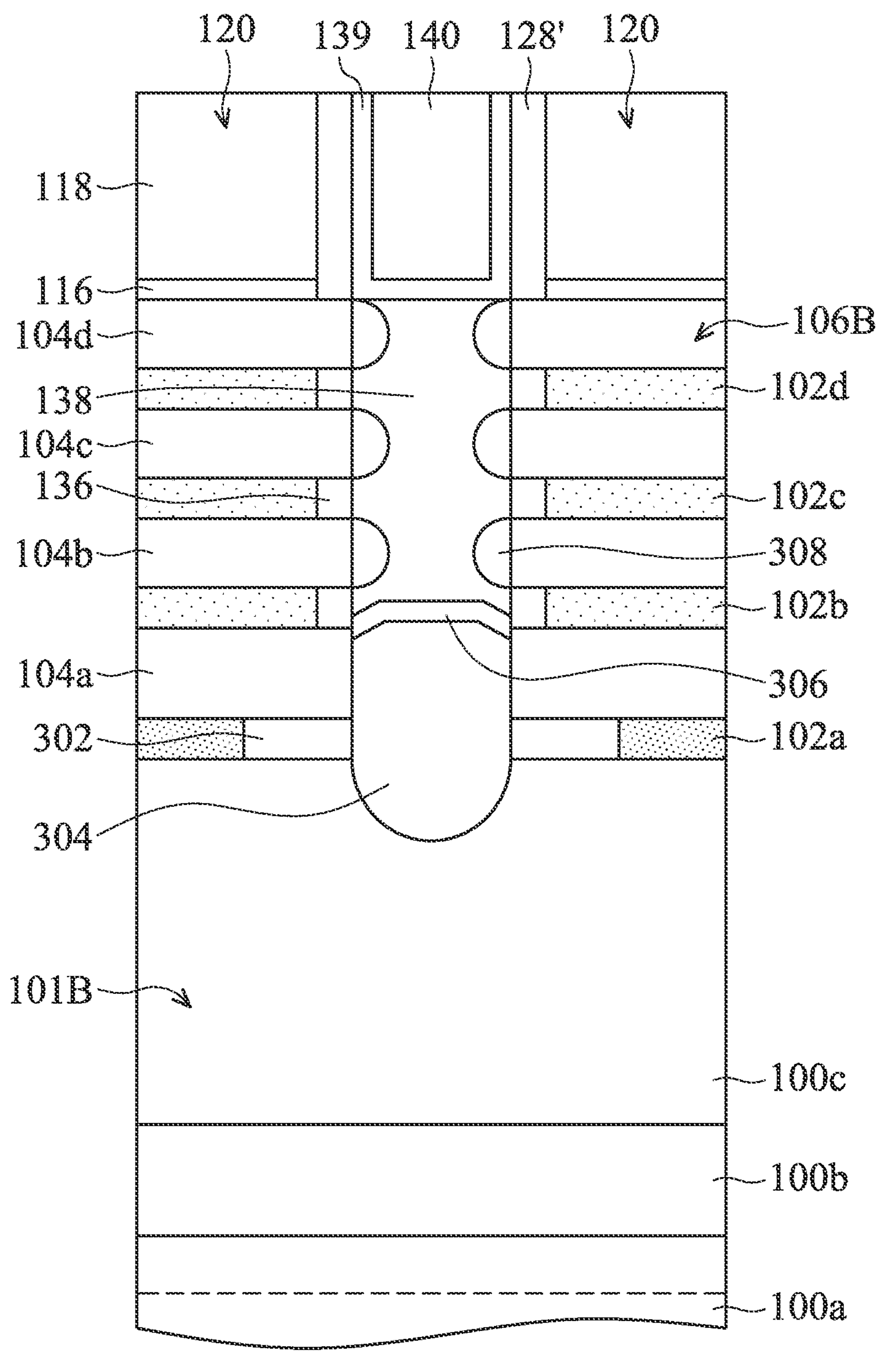

As shown in FIG. 3H, a contact etch stop layer 139 and a dielectric layer 140 are formed over the structure shown in FIG. 3G, in accordance with some embodiments. The contact etch stop layer 139 may be made of or include silicon nitride, silicon oxynitride, silicon carbide, carbon-containing silicon nitride, carbon-containing silicon oxynitride, carbon-containing silicon oxide, aluminum oxide, another suitable material, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof.

In some embodiments, an etch stop material layer and a dielectric material layer are sequentially deposited over the structure shown in FIG. 3G. The etch stop material layer may be deposited using a CVD process, an ALD process, a PVD process, another applicable process, or a combination thereof. The dielectric material layer may be deposited using an FCVD process, a CVD process, an ALD process, another applicable process, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, another applicable process, or a combination thereof. In some embodiments, the mask layers 122 and 124 over the dummy gate stacks 120 are removed during the planarization process.

Figure 2E:
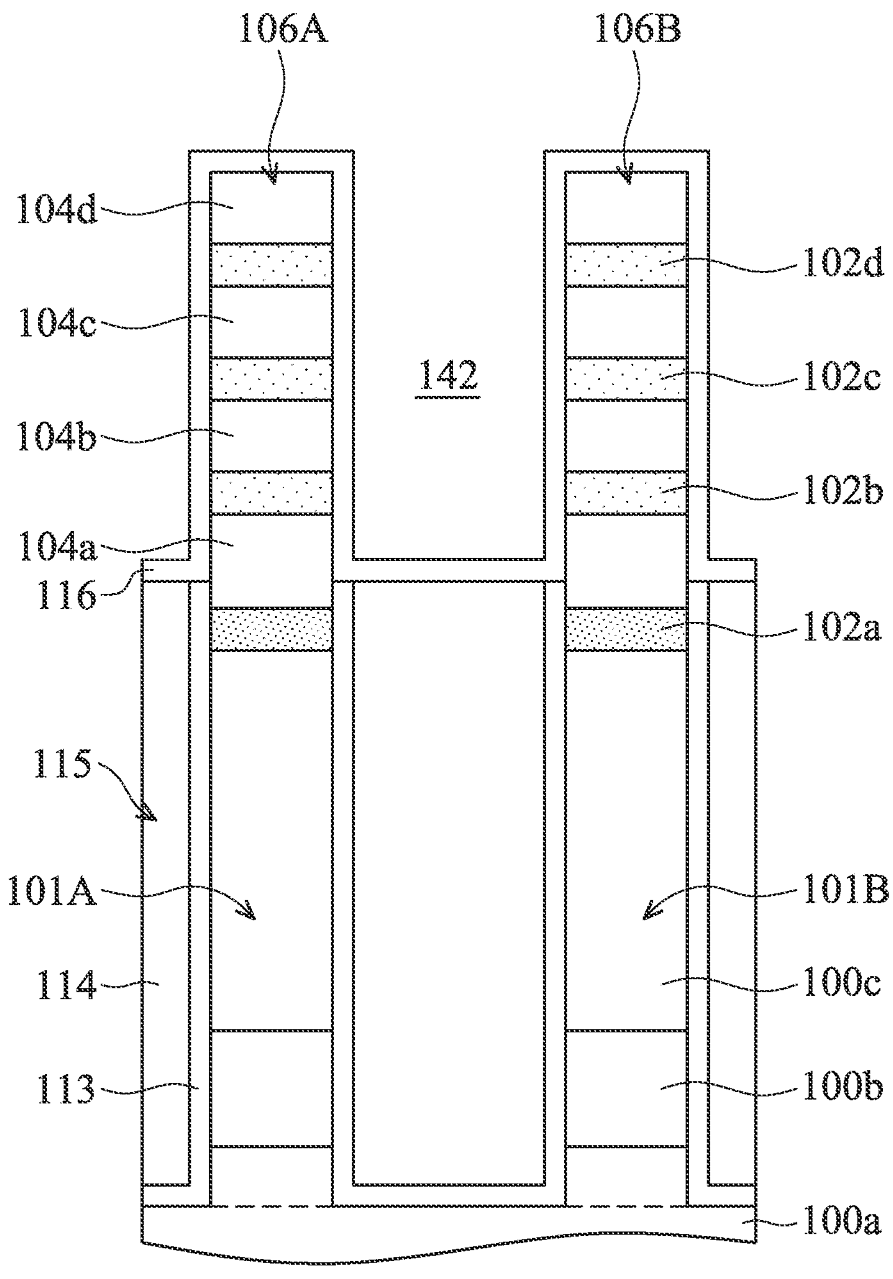
Figure 3I:
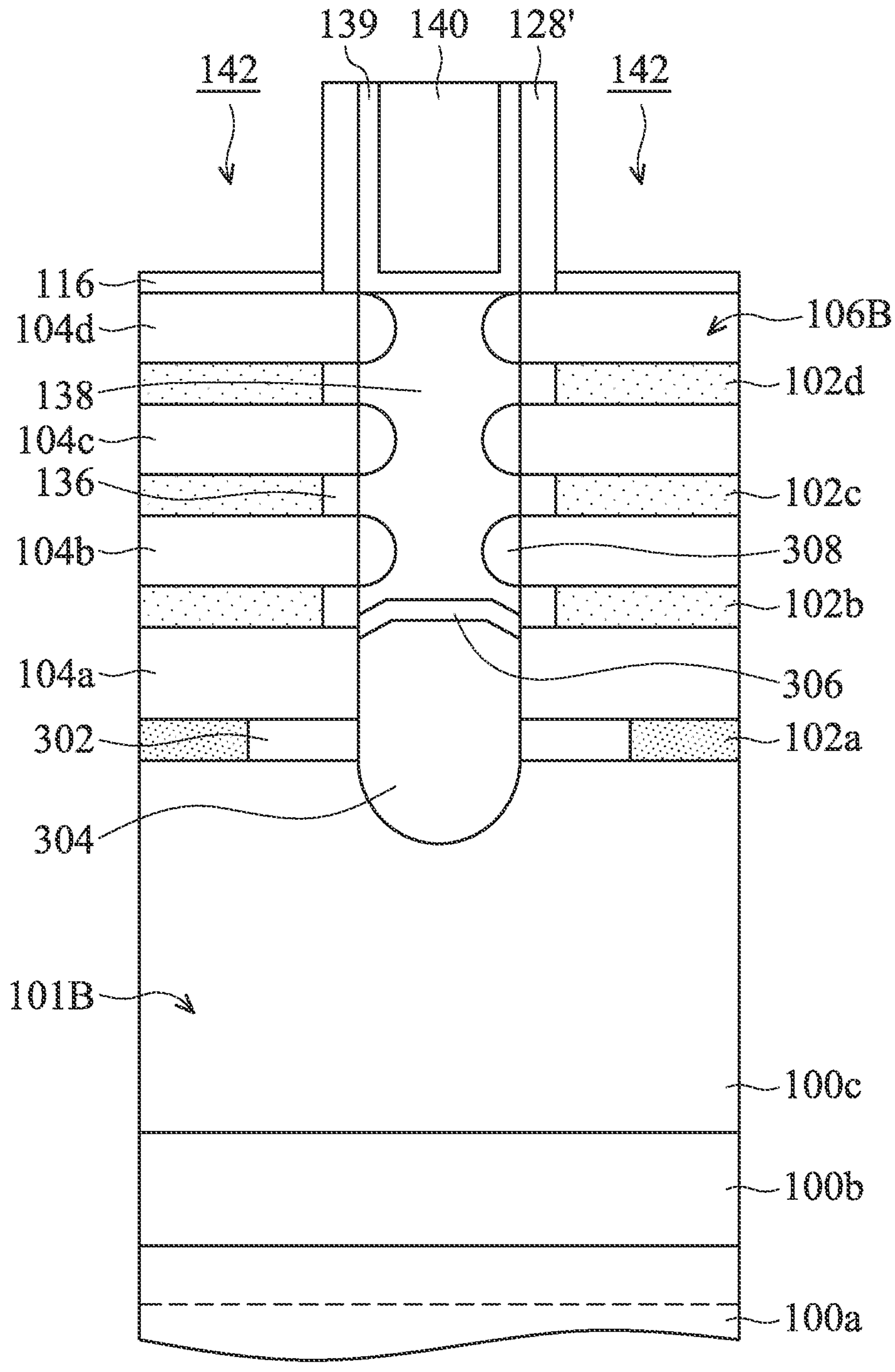

Afterwards, a gate replacement process is performed to replace the dummy gate stack 120 with a metal gate stack. As shown in FIGS. 2E and 3I, the dummy gate electrodes 118 are removed to form trenches 142 using one or more etching processes, in accordance with some embodiments. The trenches 142 expose the dummy gate dielectric layer 116 and the interior sidewalls of the gate spacers 128'.

Figure 2F:
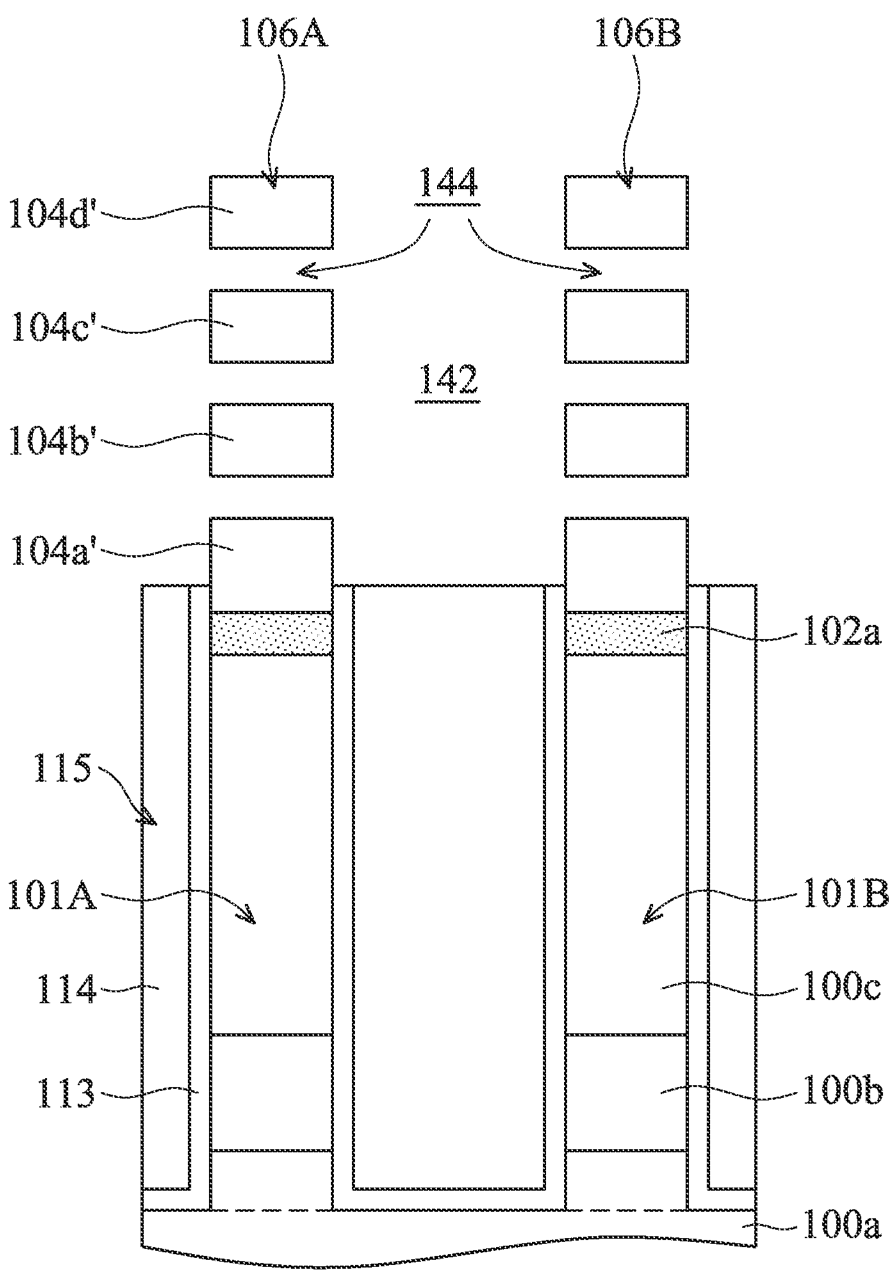
Figure 3J:
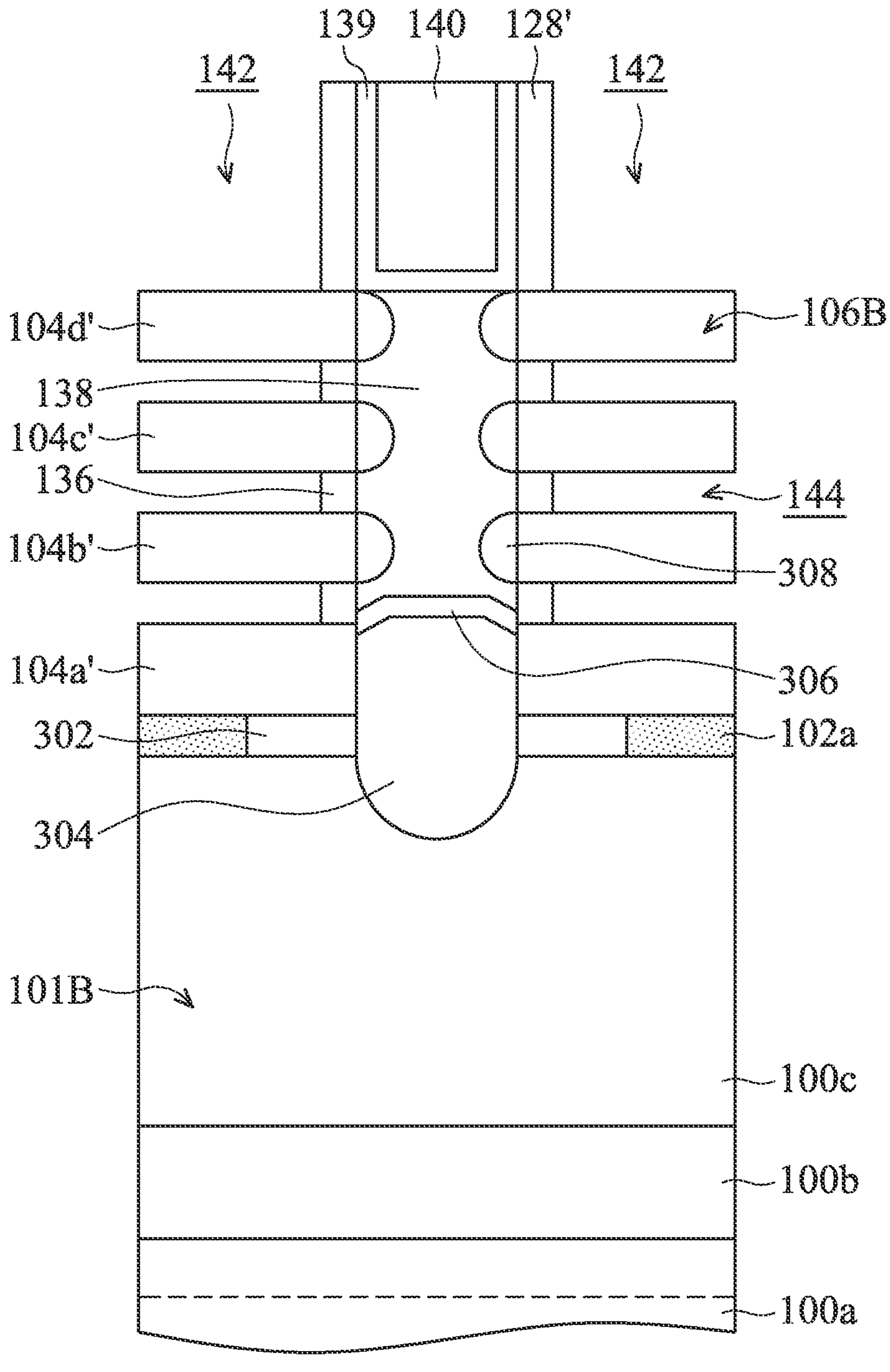

As shown in FIGS. 2F and 3J, the dummy gate dielectric layer 116 and the semiconductor layers 102*b*-102*d* (which function as sacrificial layers) are removed, in accordance with some embodiments. In some embodiments, one or more etching processes are used to remove the dummy gate dielectric layer 116 and the semiconductor layers 102*b*-102*d*. As a result, recesses 144 are formed, as shown in FIGS. 2F and 3J.

Due to high etching selectivity, the semiconductor layers 104*a*-104*d* are slightly (or substantially not) etched. The remaining portions of the semiconductor layers 104*a*-104*d* form multiple semiconductor nanostructures 104*a*'-104*d*'. The semiconductor nanostructures 104*a*'-104*d*' are constructed by or made up of the remaining portions of the semiconductor layers 104*a*-104*d*. The semiconductor nanostructures 104*b*'-104*d*' may function as channel structures of transistors. The semiconductor nanostructures 104*a*' may be used as base semiconductor nanostructures. In some embodiments, the semiconductor nanostructures 104*a*' are separated from the epitaxial structures 138. In some embodiments, the semiconductor nanostructures 104*a*' are electrically isolated from the epitaxial structures 138.

In some embodiments, the etchant used for removing the semiconductor layers 102*b*-102*d* also slightly removes the semiconductor layers 104*a*-104*d* that form the semiconductor nanostructures 104*a*'-104*d*'. As a result, the obtained semiconductor nanostructures 104*a*'-104*d*' become thinner after the removal of the semiconductor layers 102*b*-102*d*.

After the removal of the semiconductor layers 102*b*-102*d* (which function as sacrificial layers), the recesses 144 are formed. The recesses 144 surround each of the semiconductor nanostructures 104*a*'-104*d*'. Even if the recesses 144 between the semiconductor nanostructures 104*a*'-104*d*' are formed, the semiconductor nanostructures 104*a*'-104*d*' remain held by the epitaxial structure including the undoped epitaxial portion 304 and the doped epitaxial portion 138. Therefore, after the removal of the semiconductor layers 102*b*-102*d* (which function as sacrificial layers), the released semiconductor nanostructures 104*a*'-104*d*' are prevented from falling.

During the removal of the semiconductor layers 102*b*-102*d* (which function as sacrificial layers), the inner spacers 136 protect the doped epitaxial portion 138 from being etched or damaged. The quality and reliability of the semiconductor device structure are ensured.

As shown in FIG. 2F, during the removal of the semiconductor layers 102*b*-102*d*, the semiconductor layer 102*a* (that function as a base layer) is protected by the isolation structure 115 and the semiconductor nanostructure 104*a*', in accordance with some embodiments. Therefore, the semiconductor layer 102*a* is prevented from being reached and removed by the etchant used for removing the semiconductor layers 102*b*-102*d*.

Figure 2G:
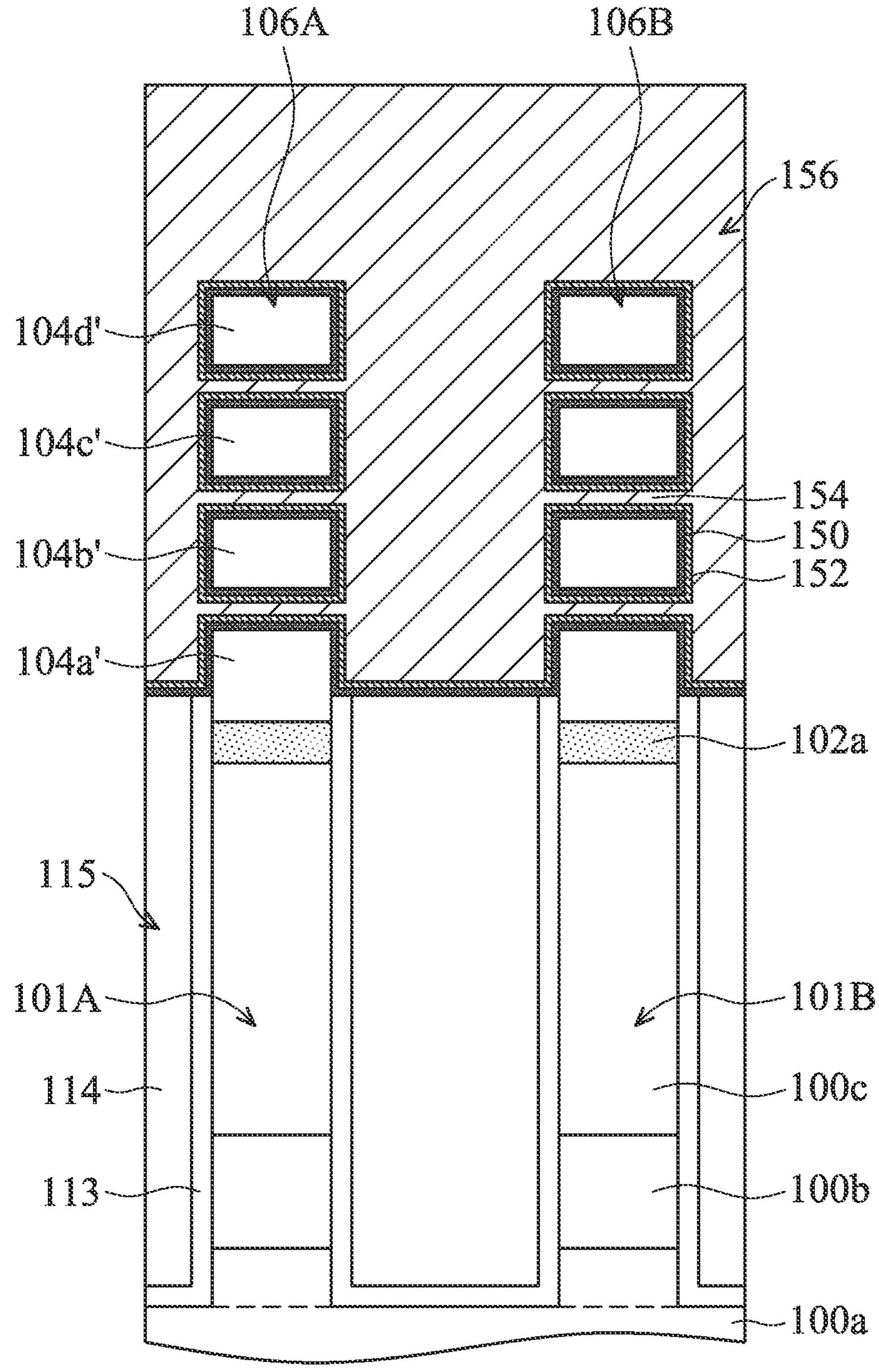
Figure 3K:
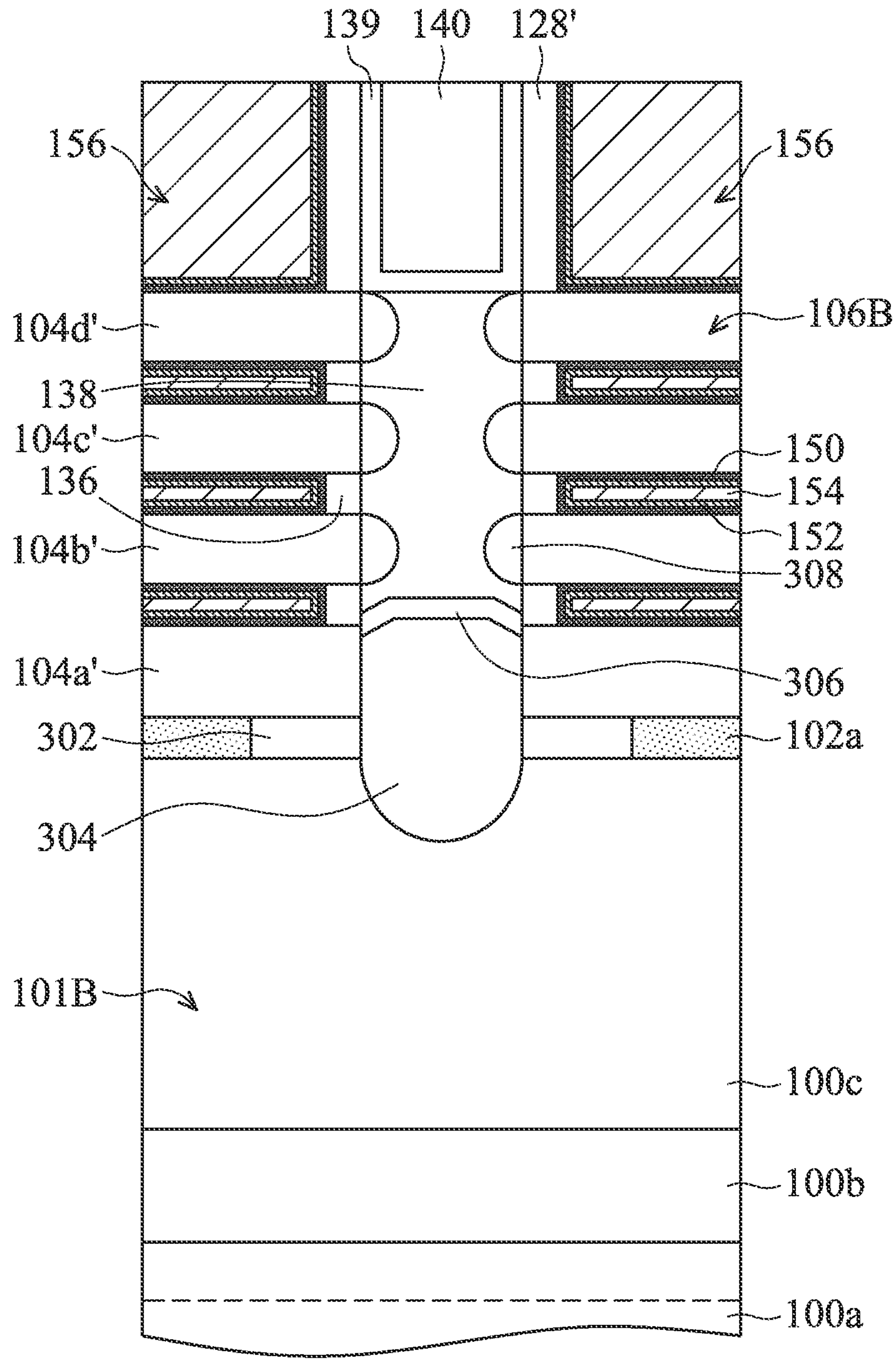

As shown in FIGS. 2G and 3K, metal gate stacks 156 are formed to fill the trenches 142, in accordance with some embodiments. The metal gate stacks 156 further extend into the recesses 144 to wrap around each of the semiconductor nanostructures 104*a*'-104*d*'. Each of the metal gate stacks 156 includes multiple metal gate stack layers. Each of the metal gate stacks 156 may include a gate dielectric layer 150, a work function layer 152, and a conductive filling 154.

In some embodiments, the formation of the metal gate stacks 156 involves the deposition of multiple metal gate stack layers over the dielectric layer 140 to fill the trenches 142 and the recesses 144. The metal gate stack layers extend into the recesses 144 to wrap around each of the semiconductor nanostructures 104*a*'-104*d*'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, another applicable process, or a combination thereof.

In some embodiments, before the formation of the gate dielectric layer 150, interfacial elements are formed on the surfaces of the semiconductor nanostructures 104*a*'-104*d*'. The interfacial elements are very thin and are made of, for example, silicon oxide or germanium oxide. In some embodiments, the interfacial elements are formed by applying an oxidizing agent on the surfaces of the semiconductor nanostructures 104*a*'-104*d*'. For example, a hydrogen peroxide-containing liquid may be applied or provided on the surfaces of the semiconductor nanostructures 104*a*'-104*d*' so as to form the interfacial elements.

The work function layer 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, another suitable material, or a combination thereof. For example, the p-type metal includes tantalum nitride, tungsten nitride, titanium, titanium nitride, another suitable material, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, another suitable material, or a combination thereof. In some embodiments, the n-type work function is an aluminum-containing layer. The aluminum-containing layer may be made of or include TiAlC, TiAlO, TiAlN, another suitable material, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electrochemical plating process, another applicable process, or a combination thereof.

In some embodiments, a barrier layer is formed before the work function layer to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, another suitable material, or a combination thereof. The barrier layer may be deposited using an ALD process, a CVD process, a PVD process, an electroplating process, an electrochemical plating process, another applicable process, or a combination thereof.

In some embodiments, different portions of the metal gate stacks 156 are wrapped around semiconductor nanostructures 104*a*'-104*d*' of different devices including PMOS devices and NMOS devices. Different portions of the metal gate stacks 156 thus have different types of work function layer or different combinations of work functions layers. Multiple deposition processes and multiple patterning processes may be used to selectively form different work function layers 152 at different portions of the metal gate stacks 156.

In some embodiments, the conductive fillings 154 are made of or include a metal material. The metal material may include tungsten, ruthenium, aluminum, copper, cobalt, another suitable material, or a combination thereof. A conductive layer used for forming the conductive filling may be deposited over the work function layer using a CVD process, an ALD process, a PVD process, an electroplating process, an electrochemical plating process, a spin coating process, another applicable process, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, another suitable material, or a combination thereof. The blocking layer may be deposited using an ALD process, a PVD process, an electroplating process, an electrochemical plating process, another applicable process, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156, as shown in FIGS. 2G and 3K.

Afterwards, an interconnection structure is formed over the metal gate stacks 156 and the dielectric layer 140. The interconnection structure includes multiple dielectric layers and multiple conductive features. The conductive features may include conductive contacts, conductive vias, and conductive lines. The interconnection structure may be used to form electrical connection between various devices formed below or within the interconnection structure. The formation of the interconnection structure may include multiple deposition processes, multiple patterning processes, and multiple planarization processes.

Figure 3L:
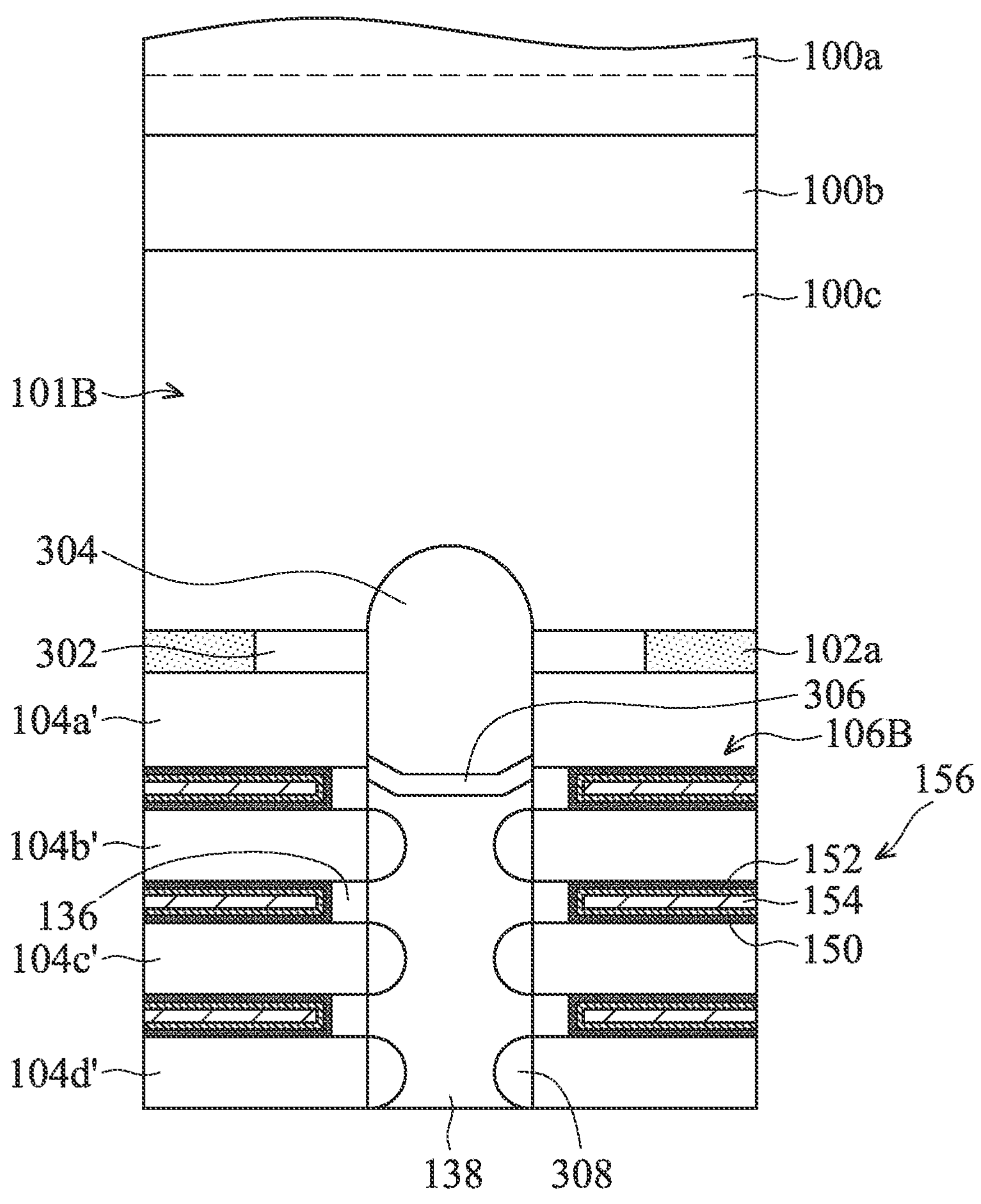

As shown in FIG. 3L, after the formation of the interconnection structure, the structure is turned upside down, in accordance with some embodiments. For simplicity, the interconnection structure, the dielectric layer 140, and the upper portions of the metal gate stacks 156 are not shown in FIG. 3L.

Figure 3M:
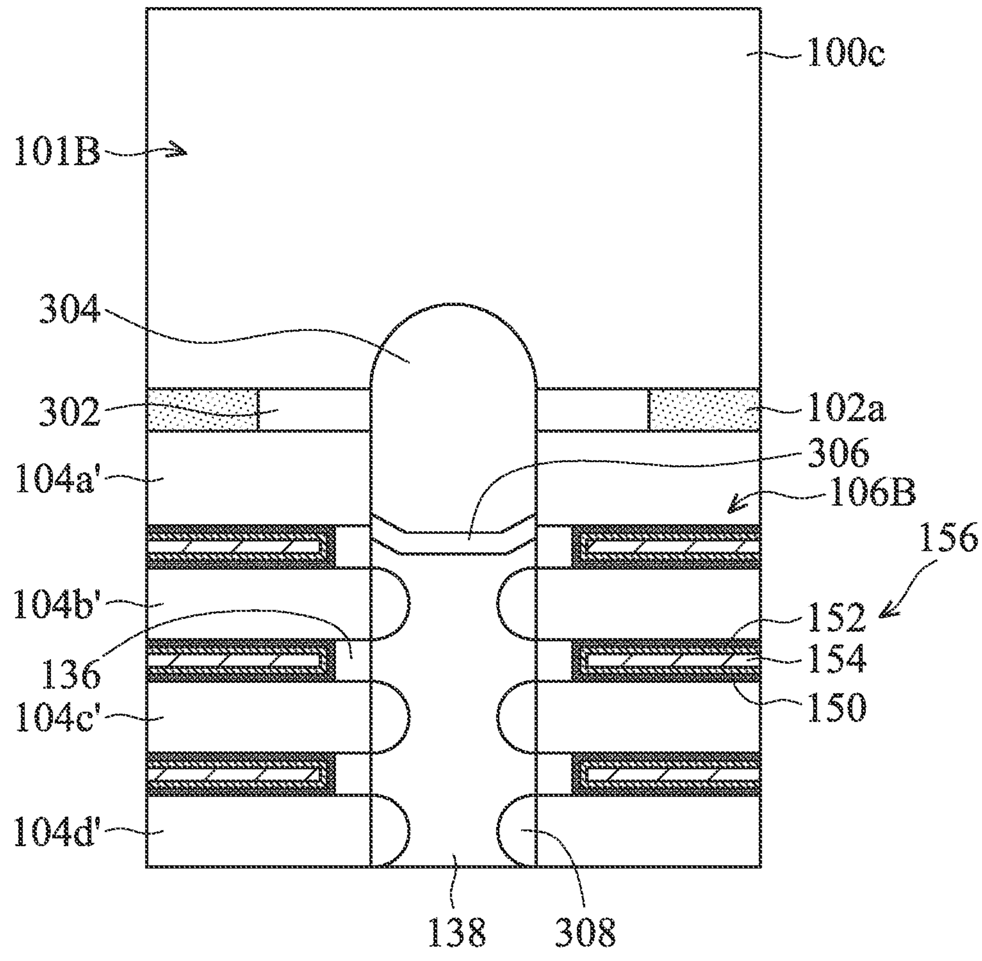

As shown in FIG. 3M, the semiconductor layers 100*a* and 100*b* of the semiconductor substrate 100 are removed, in accordance with some embodiments. As a result, the semiconductor fin 101B that is laterally surrounded by the isolation structure 115 is exposed. The semiconductor layers 100*a* and 100*b* may be removed using a planarization process. The planarization process may include a CMP process, a grinding process, an etching process, a dry polishing process, another applicable process, or a combination thereof.

Figure 3N:
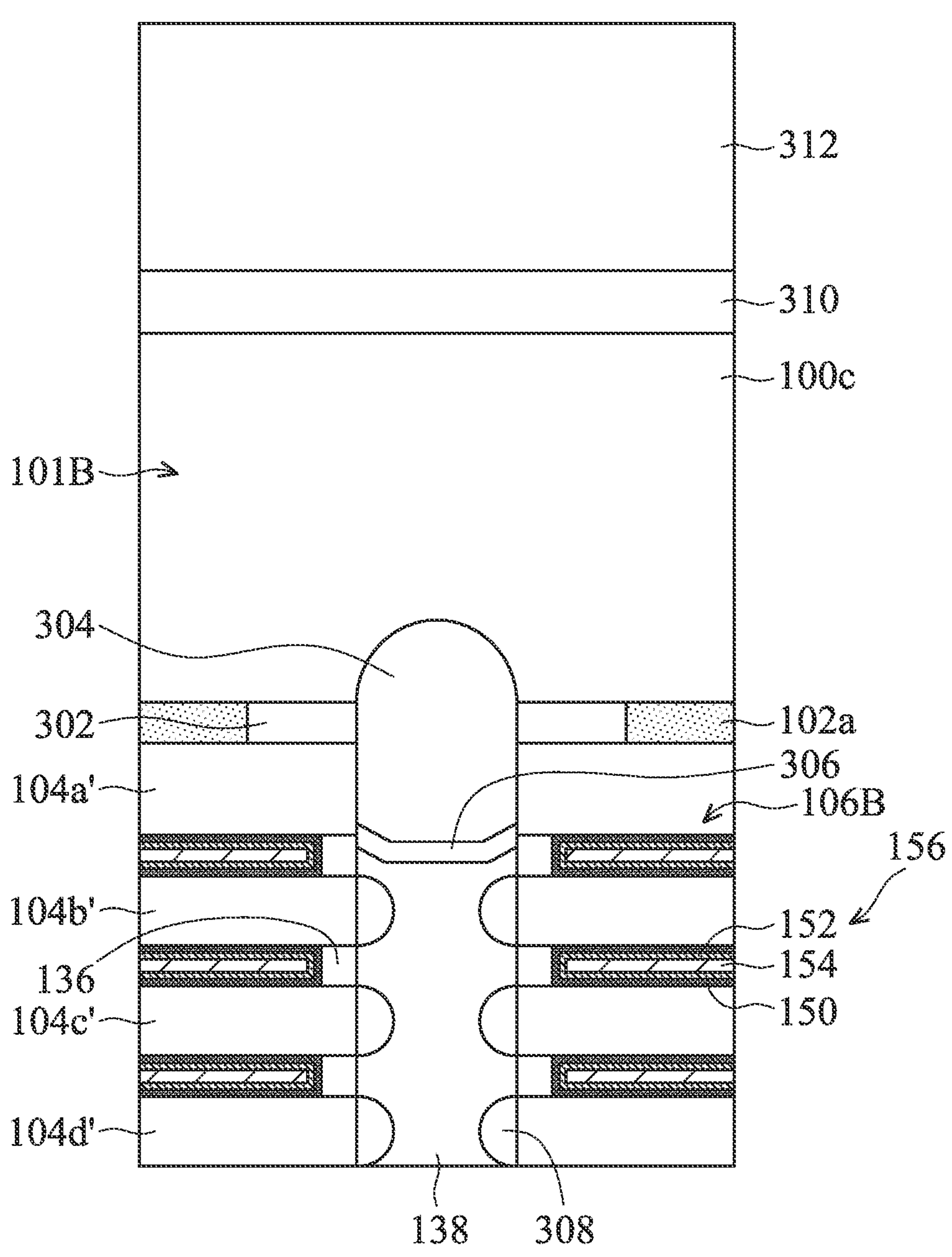

As shown in FIG. 3N, mask layers 310 and 312 are sequentially formed over the semiconductor fin 101B, in accordance with some embodiments. The mask layer 310 may be made of or include silicon nitride, silicon oxynitride, another suitable material, or a combination thereof. The mask layer 312 may be made of or include silicon oxide or another suitable material.

Figure 3O:
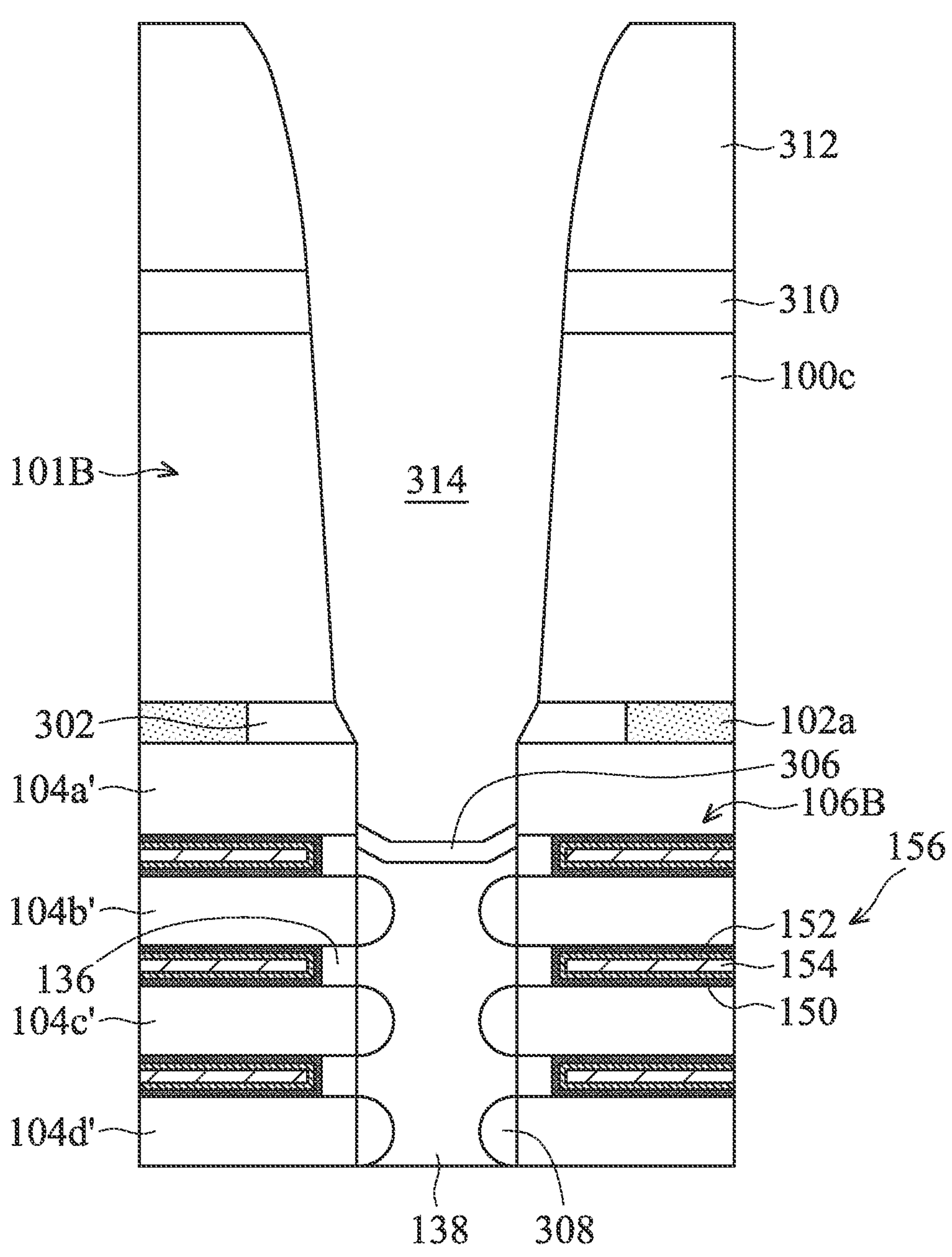

As shown in FIG. 3O, one or more photolithography processes and one or more etching processes are used to pattern the mask layers 310 and 312, in accordance with some embodiments. With the mask layers 310 and 312 as an etching mask, one or more etching processes are used to partially remove the semiconductor layer 100*c* of the semiconductor substrate 100 from the backside surface. As a result, a contact opening 314 that exposes the protective structures 302 and the sidewalls of the semiconductor nanostructures 104*a*' is formed, as shown in FIG. 3O. Due to the protective structures 302, the contact opening 314 may be self-aligned with the doped epitaxial portion 138. In some embodiments, the contact opening 314 is wider than the doped epitaxial portion 138.

In some embodiments, during the etching process for forming the contact opening 314, the un-doped epitaxial portion 304 is also removed. As a result, the bottom isolation element 306 that may function as a stop layer is also exposed by the contact opening 314.

Figure 3P:
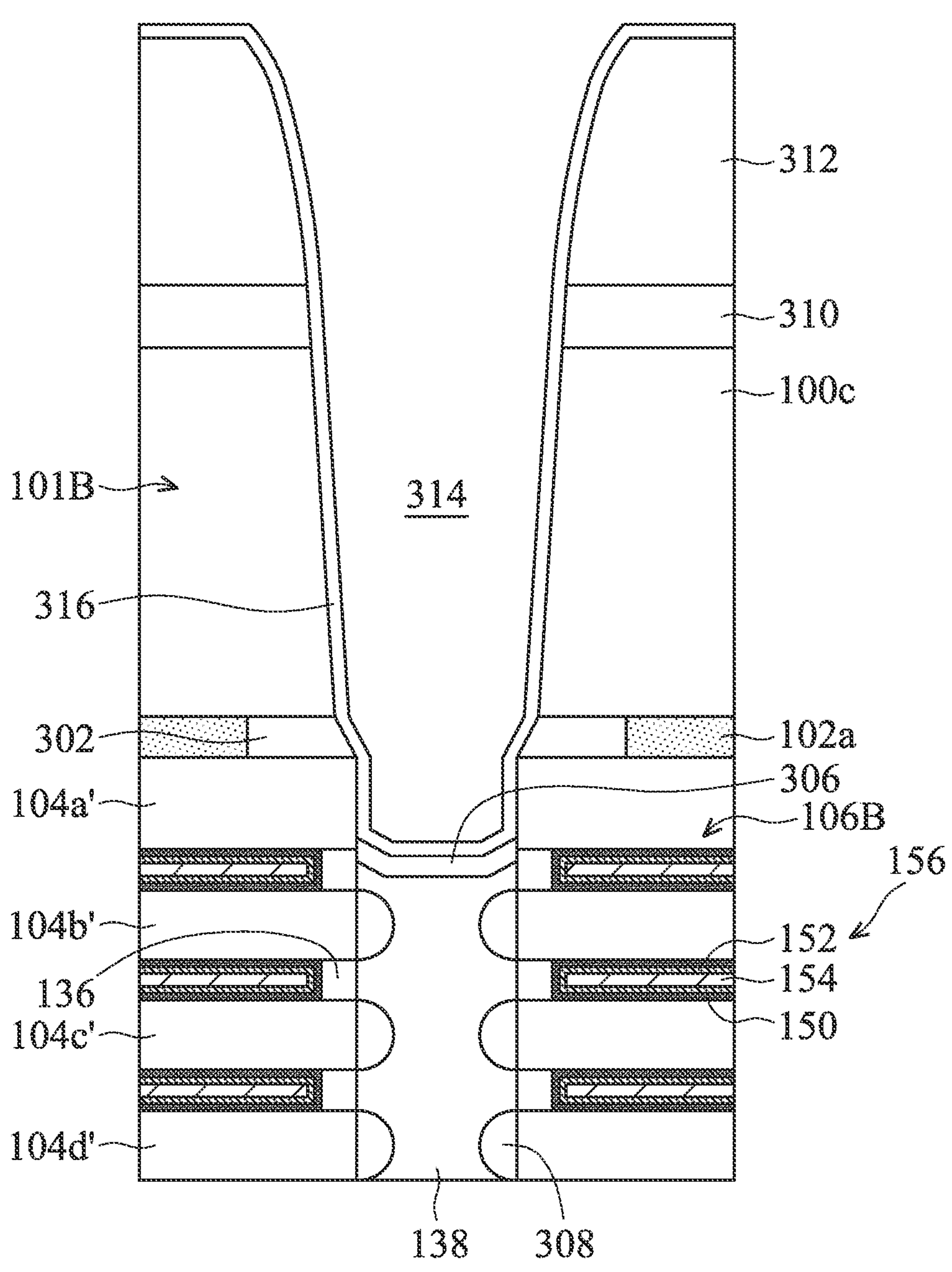

As shown in FIG. 3P, a dielectric layer 316 is deposited over the structure shown in FIG. 3O, in accordance with some embodiments. The dielectric layer 316 extends along the sidewalls and bottom of the contact opening 314. In some embodiments, the dielectric layer 316 is in direct contact with the semiconductor fin 101B, the protective structures 302, and the semiconductor nanostructures 104'.

In some embodiments, the dielectric layer 316 is substantially free of oxygen. The dielectric layer 316 may be made of or include silicon nitride, carbon-containing silicon nitride, another suitable material, or a combination thereof. However, embodiments of the disclosure have many variations. In some other embodiments, the dielectric layer 316 contains oxygen. For example, the dielectric layer 316 is made of or includes silicon oxynitride, carbon-containing silicon oxynitride, another suitable material, or a combination thereof. The dielectric layer 316 may be deposited using a CVD process, an ALD process, another applicable process, or a combination thereof.

Figure 3Q:
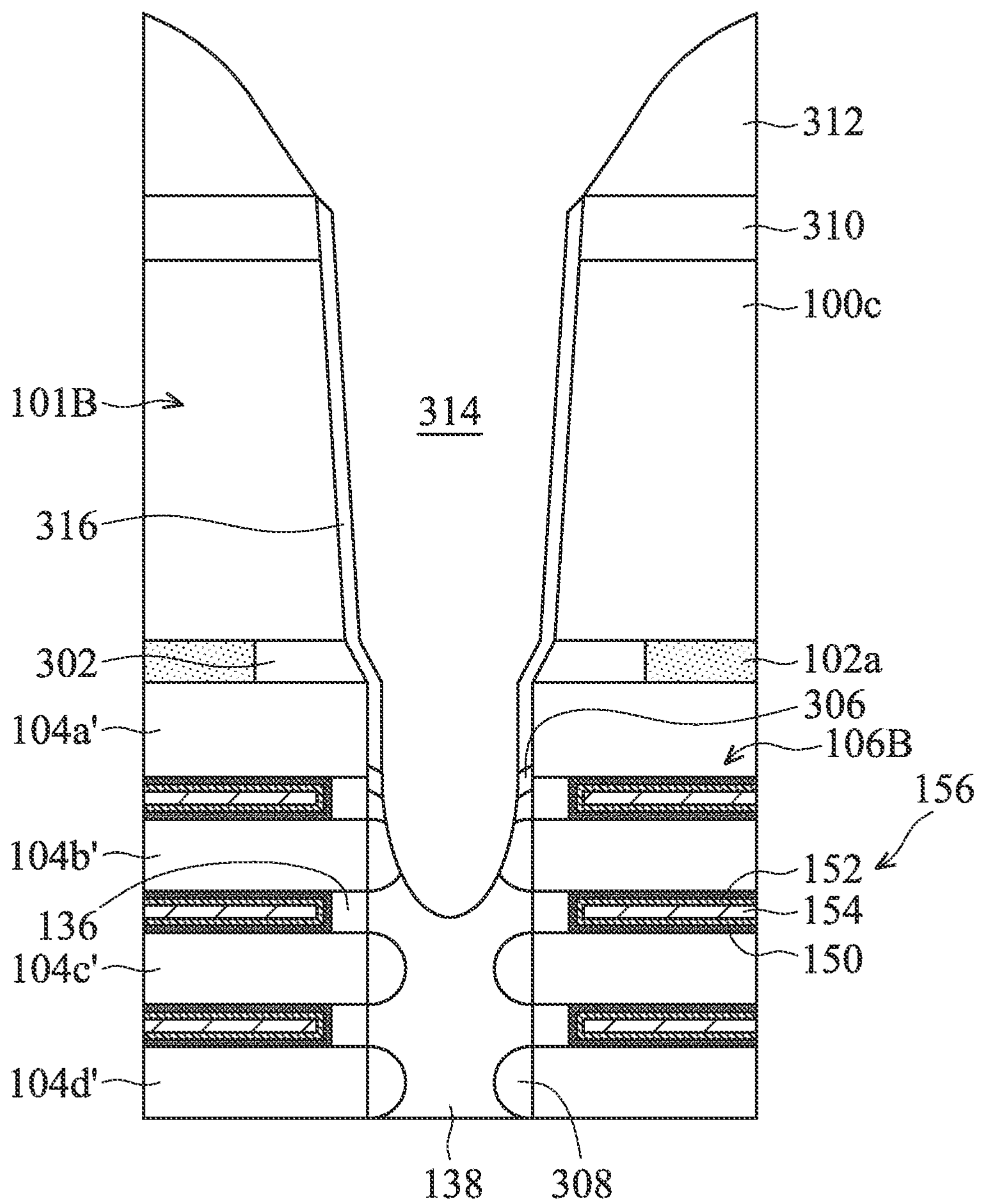

As shown in FIG. 3Q, the dielectric layer 316, the bottom isolation element 306, and the doped epitaxial portion 138 are partially removed, in accordance with some embodiments. As a result, the contact opening 314 is deepened. One or more etching processes may be used to deepen the contact opening 314.

Afterwards, a cleaning operation is performed to clean the exposed surface of the doped epitaxial portion 138 before a subsequent formation of metal-semiconductor compound elements on the doped epitaxial portion 138.

Figure 3R:
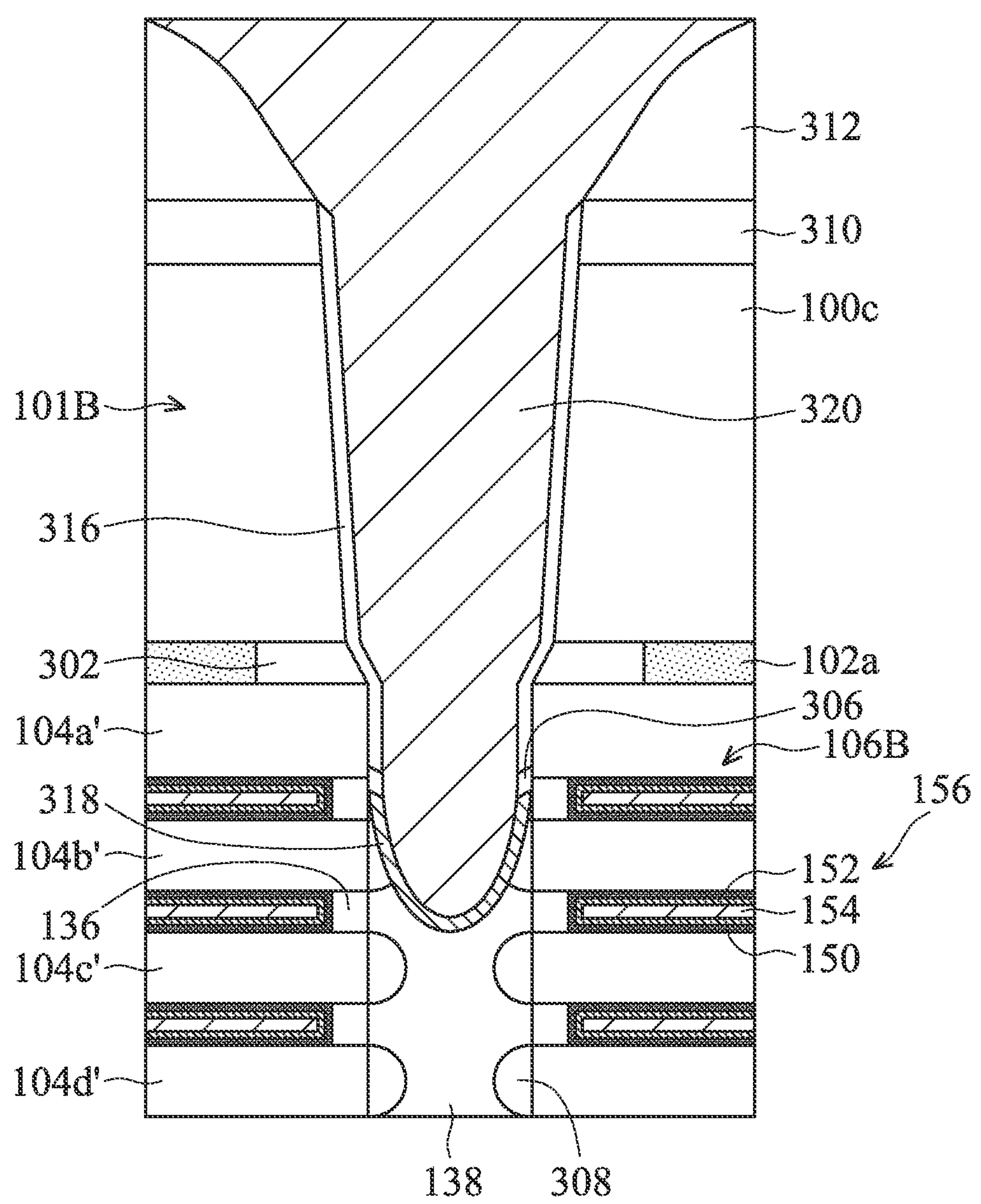

As shown in FIG. 3R, a metal-semiconductor compound element 318 is formed on the exposed surface of the doped epitaxial portion 138, in accordance with some embodiments. In some embodiments, before the formation of the metal-semiconductor compound element 318, the exposed doped epitaxial portion 138 is modified to assist in the subsequent formation of the metal-semiconductor compound element 318. In some embodiments, one or more ion implantation processes are used to reduce the crystallinity of the surface portion of the doped epitaxial portion 138, which allows a subsequently deposited metal material to react with the modified surface portions more easily. The formation of the metal-semiconductor compound element 318 may thus be facilitated.

In some embodiments, the implantation process is a plasma doping process. Plasma may be introduced into the contact opening 314 to modify the exposed surface portions of the doped epitaxial portion 138. In some embodiments, reaction gas used in the implantation process includes silicon-containing gas, germanium-containing gas, argon-containing gas, helium-containing gas, another suitable gas, or a combination thereof.

In some embodiments, a thermal operation is performed after a metal-containing material is applied (or deposited) on the doped epitaxial portion 138. In some other embodiments, a metal-containing material is applied (or deposited) on the doped epitaxial portion 138 while the doped epitaxial portion 138 is heated. In some embodiments, the metal-containing material is applied (or deposited) using a CVD process, an ALD process, or a combination thereof.

Due to the thermal operation, the thermal energy may help to initiate chemical reaction between the surface portion of the doped epitaxial portion 138 and the metal-containing material. As a result, the surface portion of the doped epitaxial portion 138 reacts with the metal-containing material, and they are transformed into the metal-semiconductor compound element 318.

The metal-semiconductor compound element 318 may be made of or include a metal silicide material, a silicon-germanium-metal-containing material, a germanium-metal-containing material, another suitable material, or a combination thereof. For example, the metal-semiconductor compound element 318 include TiSi, MoSi, RuSi, ZrSi, another suitable material, or a combination thereof.

In some embodiments, during the thermal operation, the doped epitaxial portion 138 are heated to a temperature that is in a range from about 390 degrees C. to about 440 degrees C. In some other embodiments, before the metal-containing material is applied (or deposited) on the doped epitaxial portion 138, the doped epitaxial portion 138 are heated to be at a raised temperature. Afterwards, the doped epitaxial portion 138 are kept at the raised temperature while the metal-containing material is applied (or deposited). The raised temperature may be in a range from about 390 degrees C. to about 440 degrees C.

In some embodiments, while applying or depositing the metal-containing material for forming the metal-semiconductor compound element 318, the metal-containing material is also applied (or deposited) on sidewalls the contact opening 314 to form a metal layer. The metal layers may be made of or include titanium, cobalt, ruthenium, molybdenum, nickel, tantalum, tungsten, platinum, another suitable material, or a combination thereof. In some embodiments, after the formation of the metal-semiconductor compound element 318, the portions of the metal layers that are not react with the doped epitaxial portion 138 are removed. One or more etching processes may be used to remove the metal layer.

However, embodiments of the disclosure are not limited thereto. Many variations and/or modifications can be made to embodiments of the disclosure. In some other embodiments, the metal-semiconductor compound element 318 are not formed.

Afterwards, a conductive layer 320 is deposited over the metal-semiconductor compound element 318 to overfill the contact opening 314, as shown in FIG. 3R in accordance with some embodiments. The conductive layer 320 may be made of or include tungsten, ruthenium, molybdenum, cobalt, titanium, tantalum, tungsten, another suitable material, or a combination thereof. The conductive layer 320 may be deposited using an ALD process, a CVD process, a PVD process, an electroplating process, an electrochemical plating process, another applicable process, or a combination thereof.

Figure 3S:
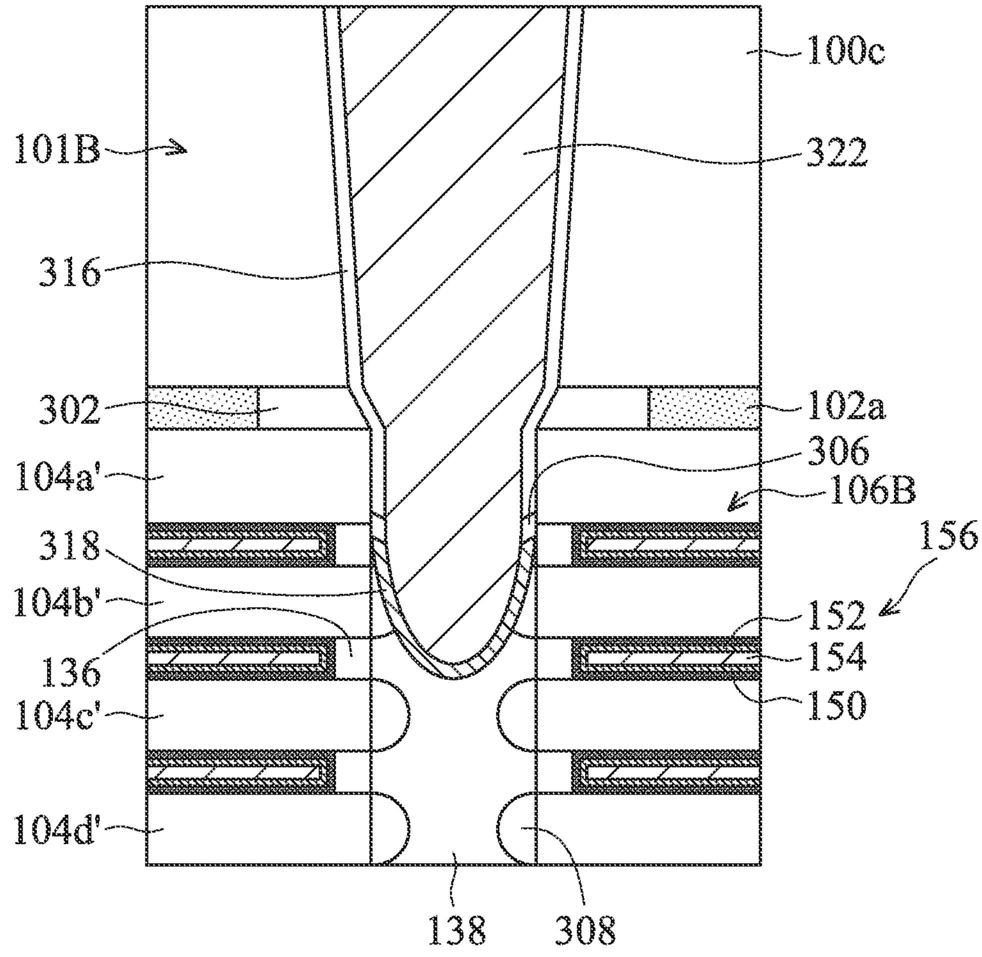
Figure 3T:
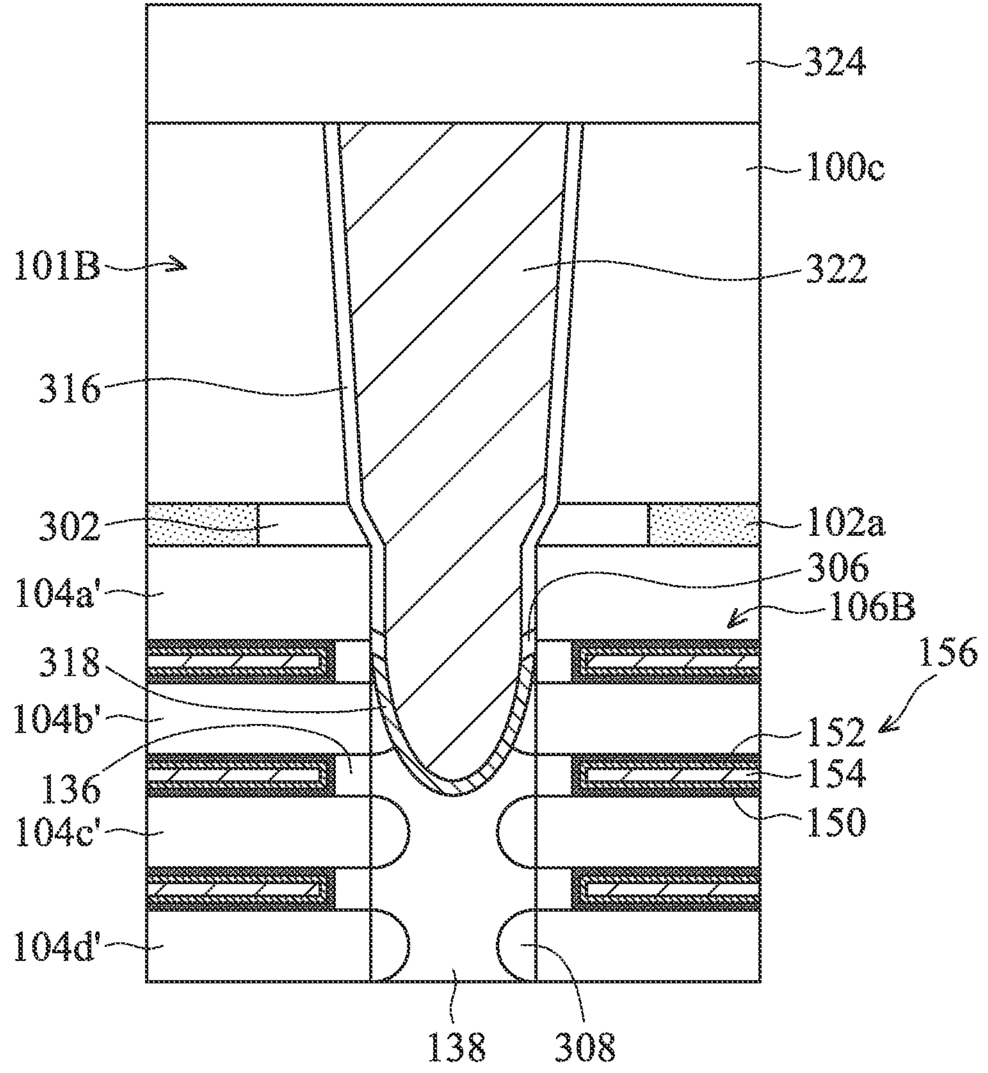

As shown in FIG. 3S, a planarization process is used to remove the conductive layer 320 outside of the contact opening 314, in accordance with some embodiments. As a result, the remaining portions of the conductive layer 320 in the contact opening 314 form a backside conductive contact 322, as shown in FIG. 3S. In some embodiments, the mask layers 310 and 312 are also removed during the planarization process. The planarization process mentioned above may include a CMP process, a grinding process, an etching process, a dry polishing process, another applicable process, or a combination thereof.

In some embodiments, the backside conductive contact 322 is electrically connected to the doped epitaxial portion 138. In some embodiments, the backside conductive contact 322 extends across the opposite surfaces of the protective structures 302 and the opposite surfaces of the semiconductor nanostructures 104*a*', as shown in FIG. 3S.

As shown in FIG. 3T, a backside interconnection structure 324 is formed over the semiconductor fin 101B and the backside conductive contact 322, in accordance with some embodiments. The backside interconnection structure 324 includes multiple dielectric layers and multiple conductive features. The conductive features may include conductive vias and conductive lines. The backside interconnection structure 324 may be used to form electrical connection between various backside conductive contacts and various devices. The formation of the interconnection structure may include multiple deposition processes, multiple patterning processes, and multiple planarization processes.

Figure 4:
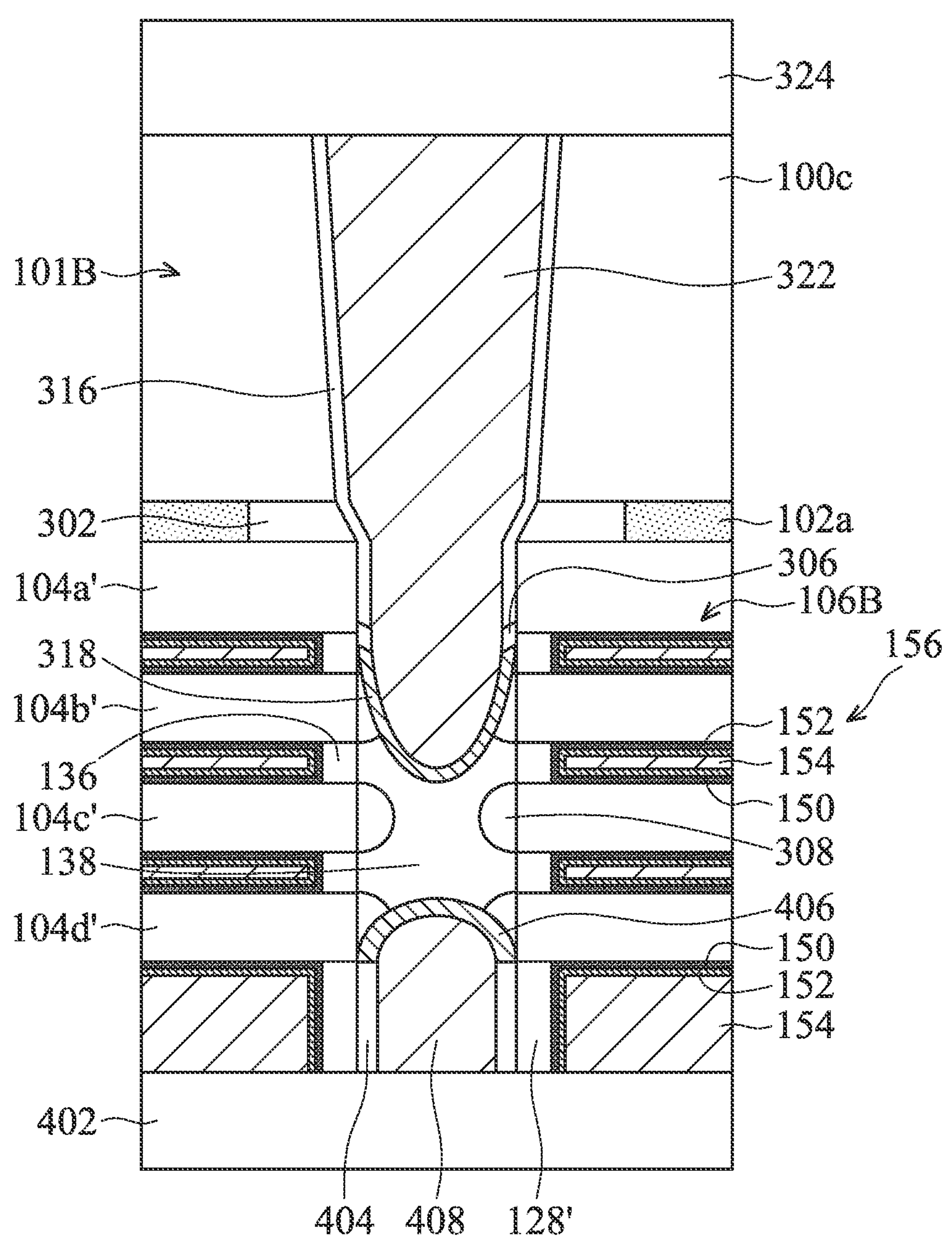
FIG. 4 is a cross-sectional view of a stage of a process for forming a portion of a semiconductor device structure, in accordance with some embodiments.

FIG. 4 is a cross-sectional view of a stage of a process for forming a portion of a semiconductor device structure, in accordance with some embodiments. FIG. 4 shows a semiconductor device structure that is similar to that shown in FIG. 3T. The upper portions of the metal gate stacks 156, the dielectric layer 140, and a frontside interconnection structure 402 are also shown in FIG. 4. In some embodiments, a frontside conductive contact 408 is formed. The frontside conductive contact 408 may be electrically connected to the epitaxial structure 138. In some embodiments, a metal-semiconductor compound element 406 is formed between the frontside conductive contact 408 and the epitaxial structure 138. A dielectric layer 404 may be formed between the frontside conductive contact 408 and the gate spacer 128'.

The frontside interconnection structure 402 includes multiple dielectric layers and multiple conductive features. The conductive features may include conductive vias and conductive lines. The frontside interconnection structure 402 may be used to form electrical connection between various frontside conductive contacts and various devices. The formation of the interconnection structure may include multiple deposition processes, multiple patterning processes, and multiple planarization processes. In some embodiments, the average line width of the conductive features in the backside interconnection structure 324 is greater than the average line width of the conductive features in the frontside interconnection structure 402.

As shown in FIGS. 3T and 4, in some embodiments, the backside conductive contact 322 is separated from the metal gate stacks 156 by the protective structures 302. Short circuiting between the backside conductive contact 322 and the metal gate stacks 156 is significantly reduced. Due to the protective structures 302, it is not necessary to form a narrow backside conductive contact to prevent the short circuiting between the backside conductive contact 322 and the metal gate stacks 156. As shown in FIGS. 3T and 4, the backside conductive contact 322 is wider than the doped epitaxial portion 138. The backside conductive contact 322 that is wider thus has a better conductivity. The performance and reliability of the semiconductor device structure are greatly improved.

Figure 5A:
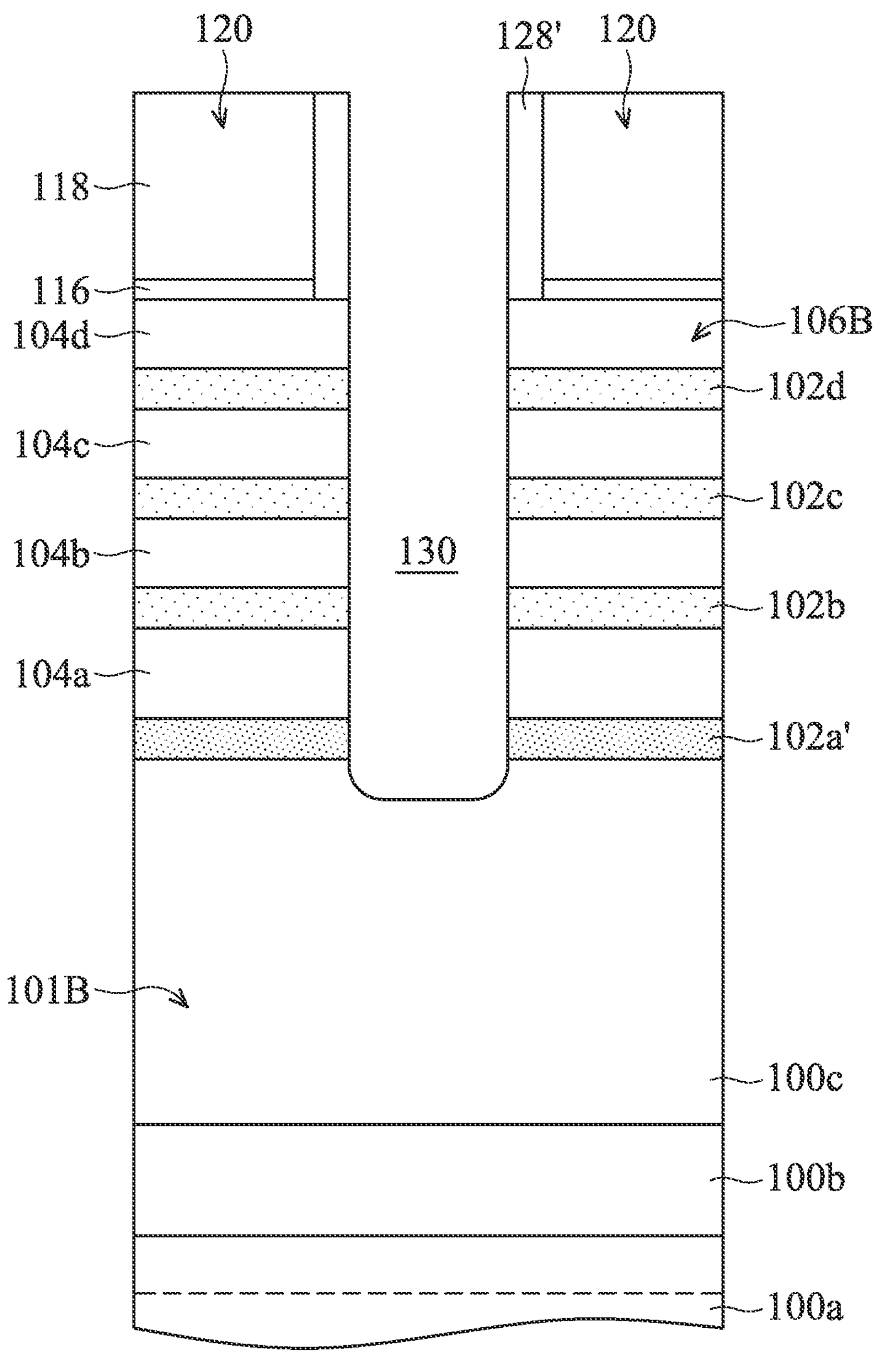
FIGS. 5A-5E are cross-sectional views of various stages of a process for forming a portion of a semiconductor device structure, in accordance with some embodiments.

Many variations and/or modifications can be made to embodiments of the disclosure. FIGS. 5A-5E are cross-sectional views of various stages of a process for forming a portion of a semiconductor device structure, in accordance with some embodiments. As shown in FIG. 5A, a structure that is similar to the structure shown in FIG. 3C is formed. The processes that are similar to those illustrated in FIGS. 3A-3C may be used to form the structure shown in FIG. 5A. In some embodiments, the semiconductor layer 102*a*' has a higher atomic concentration of germanium than that of the semiconductor layer 102*a* shown in FIG. 3C.

Figure 5B:
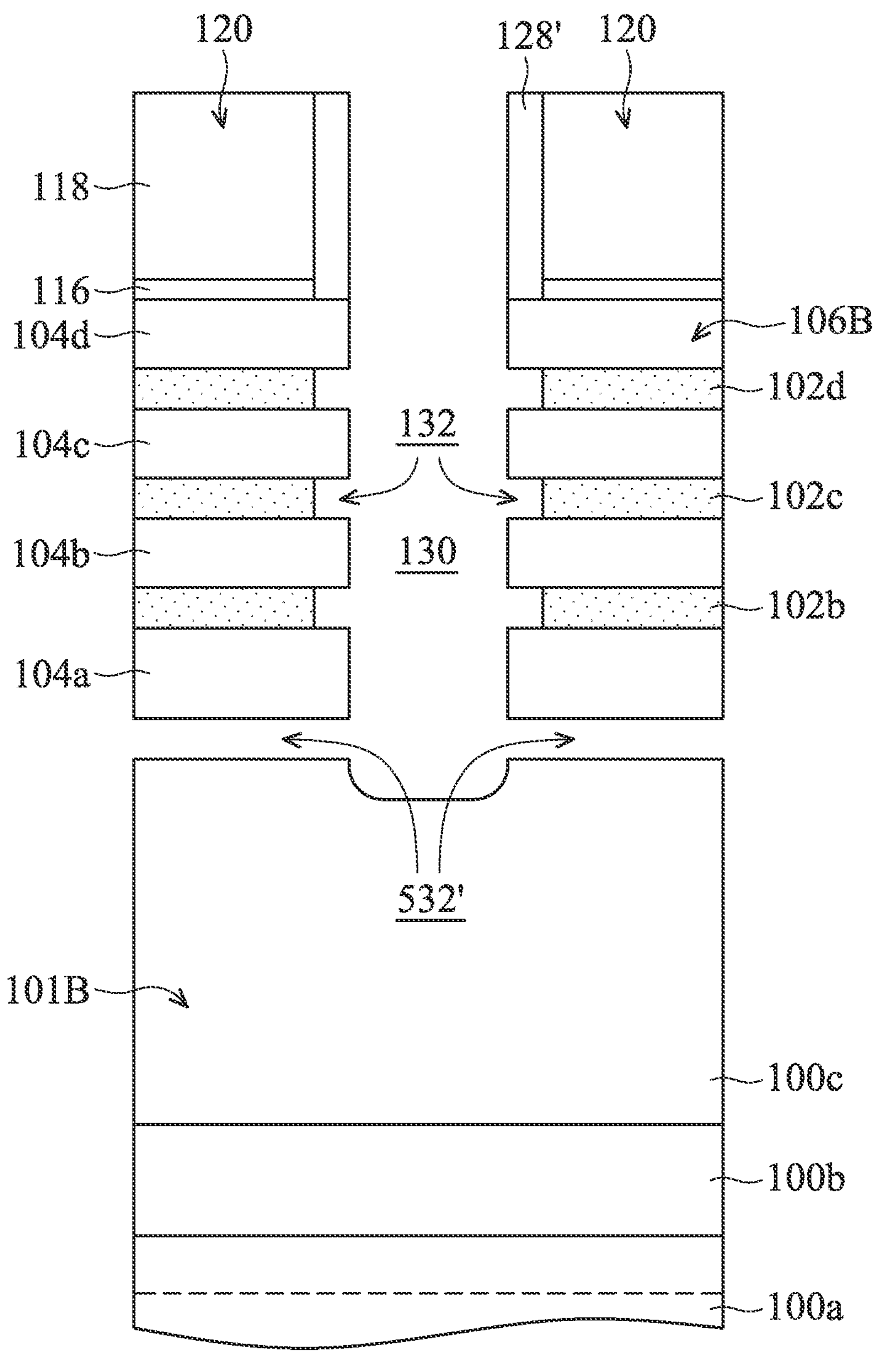

As shown in FIG. 5B, the semiconductor layers 102*a*' and 102*b*-102*d* are laterally etched, in accordance with some embodiments. As a result, the edges of the semiconductor layers 102*b*-102*d* retreat from the edges of the semiconductor layers 104*a*-104*d*. In some embodiments, the semiconductor layer 102*a*' is completely removed. As shown in FIG. 5B, recesses 132 and 532' are simultaneously formed due to the lateral etching of the semiconductor layers 102*a*' and 102*b*-102*d*, in accordance with some embodiments. The recesses 132 may be used to contain inner spacers that will be formed later. The recesses 532' may be used to contain protective structures that will be formed later.

In some embodiments, each of the recesses 532' is deeper than each of the recesses 132. In some embodiments, the semiconductor layer 102*a*' has a higher atomic concentration of germanium than that of the semiconductor layers 102*b*-102*d*. Therefore, during the lateral etching of the semiconductor layers 102*a*' and 102*b*-102*d*, the semiconductor layer 102*a*' is lateral etched at a higher etching rate than the semiconductor layers 102*b*-102*d*. As a result, the recesses 532' that are deeper than the recesses 132 are formed.

Figure 5C:
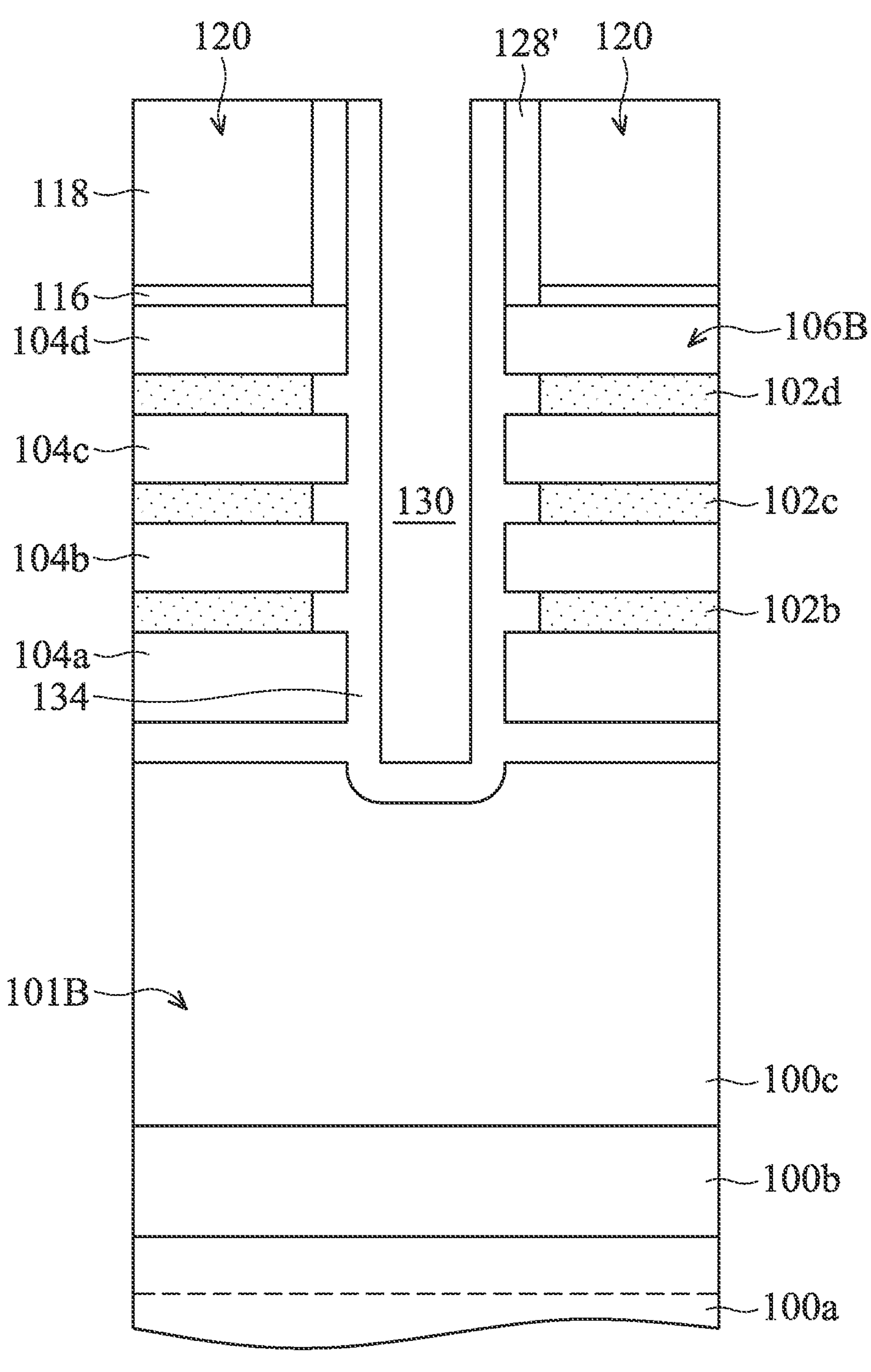

As shown in FIG. 5C, similar to the embodiments illustrated in FIG. 3E, the insulating layer 134 is deposited, in accordance with some embodiments. The insulating layer 134 overfills the recesses 132 and 532'. In some embodiments, the insulating layer 134 completely fills the recesses 532'.

Figure 5D:
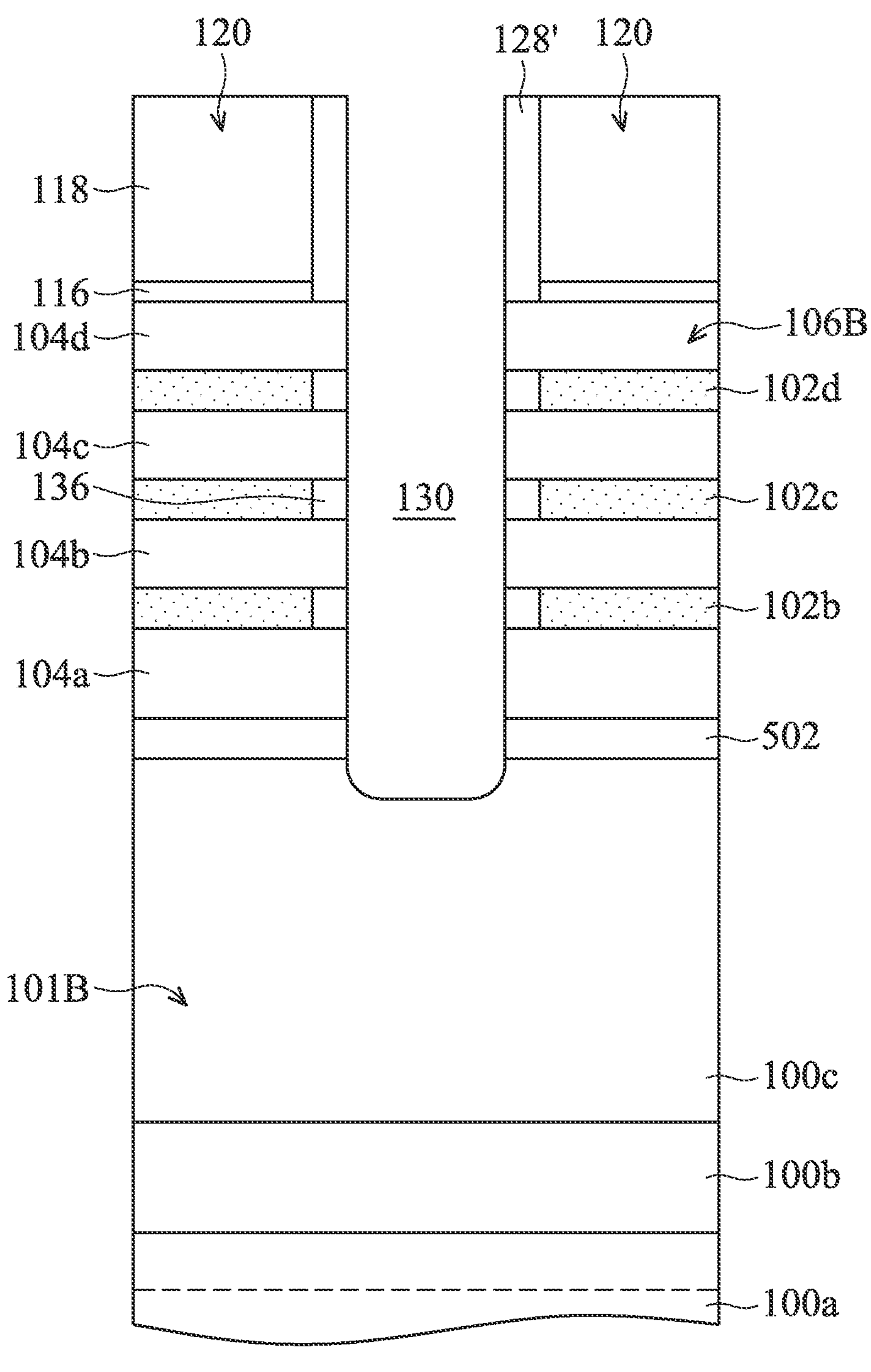

As shown in FIG. 5D, an etching process is used to partially remove the insulating layer 134, in accordance with some embodiments. The portions of the insulating layer 134 outside of the recesses 132 may be removed. The remaining portions of the insulating layer 134 in the recesses 132 form inner spacers 136. The remaining portions of the insulating layer 134 in the recesses 532' form protective structures 502. The etching process may include a dry etching process, a wet etching process, or a combination thereof.

In some embodiments, each of the protective structures 502 is wider than each of the inner spacers 136, as shown in FIG. 5D. In some embodiments, since the protective structures 502 and the inner spacers 136 are portions of the same material layer (i.e., the insulating layer 134), the protective structures 502 and the inner spacers 136 have the same composition.

Afterwards, processes that are the same as or similar to those illustrated in FIGS. 3G-3T may be performed. As a result, the structure shown in FIG. 5E is formed, in accordance with some embodiments.

Figure 6A:
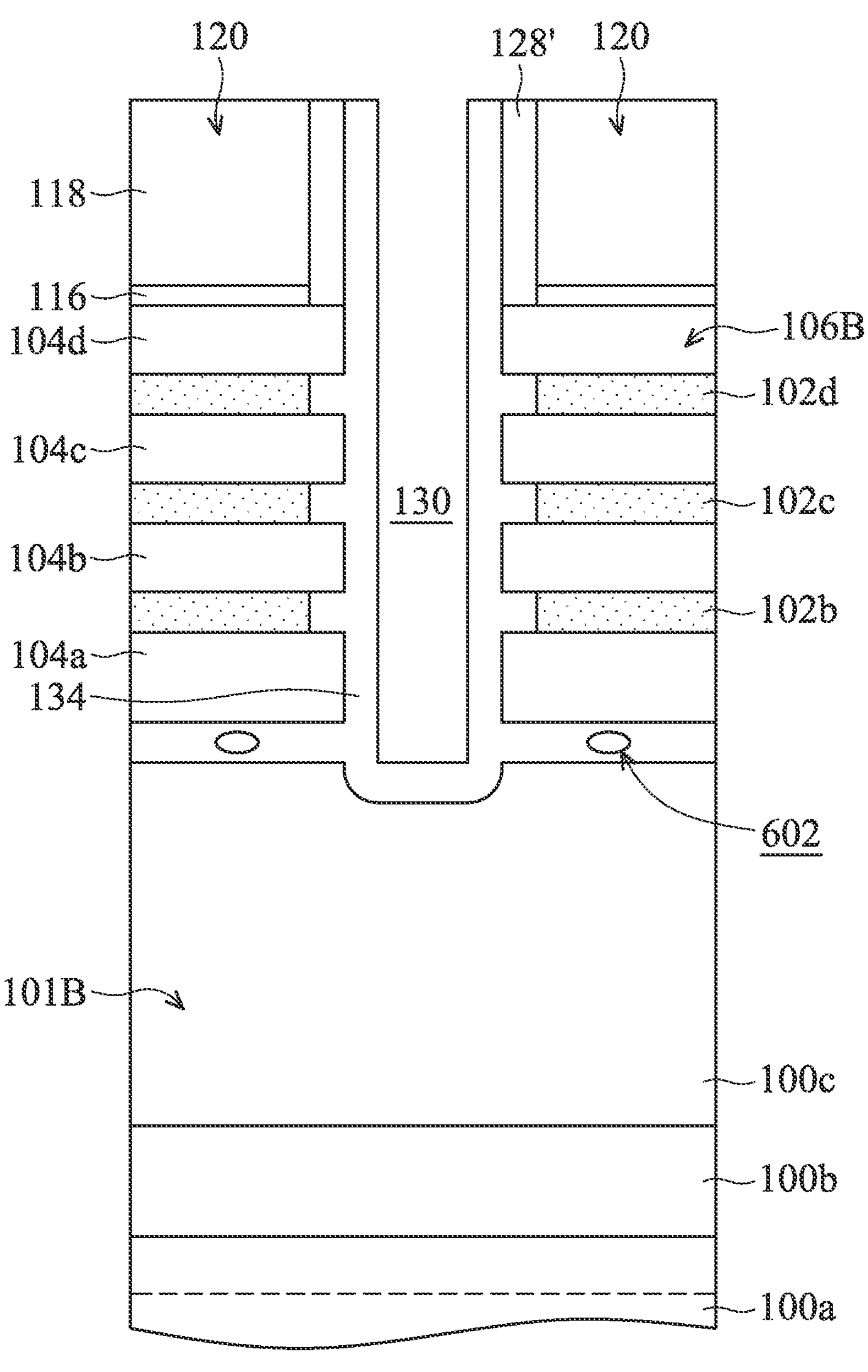
FIGS. 6A-6B are cross-sectional views of various stages of a process for forming a portion of a semiconductor device structure, in accordance with some embodiments.
Figure 6B:
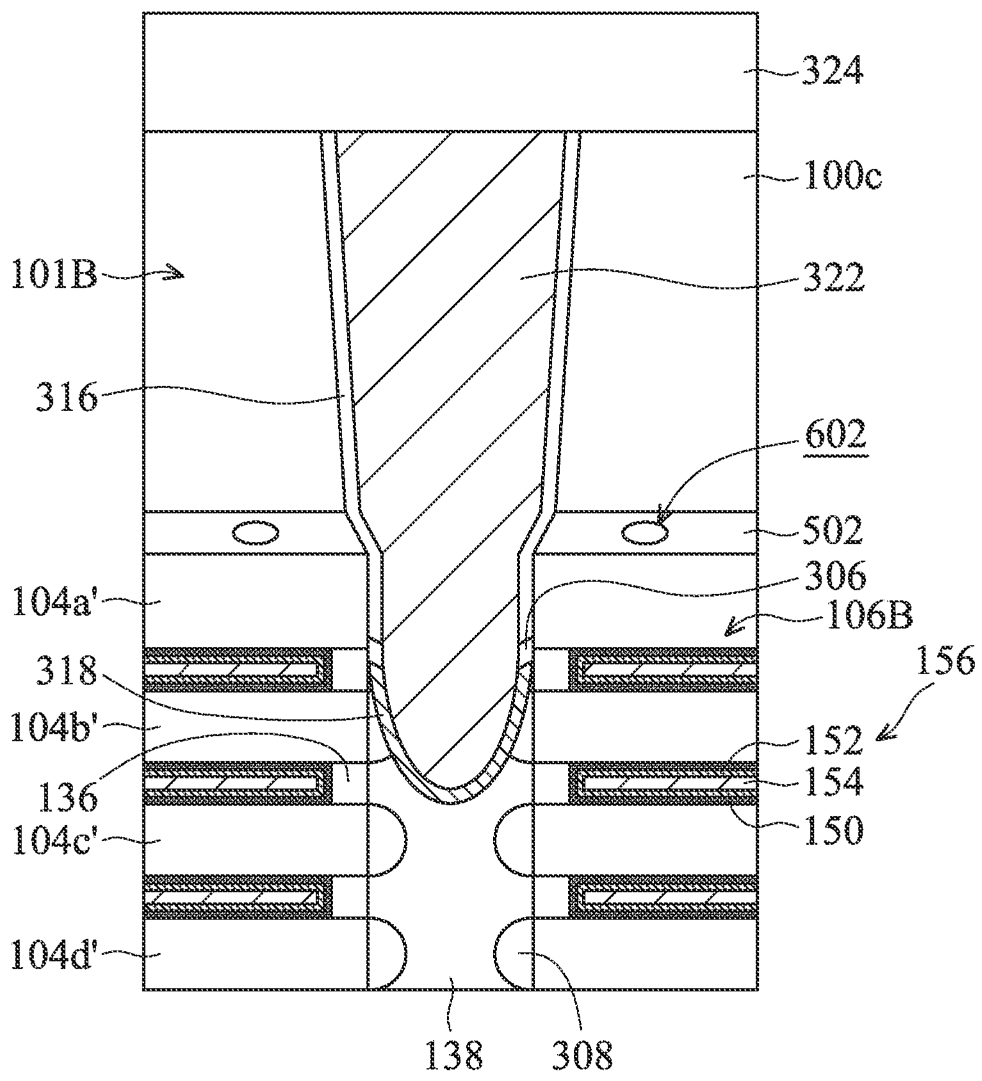

Many variations and/or modifications can be made to embodiments of the disclosure. FIGS. 6A-6B are cross-sectional views of various stages of a process for forming a portion of a semiconductor device structure, in accordance with some embodiments. As shown in FIG. 6A, a structure that is similar to the structure shown in FIG. 5C is formed. In some embodiments, the insulating layer 134 does not completely fill the recesses formed between the semiconductor fin 101B and the semiconductor layer 104*a*. In some embodiments, one or more voids 602 are formed in the insulating layer 134, as shown in FIG. 6A.

Figure 5E:
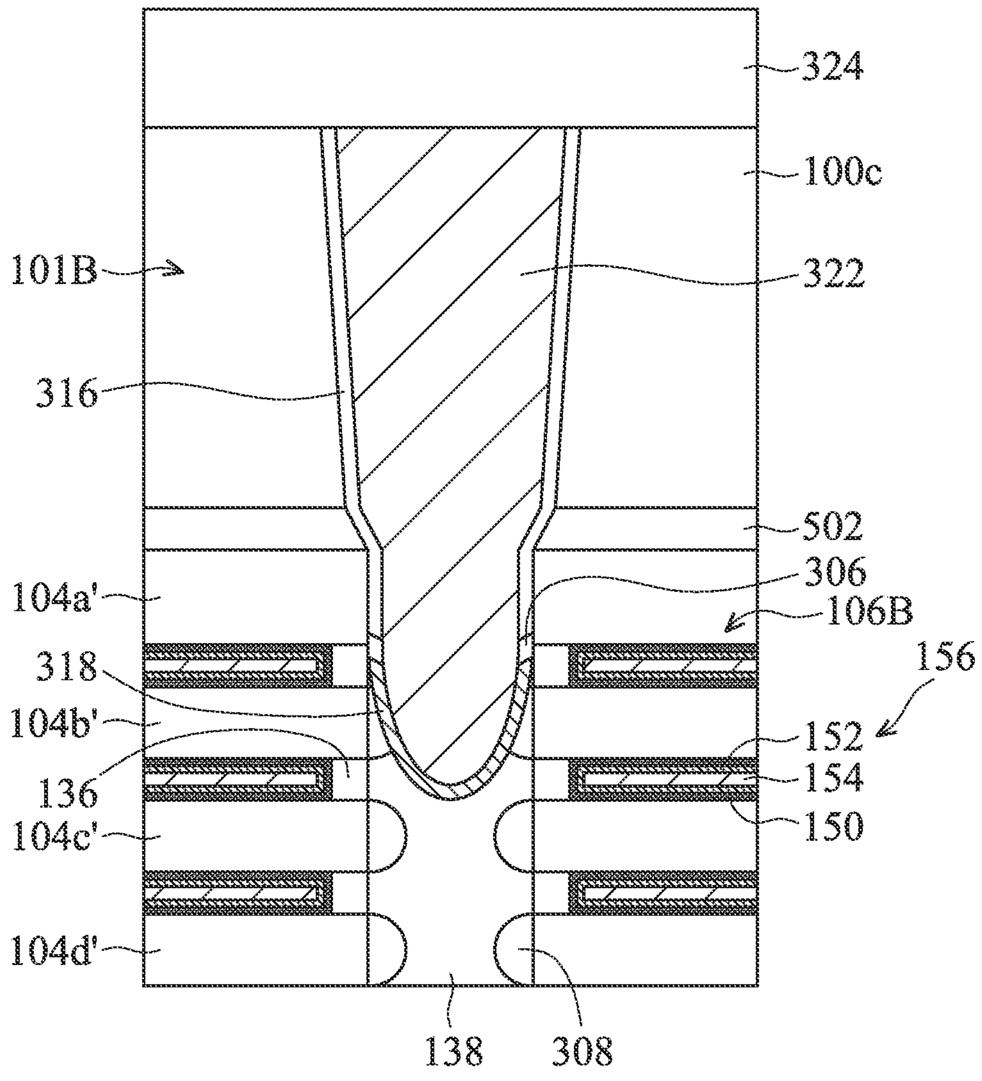

Afterwards, processes that are the same as or similar to those illustrated in FIGS. 5D-5E may be performed. As a result, the structure shown in FIG. 6B is formed, in accordance with some embodiments. In some embodiments, one or more voids 602 are formed in the protective structures 502.

Figure 7:
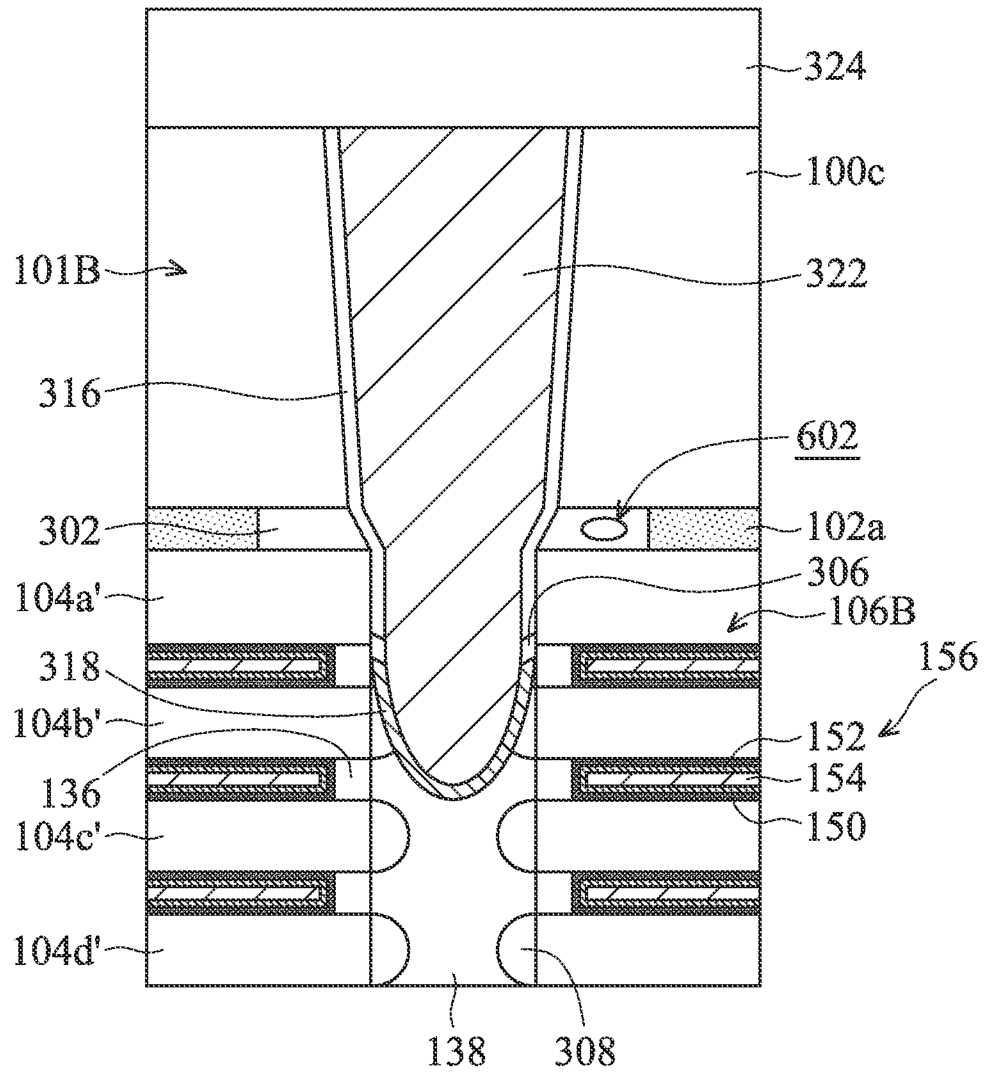
FIG. 7 is a cross-sectional view of a stage of a process for forming a portion of a semiconductor device structure, in accordance with some embodiments.

Many variations and/or modifications can be made to embodiments of the disclosure. FIG. 7 is a cross-sectional view of a stage of a process for forming a portion of a semiconductor device structure, in accordance with some embodiments. As shown in FIG. 7, a structure that is similar to the structure shown in FIG. 3T is formed. In some embodiments, the insulating layer used for forming the protective structure 302 does not completely fill the recesses that are used for containing the protective structures 302. In some embodiments, one or more voids 602 are formed in the protective structure 302, as shown in FIG. 7.

In some embodiments, each of the protective structures is wider than each of the inner spacers. However, embodiments of the disclosure are not limited thereto. In some other embodiments, each of the protective structures is substantially as wide as each of the inner spacers.

Figure 8:
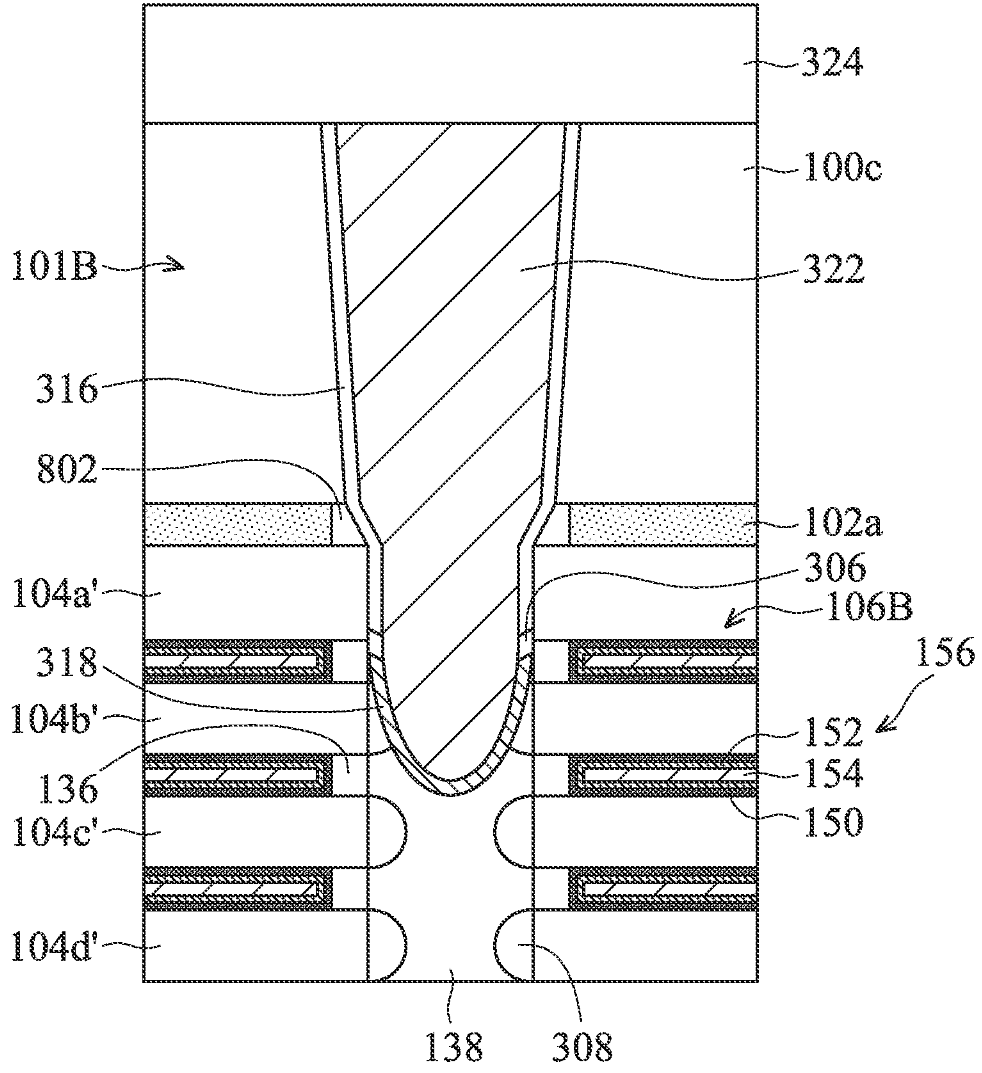
FIG. 8 is a cross-sectional view of a stage of a process for forming a portion of a semiconductor device structure, in accordance with some embodiments.

FIG. 8 is a cross-sectional view of a stage of a process for forming a portion of a semiconductor device structure, in accordance with some embodiments. In some embodiments, the atomic concentration of germanium of the semiconductor layer 102*a* is substantially equal to those of the semiconductor layers 102*b*-102*d*. Therefore, the recesses used for containing protective structures 802 are substantially as deep as the recesses used for containing the inner spacers 136. In some embodiments, each of the protective structures 802 is substantially as wide as each of the inner spacers 136.

In some embodiments, the protective structures and the inner spacers are formed from the same insulating layer. Therefore, the protective structures and the inner spacers are made of the same material. However, embodiments of the disclosure are not limited thereto. Many variations and/or modifications can be made to embodiments of the disclosure. In some other embodiments, the protective structures and the inner spacers are made of different materials.

Figure 9A:
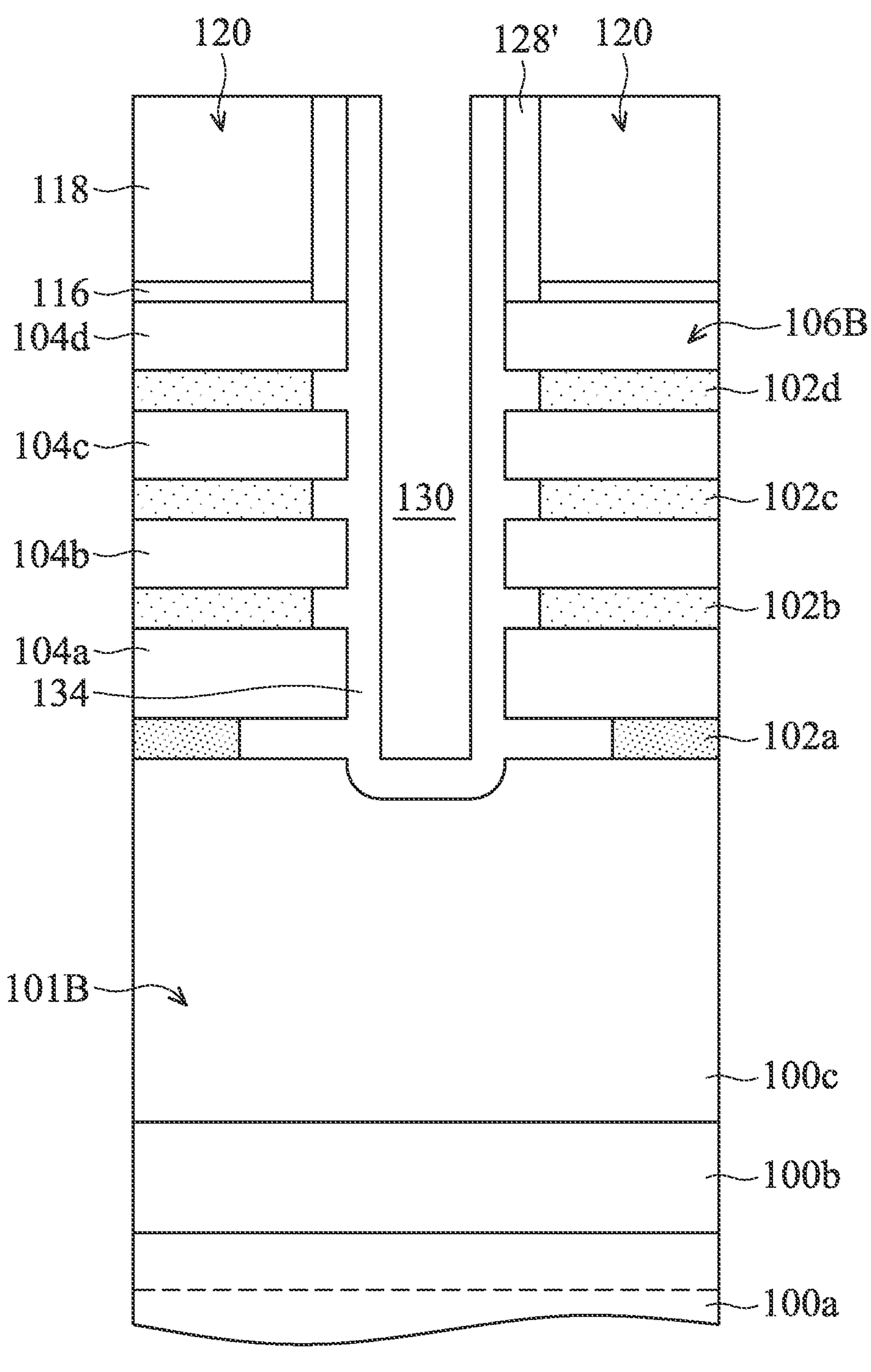
FIGS. 9A-9D are cross-sectional views of various stages of a process for forming a portion of a semiconductor device structure, in accordance with some embodiments.

FIGS. 9A-9D are cross-sectional views of various stages of a process for forming a portion of a semiconductor device structure, in accordance with some embodiments. As shown in FIG. 9A, a structure that is the same as or similar to the structure shown in FIG. 3E is formed.

Figure 9B:
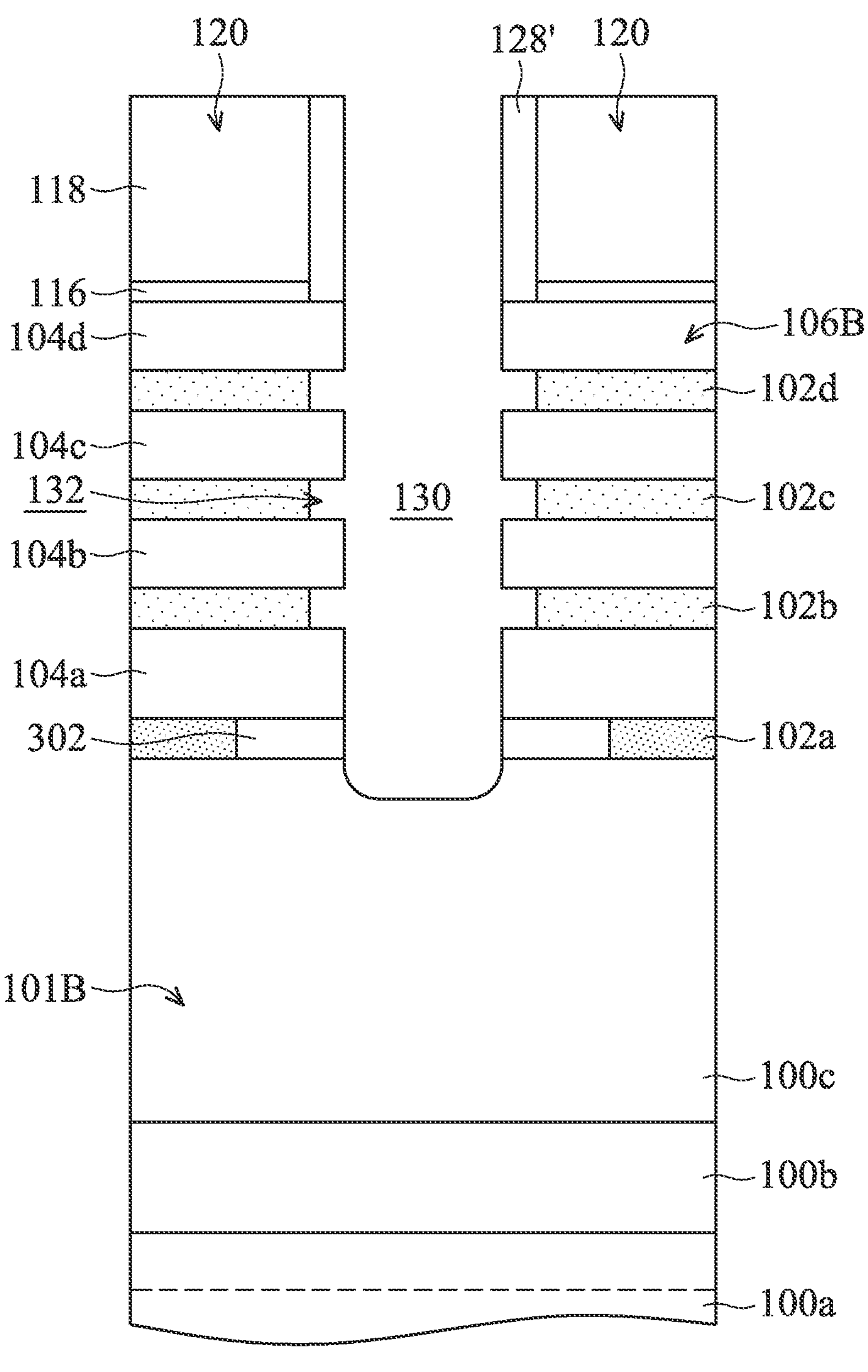

As shown in FIG. 9B, an etching process is used to partially remove the insulating layer 134, in accordance with some embodiments. The remaining portions of the insulating layer 134 form protective structures 302. The portions of the insulating layer 134 originally filling the recesses 132 may be partially or completely removed. In some embodiments, the semiconductor layers 102*b*-102*d* are exposed after the partial removal of the insulating layer 134.

Figure 9C:
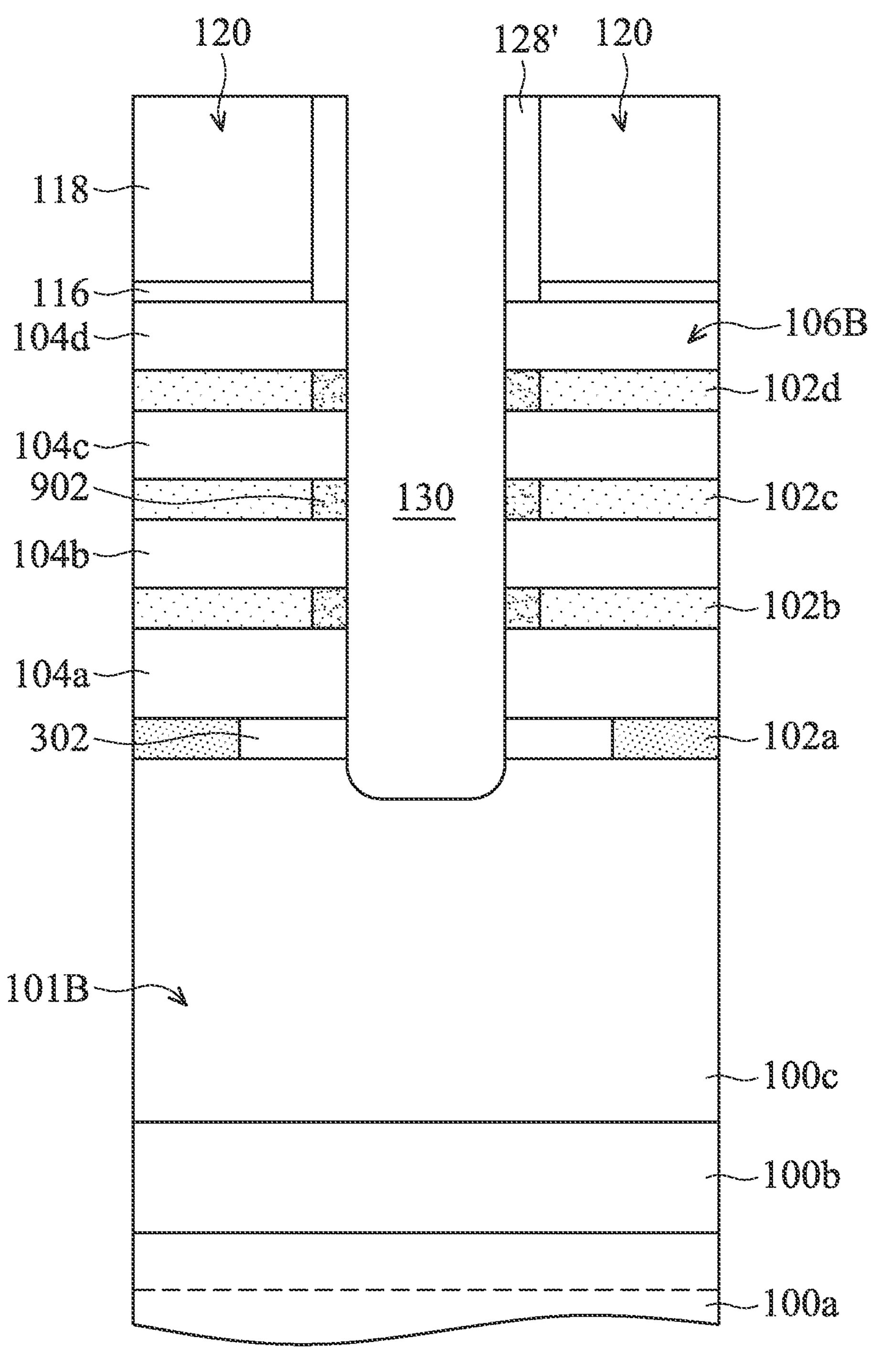

As shown in FIG. 9C, inner spacers 902 are formed in the recesses 132, in accordance with some embodiments. In some embodiments, the inner spacers 902 and the protective structures 302 are made of different material. In some embodiments, the inner spacers 902 have a lower dielectric constant than that of the protective structure 302. In some embodiments, the inner spacers 902 have a greater atomic concentration of carbon than that of the protective structures 302.

In some embodiments, similar to the embodiments illustrated in FIG. 3E, a second insulating layer is deposited to overfill the recesses 132. The second insulating layer and the insulating layer 134 are made of different materials. In some embodiments, the second insulating layer has a lower dielectric constant than that of the insulating layer 134. Afterwards, an etching process may be used to remove the portion of the second insulating layer that is outside of the recesses 132. As a result, the remaining portions of the second insulating layer form the inner spacers 902.

Figure 9D:
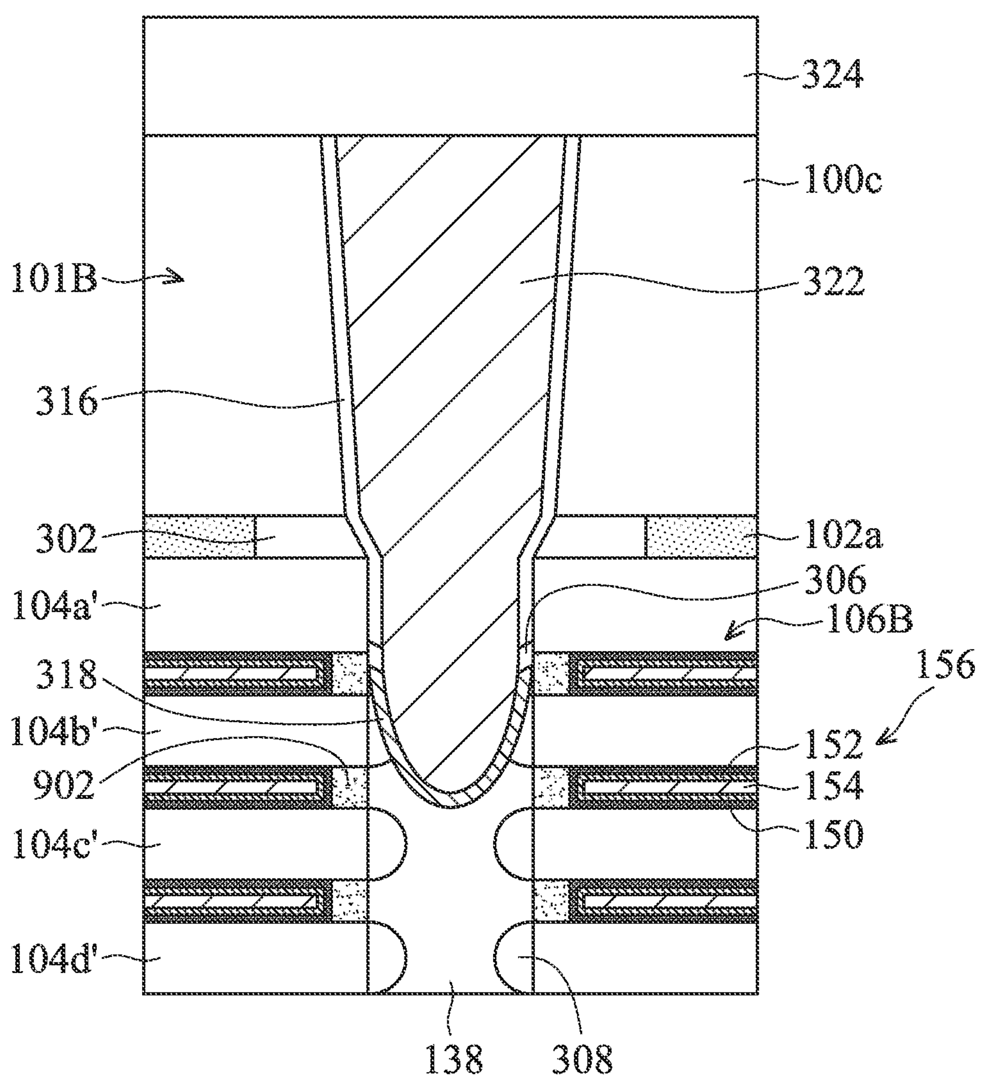

Afterwards, processes that are the same as or similar to those illustrated in FIGS. 3G-3T may be performed. As a result, the structure shown in FIG. 9D is formed, in accordance with some embodiments.

Many variations and/or modifications can be made to embodiments of the disclosure. In some other embodiments, the semiconductor fins are replaced with dielectric structures or thermal conductive structures. In some embodiments, the dielectric structures or thermal conductive structures have a high thermal conductivity.

Figure 10A:
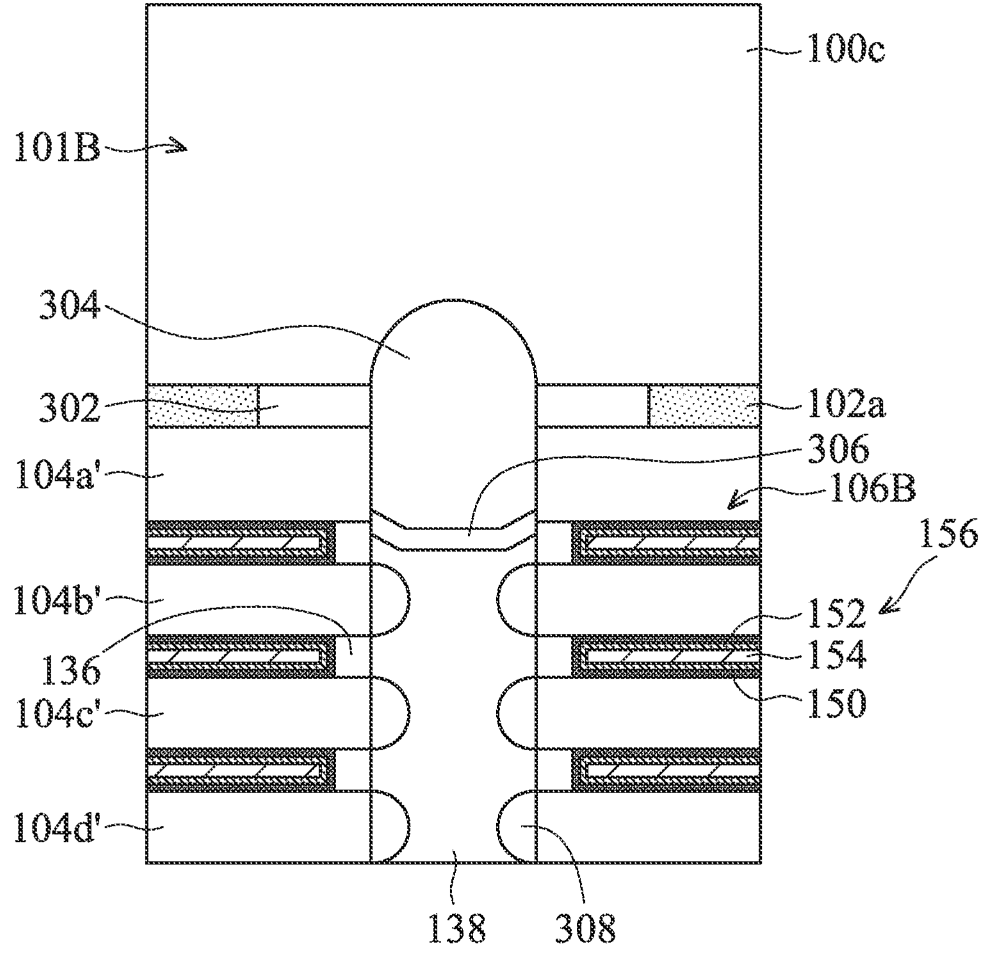
FIGS. 10A-10D are cross-sectional views of various stages of a process for forming a portion of a semiconductor device structure, in accordance with some embodiments.

FIGS. 10A-10D are cross-sectional views of various stages of a process for forming a portion of a semiconductor device structure, in accordance with some embodiments. As shown in FIG. 10A, a structure that is the same as or similar to the structure shown in FIG. 3M is formed. Referring to FIG. 2G, the semiconductor fin 101B is laterally surrounded by the isolation structure 115.

Figure 10B:
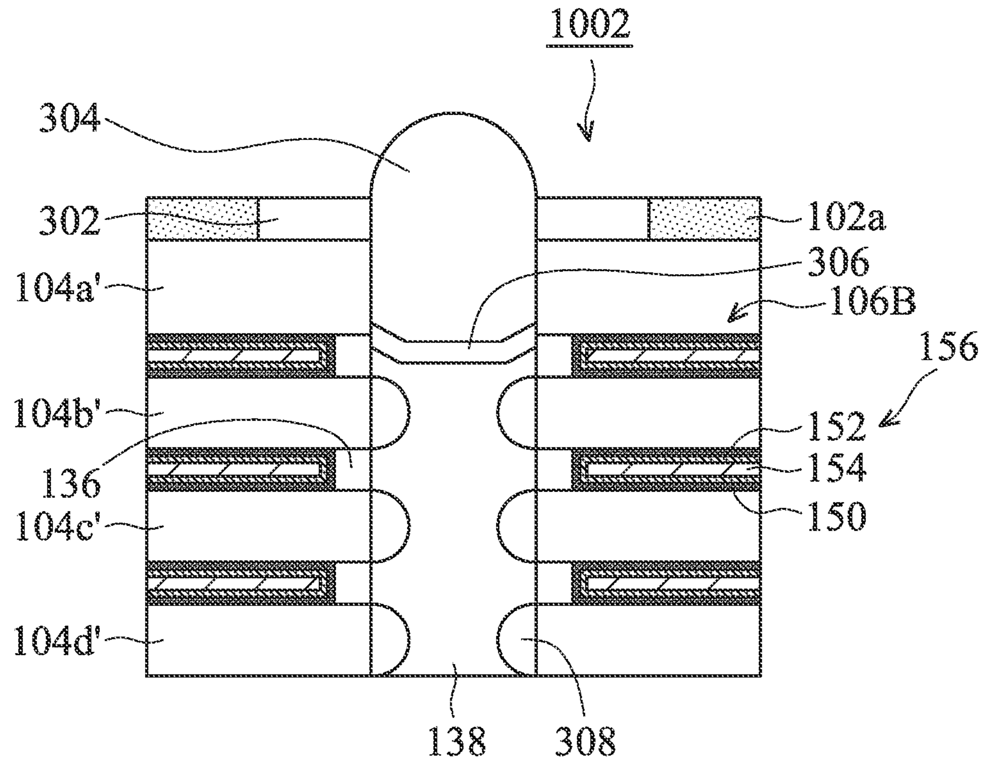

Afterwards, the semiconductor fin 101B is removed, as shown in FIG. 10B in accordance with some embodiments. As a result, a trench 1002 is formed. In some embodiments, the trench 1002 is laterally surrounded by the isolation structure 115.

Figure 10C:
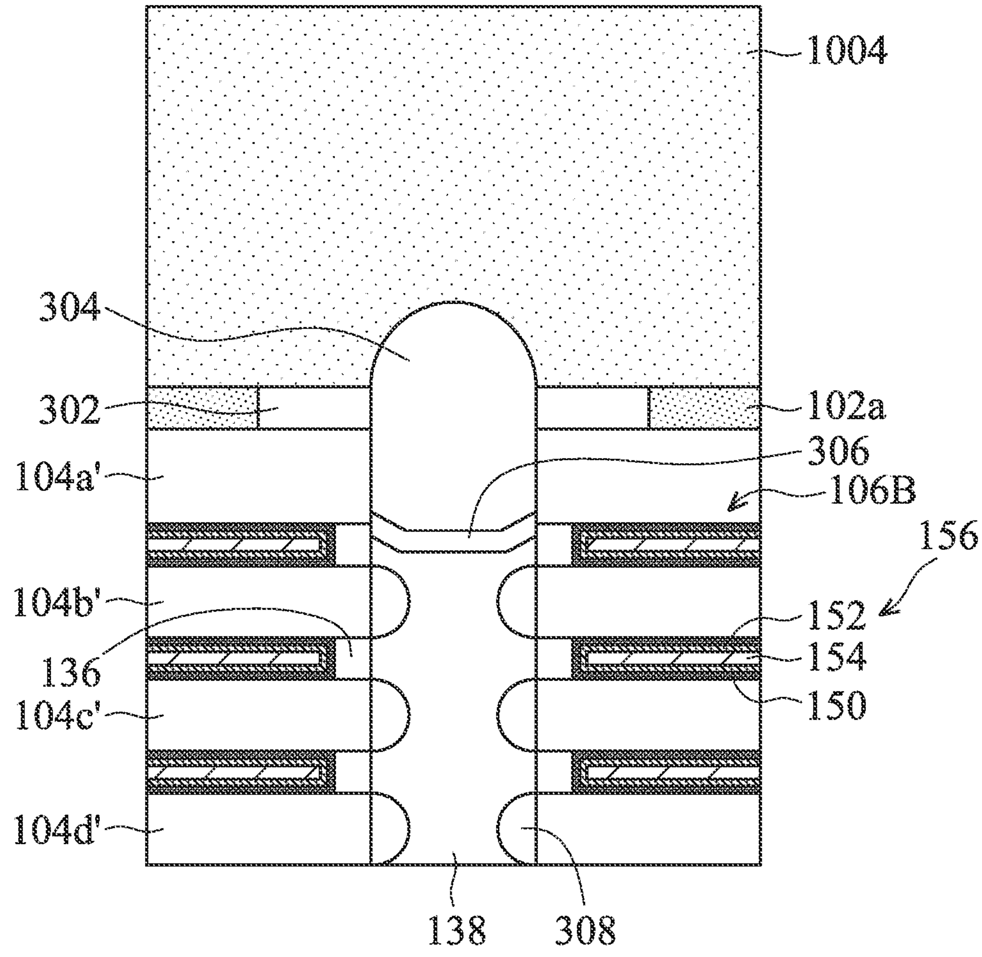

As shown in FIG. 10C, a dielectric structure (or a thermal conductive structure) 1004 is formed to fill the trench 1002, in accordance with some embodiments. In some embodiments, the dielectric structure 1004 is laterally surrounded by the isolation structure 115. In some embodiments, a dielectric material layer (or a thermal conductive material layer) is deposited to overfill the trench 1002. Afterwards, a planarization process may be used to remove the portion of the dielectric material layer (or the thermal conductive material layer) that is outside of the trench 1002. As a result, the remaining portion of the dielectric material layer (or the thermal conductive material layer) forms the dielectric structure (or the thermal conductive structure) 1004.

The dielectric material layer (or the thermal conductive material layer) may be made of or include aluminum oxide, aluminum nitride, titanium oxide, zinc oxide, silicon carbide, silicon oxide, another suitable material, or a combination thereof. The dielectric material layer (or the thermal conductive material layer) may be deposited using a CVD process, an ALD process, another applicable process, or a combination thereof.

Figure 10D:
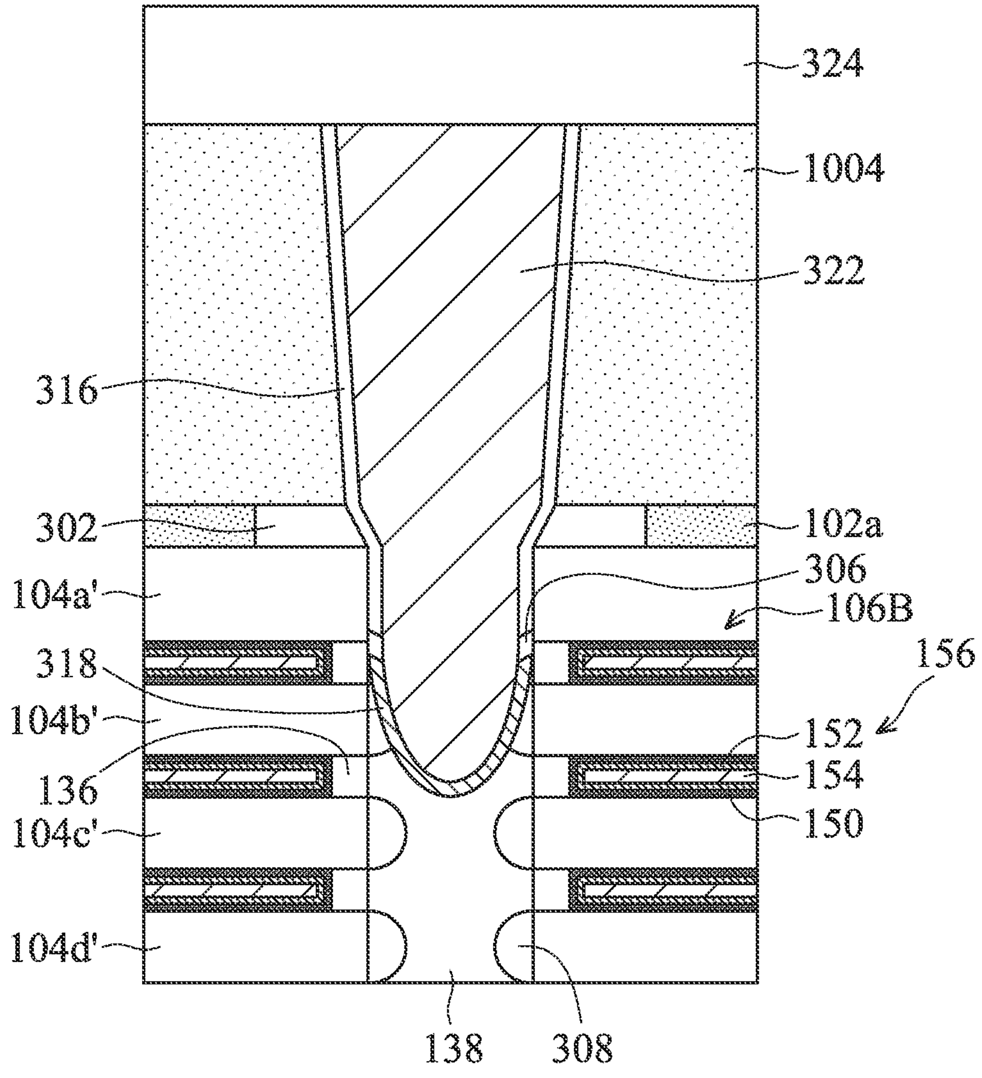

Afterwards, processes that are the same as or similar to those illustrated in FIGS. 3N-3T may be performed. As a result, the structure shown in FIG. 10D is formed, in accordance with some embodiments. The dielectric structure (or the thermal conductive structure) 1004 may help to improve the heat dissipation of the semiconductor device structure. The performance and reliability of the semiconductor device structure may be improved.

Many variations and/or modifications can be made to embodiments of the disclosure. In some embodiments, there are three channel structures (such as the semiconductor nanostructures 104*b*'-104*d*') formed adjacent to the nearby doped epitaxial portion 138. However, embodiments of the disclosure are not limited thereto. Many variations and/or modifications can be made to embodiments of the disclosure. In some embodiments, the total number of the channel structures formed adjacent to the nearby doped epitaxial portion 138 is greater than three. In some other embodiments, the total number of the channel structures formed adjacent to the nearby doped epitaxial portion 138 is smaller than three. The total number of the channel structures formed adjacent to the nearby doped epitaxial portion 138 may be fine-tuned to meet requirements. For example, the total number of the channel structures formed adjacent to the nearby doped epitaxial portion 138 may be between 2 and 10. The channel structures may have many applicable profiles. The channel structures may include nanosheets, nanowires, or other suitable nanostructures.

Embodiments of the disclosure form a semiconductor device structure with a backside conductive contact electrically connected to an epitaxial structure. A bottom inner spacer may function as a protective structure to enable self-alignment between the backside conductive contact and the epitaxial structure. With the protective structure, the backside conductive contact is allowed to be formed wider so that it has better conductivity. Short circuiting between the backside conductive contact and the gate stack is also prevented by the protective structure. The performance and reliability of the semiconductor device structure are thus improved.

In accordance with some embodiments, a method for forming a semiconductor device structure is provided. The method includes forming a fin structure over a substrate. The fin structure has a base layer, and the fin structure has multiple sacrificial layers and multiple semiconductor layers laid out in an alternating manner over the base layer. The method also includes partially removing the fin structure to form an opening exposing side surfaces of the semiconductor layers, the sacrificial layers, and the base layer. The method further includes partially or completely removing the base layer from the side surface of the base layer to form a recess, forming a protective structure in the recess, and forming an epitaxial structure filling the opening. In addition, the method includes partially removing the substrate from a backside surface of the substrate to form a contact opening exposing the protective structure and extending towards the epitaxial structure. The method includes forming a backside conductive contact in the contact opening.

In accordance with some embodiments, a method for forming a semiconductor device structure is provided. The method includes forming a fin structure over a substrate, and the fin structure has multiple sacrificial layers and multiple semiconductor layers laid out in an alternating manner. The method also includes partially removing the fin structure to form an opening exposing side surfaces of the semiconductor layers and the sacrificial layers and partially removing the sacrificial layers from the side surfaces of the sacrificial layers to form recesses and a bottom recess. The method further includes forming inner spacers in the recesses, forming a protective structure in the bottom recess, and forming an epitaxial structure filling the opening. In addition, the method includes partially removing the substrate from a backside surface of the substrate to form a contact opening exposing the protective structure and forming a backside conductive contact in the contact opening. The backside conductive contact is electrically connected to the epitaxial structure.

In accordance with some embodiments, a semiconductor device structure is provided. The semiconductor device structure includes a base semiconductor nanostructure and multiple semiconductor nanostructures over the base semiconductor nanostructure. The semiconductor device structure also includes a gate stack wrapped around each of the semiconductor nanostructures and an epitaxial structure connecting the semiconductor nanostructures. The semiconductor device structure further includes an inner spacer between the epitaxial structure and the gate stack and a backside conductive contact electrically connected to the epitaxial structure. The backside conductive contact extends across opposite surfaces of the base semiconductor nanostructure. In addition, the semiconductor device structure includes a protective structure, and the base semiconductor nanostructure is between the protective structure and the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure over a substrate, wherein the fin structure has a base layer, and the fin structure has a plurality of sacrificial layers and a plurality of semiconductor layers laid out in an alternating manner over the base layer;

partially removing the fin structure to form an opening exposing side surfaces of the semiconductor layers, the sacrificial layers, and the base layer;

at least partially removing the base layer from the side surface of the base layer to form a recess;

forming a protective structure in the recess;

forming an epitaxial structure filling the opening;

partially removing the substrate from a backside surface of the substrate to form a contact opening exposing the protective structure and extending towards the epitaxial structure; and forming a backside conductive contact in the contact opening.

2. The method for forming a semiconductor device structure as claimed in claim 1, further comprising:

partially removing the sacrificial layers from the side surfaces of the sacrificial layers to form second recesses; and forming inner spacers in the second recesses.

3. The method for forming a semiconductor device structure as claimed in claim 2, wherein the recess and the second recesses are formed simultaneously.

4. The method for forming a semiconductor device structure as claimed in claim 2, wherein the sacrificial layers and the base layer contain silicon and germanium, and the base layer has a higher atomic concentration of germanium than the sacrificial layers.

5. The method for forming a semiconductor device structure as claimed in claim 2, further comprising:

forming an insulating layer in the opening to overfill the recess and the second recesses; and partially removing the insulating layer, wherein a first remaining portion of the insulating layer in the recess forms the protective structure, and second remaining portions of the insulating layer in the second recesses form the inner spacers.

6. The method for forming a semiconductor device structure as claimed in claim 2, wherein the recess is deeper than each of the second recesses.

7. The method for forming a semiconductor device structure as claimed in claim 2, wherein the protective structure is wider than each of the inner spacers.

8. The method for forming a semiconductor device structure as claimed in claim 1, further comprising:

forming a dummy gate stack across the fin structure before the opening is formed, wherein the base layer is completely removed after the dummy gate stack is formed and before the protective structure is formed;

removing the dummy gate stack and the sacrificial layers after the epitaxial structure is formed, wherein remaining portions of the semiconductor layers form a plurality of semiconductor nanostructures; and forming a metal gate stack wrapped around the semiconductor nanostructures.

9. The method for forming a semiconductor device structure as claimed in claim 1, further comprising:

forming a dielectric layer along sidewalls of the contact opening before the backside conductive contact is formed.

10. The method for forming a semiconductor device structure as claimed in claim 1, further comprising:

forming an isolation structure laterally surrounding a lower portion of the fin structure before the opening is formed, wherein a topmost surface of the base layer is closer to the substrate than a topmost surface of the isolation structure.

11. A method for forming a semiconductor device structure, comprising:

forming a fin structure over a substrate, wherein the fin structure has a plurality of sacrificial layers and a plurality of semiconductor layers laid out in an alternating manner;

partially removing the fin structure to form an opening exposing side surfaces of the semiconductor layers and the sacrificial layers;

partially removing the sacrificial layers from the side surfaces of the sacrificial layers to form recesses and a bottom recess;

forming inner spacers in the recesses;

forming a protective structure in the bottom recess;

forming an epitaxial structure filling the opening;

partially removing the substrate from a backside surface of the substrate to form a contact opening exposing the protective structure; and forming a backside conductive contact in the contact opening, wherein the backside conductive contact is electrically connected to the epitaxial structure.

12. The method for forming a semiconductor device structure as claimed in claim 11, wherein the formation of the epitaxial structure comprises:

forming an un-doped epitaxial portion over a bottom of the opening, wherein the protective structure is lower than a topmost surface of the un-doped epitaxial portion and higher than a bottommost surface of the un-doped epitaxial portion;

forming a stop layer over the un-doped epitaxial structure portion; and forming a doped epitaxial portion over the stop layer.

13. The method for forming a semiconductor device structure as claimed in claim 12, further comprising:

removing the un-doped epitaxial structure so that the contact opening exposes the bottommost inner spacer and the stop layer; and forming a dielectric layer over sidewalls and a bottom of the contact opening.

14. The method for forming a semiconductor device structure as claimed in claim 13, further comprising:

partially removing the dielectric layer, the stop layer, and the doped epitaxial portion to deepen the contact opening before the backside conductive contact is formed.

15. The method for forming a semiconductor device structure as claimed in claim 14, further comprising:

forming a metal-semiconductor compound element on the doped epitaxial portion exposed by the contact opening after the contact opening is deepened and before the backside conductive contact is formed.

16. A method for forming a semiconductor device structure, comprising:

forming a base semiconductor nanostructure over a substrate;

forming a plurality of semiconductor nanostructures over the base semiconductor nanostructure;

forming a gate stack wrapped around each of the semiconductor nanostructures;

forming an epitaxial structure connecting the semiconductor nanostructures;

forming an inner spacer between the epitaxial structure and the gate stack;

forming a backside conductive contact electrically connected to the epitaxial structure, wherein the backside conductive contact extends across opposite surfaces of the base semiconductor nanostructure; and forming a protective structure, wherein the base semiconductor nanostructure is between the protective structure and the semiconductor nanostructures.

17. The method as claimed in claim 16, wherein the protective structure and the inner spacer are made of a same material.

18. The method as claimed in claim 16, further comprising:

forming a dielectric layer extending along a sidewall of the backside conductive contact.

19. The method as claimed in claim 18, wherein the dielectric layer is in direct contact with the protective structure and the base semiconductor nanostructure.

20. The method as claimed in claim 16, further comprising:

forming a semiconductor layer, wherein the base semiconductor nanostructure is between the semiconductor layer and the semiconductor nanostructures, and the semiconductor layer is adjacent to the protective structure.

* * * * *